United States Patent
Ohshima et al.

(10) Patent No.: US 9,818,750 B2
(45) Date of Patent: Nov. 14, 2017

(54) SEMICONDUCTOR DEVICE

(71) Applicant: Semiconductor Energy Laboratory Co., Ltd., Atsugi-shi, Kanagawa-ken (JP)

(72) Inventors: Kazuaki Ohshima, Kanagawa (JP); Kiyoshi Kato, Kanagawa (JP); Tomoaki Atsumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/383,274

(22) Filed: Dec. 19, 2016

(65) Prior Publication Data

US 2017/0186749 A1    Jun. 29, 2017

(30) Foreign Application Priority Data

Dec. 28, 2015 (JP) .................. 2015-256670
Dec. 29, 2015 (JP) .................. 2015-257567

(51) Int. Cl.
*G11C 5/06* (2006.01)
*H01L 27/105* (2006.01)
(Continued)

(52) U.S. Cl.
CPC ........ *H01L 27/1052* (2013.01); *G06F 1/3275* (2013.01); *G11C 5/06* (2013.01);
(Continued)

(58) Field of Classification Search
CPC ............ H01L 27/1052; H01L 23/5226; H01L 23/528; H01L 27/10805; H01L 27/1108;
(Continued)

(56) References Cited

U.S. PATENT DOCUMENTS 8,737,109 B2    5/2014 Yamazaki et al.
8,947,158 B2    2/2015 Watanabe
(Continued)

FOREIGN PATENT DOCUMENTS

JP    2012-069932 A    4/2012
JP    2012-146965 A    8/2012
(Continued)

*Primary Examiner* — Fernando Hidalgo
(74) *Attorney, Agent, or Firm* — Fish & Richardson P.C.

(57) ABSTRACT

Provided is a semiconductor device capable of holding data for a long period. The semiconductor device includes first to third transistors, a capacitor, and a circuit. The third transistor includes a first gate and a second gate. A gate of the first transistor is electrically connected to a first terminal of the capacitor. A first terminal of the first transistor is electrically connected to the second gate. A second terminal of the first transistor is electrically connected to the circuit. A gate of second transistor is electrically connected to a first terminal of the second transistor. A first terminal of the second transistor is electrically connected to the second gate. A second terminal of the second transistor is electrically connected to a first terminal of the capacitor. The circuit is configured to generate a negative potential. A channel formation region of the first transistor preferably includes an oxide semiconductor.

20 Claims, 39 Drawing Sheets

(51) Int. Cl.
  *H01L 27/12* (2006.01)
  *H01L 27/11* (2006.01)
  *H01L 27/108* (2006.01)
  *H01L 23/522* (2006.01)
  *H01L 23/528* (2006.01)
  *G11C 5/14* (2006.01)
  *G06F 1/32* (2006.01)
  *H01L 29/786* (2006.01)
  *H01L 29/78* (2006.01)

(52) U.S. Cl.
  CPC .............. *G11C 5/14* (2013.01); *H01L 23/528* (2013.01); *H01L 23/5226* (2013.01); *H01L 27/10805* (2013.01); *H01L 27/1108* (2013.01); *H01L 27/1207* (2013.01); *H01L 27/1211* (2013.01); *H01L 27/1225* (2013.01); *H01L 29/7851* (2013.01); *H01L 29/7869* (2013.01); *H01L 29/78648* (2013.01)

(58) Field of Classification Search
  CPC ............. H01L 27/1207; H01L 27/1211; H01L 27/1225; H01L 27/7851; H01L 29/7851; H01L 29/78648; H01L 29/7869; G06F 1/3275; G11C 5/06; G11C 5/14
  USPC .................... 365/72, 63, 129, 226, 228, 229
  See application file for complete search history.

(56) References Cited

U.S. PATENT DOCUMENTS

| | | | |
|---|---|---|---|
| 9,024,317 | B2 | 5/2015 | Endo et al. |
| 9,076,505 | B2 | 7/2015 | Atsumi et al. |
| 9,312,280 | B2 | 4/2016 | Kobayashi |
| 9,337,826 | B2 | 5/2016 | Koyama et al. |
| 9,385,592 | B2 | 7/2016 | Watanabe et al. |
| 9,449,706 | B2 | 9/2016 | Yamazaki et al. |
| 9,501,119 | B2 | 11/2016 | Watanabe |
| 9,509,213 | B1 * | 11/2016 | Yuan ...................... H02M 3/07 |
| 2015/0171117 | A1 | 6/2015 | Endo et al. |
| 2015/0381036 | A1 | 12/2015 | Watanabe et al. |
| 2016/0225773 | A1 | 8/2016 | Kobayashi |
| 2016/0248419 | A1 | 8/2016 | Koyama et al. |
| 2016/0336068 | A1 | 11/2016 | Yamazaki et al. |
| 2017/0005659 | A1 | 1/2017 | Tamura |
| 2017/0060217 | A1 | 3/2017 | Watanabe |
| 2017/0062433 | A1 | 3/2017 | Miyairi et al. |

FOREIGN PATENT DOCUMENTS

| | | |
|---|---|---|
| JP | 2013-168631 A | 8/2013 |
| JP | 2015-164386 A | 9/2015 |

\* cited by examiner

12a

12b

12c

12d

12e

100

101

750 PLD

SEMICONDUCTOR DEVICE

BACKGROUND OF THE INVENTION

1. Field of the Invention

One embodiment of the present invention relates to a semiconductor device.

One embodiment of the present invention relates to an object, a method, and a manufacturing method. In addition, one embodiment of the present invention relates to a process, a machine, manufacture, and a composition of matter. One embodiment of the present invention relates to a driving method of a semiconductor device, or a manufacturing method of the semiconductor device.

In this specification and the like, a semiconductor device generally means a device that can function by utilizing semiconductor characteristics. In some cases, a memory device, a display device, an electro-optical device, a semiconductor circuit, or an electronic device includes a semiconductor device.

2. Description of the Related Art

A transistor whose channel formation region includes an oxide semiconductor (OS) (hereinafter such a transistor is referred to as an OS transistor) is known. A variety of semiconductor devices including OS transistors have been proposed.

Patent Document 1 discloses an example in which an OS transistor is used in a dynamic random access memory (DRAM). The OS transistor has an extremely low leakage current in an off state (off-state current); thus, a DRAM having a low refresh frequency and a low power consumption can be formed.

Patent Document 2 discloses a nonvolatile memory including an OS transistor. Unlike the flash memory, the nonvolatile memory has unlimited cycling capability, can easily operate at high speed, and consumes less power.

In such a memory including an OS transistor, the off-state current can be decreased by an increase in the threshold voltage of the OS transistor, so that data holding characteristics of the memory can be improved. Patent Document 2 discloses an example in which an OS transistor has a second gate (also referred to as a back gate) to control the threshold voltage of the OS transistor so that the off-state current is lowered.

In order to hold data of the memory for a long period, a negative potential needs to be continuously applied to the second gate of the OS transistor. Patent Documents 2 and 3 each disclose a structure example of a circuit for driving a second gate of an OS transistor.

Patent Document 4 discloses a method in which a negative potential is generated by a charge pump so as to be applied to a second gate of an OS transistor.

REFERENCE

Patent Document

[Patent Document 1] Japanese Published Patent Application No. 2013-168631
[Patent Document 2] Japanese Published Patent Application No. 2012-069932
[Patent Document 3] Japanese Published Patent Application No. 2012-146965
[Patent Document 4] Japanese Published Patent Application No. 2015-164386

SUMMARY OF THE INVENTION

Patent Document 2 discloses circuits for holding a negative potential applied to the second gate of the OS transistor, shown in FIGS. 38A and 38B.

In each of the circuits in FIGS. 38A and 38B, a second gate (a node N0) of a transistor OS1 is connected to a transistor OS2 functioning as a diode.

For example, although a negative potential is applied to the node N0 through the transistor OS2 when −3 V is applied to a terminal IN0 (FIG. 38A), −3 V+$V_{th}$ is actually applied to the node N0 due to the threshold voltage ($V_{th}$) of the transistor OS2. Thus, when a negative potential is applied to the second gate of the transistor OS1, a voltage considering $V_{th}$ of the transistor needs to be applied to the terminal IN0.

In the case where a negative potential written into the node N0 is held with the terminal IN0 set to a ground potential (GND) (FIG. 38B), a potential difference ($V_G$) between a gate and a source of the transistor OS2 is 0 V. If a drain current at $V_G$=0 V (hereinafter referred to as a cutoff current) is sufficiently low, the negative potential of the node N0 can be held by the transistor OS2. Meanwhile, if a cutoff current of the transistor OS2 is high, the potential of the node N0 cannot be held for a long time by the transistor OS2.

It is an object of one embodiment of the present invention to provide a semiconductor device capable of holding data for a long time. Another object of one embodiment of the present invention is to provide a semiconductor device capable of reducing power consumption. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including a first transistor, a second transistor, a third transistor, a capacitor, and a circuit. The third transistor includes a first gate and a second gate. A gate of the first transistor is electrically connected to a first terminal of the capacitor. A first terminal of the first transistor is electrically connected to the second gate. A second terminal of the first transistor is electrically connected to the circuit. A gate of the second transistor is electrically connected to a first terminal of the second transistor. The first terminal of the second transistor is electrically connected to the second gate. A second terminal of the second transistor is electrically connected to the first terminal of the capacitor. The circuit is configured to generate a negative potential. A channel formation region of the first transistor preferably includes an oxide semiconductor.

One embodiment of the present invention is a semiconductor device including a first transistor, a second transistor, a third transistor, a capacitor, and a circuit. The first transistor includes a first gate and a second gate. The second transistor includes a third gate and a fourth gate. The third transistor includes a fifth gate and a sixth gate. A first gate is electrically connected to a first terminal of the capacitor. The second gate is electrically connected to the first gate. A first terminal of the first transistor is electrically connected to the sixth gate. A second terminal of the first transistor is electrically connected to the circuit. The third gate is electrically connected to a first terminal of the second transistor. The fourth gate is electrically connected to the first terminal of the second transistor. The first terminal of the second transistor is electrically connected to the sixth gate. A second terminal of the second transistor is electrically connected to the first terminal of the capacitor. The circuit is configured to generate a negative potential. A channel formation region of the first transistor includes an oxide semiconductor.

One embodiment of the present invention is a semiconductor device including a first transistor, a second transistor, a third transistor, a first capacitor, a second capacitor, a resistor, and a circuit. The third transistor includes a first gate and a second gate. A gate of the first transistor is electrically connected to a first terminal of the first capacitor. A first terminal of the first transistor is electrically connected to the second gate. A second terminal of the first transistor is electrically connected to the circuit. A first terminal of the second capacitor is electrically connected to a gate of the second transistor. The gate of the second transistor is electrically connected to a first terminal of the second transistor through the resistor. The first terminal of the second transistor is electrically connected to the second gate. A second terminal of the second transistor is electrically connected to the first terminal of the first capacitor. The circuit is configured to generate a negative potential. A channel formation region of the first transistor includes an oxide semiconductor.

One embodiment of the present invention is a semiconductor device including a first transistor, a second transistor, a third transistor, a first capacitor, a second capacitor, a resistor, and a circuit. The first transistor includes a first gate and a second gate. The second transistor includes a third gate and a fourth gate. The third transistor includes a fifth gate and a sixth gate. The first gate is electrically connected to a first terminal of the first capacitor. The second gate is electrically connected to the first gate. A first terminal of the first transistor is electrically connected to the sixth gate. A second terminal of the first transistor is electrically connected to the circuit. A first terminal of the second capacitor is electrically connected to the third gate. The third gate is electrically connected to a first terminal of the second transistor through the resistor. The fourth gate is electrically connected to the first terminal of the second transistor. The first terminal of the second transistor is electrically connected to the sixth gate. The second terminal of the second transistor is electrically connected to the first terminal of the first capacitor. The circuit is configured to generate a negative potential. A channel formation region of the first transistor includes an oxide semiconductor.

In the above embodiment, a channel length of the first transistor is preferably longer than a channel length of the third transistor.

One embodiment of the present invention is a memory device including the semiconductor device described in any of the above embodiments.

One embodiment of the present invention is an IC chip including a CPU, the memory device described in the above embodiment, and a power supply circuit. The power supply circuit is configured to supply power to the CPU and the memory device.

One embodiment of the present invention is an electronic device including the semiconductor device described in any of the above embodiments and a display device, a microphone, a speaker, an operation key, or a housing.

According to one embodiment of the present invention, a semiconductor device capable of holding data for a long time can be provided. According to one embodiment of the present invention, a semiconductor device capable of reducing power consumption can be provided. According to one embodiment of the present invention, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

DETAILED DESCRIPTION OF THE INVENTION

Figure 1:
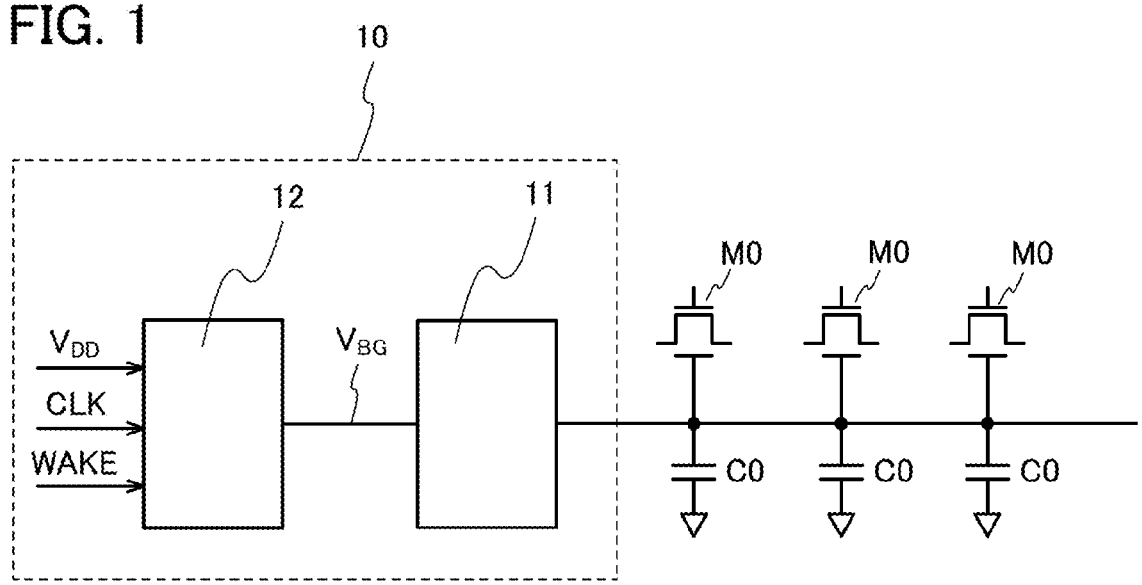
FIG. 1 is a circuit diagram illustrating a structure example of a semiconductor device.

Embodiments according to the present invention will be described in detail with reference to the accompanying drawings. It will be readily appreciated by those skilled in the art that modes and details of the present invention can be modified in various ways without departing from the spirit and scope of the present invention. Therefore, the invention should not be limited to the descriptions of the embodiments and examples below.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Unless otherwise specified, the on-state current in this specification refers to a drain current of a transistor in the on state. Unless otherwise specified, the on state of an n-channel transistor means that the voltage between its gate and source ($V_G$) is higher than or equal to the threshold voltage ($V_{th}$), and the on state of a p-channel transistor means that $V_G$ is lower than or equal to $V_{th}$. For example, the on-state current of an n-channel transistor refers to a drain current that flows when $V_G$ is higher than or equal to $V_{th}$. The on-state current of a transistor depends on a voltage $V_D$ between a drain and a source.

Unless otherwise specified, the off-state current in this specification refers to a drain current of a transistor in the off state. Unless otherwise specified, the off state of an n-channel transistor means that $V_G$ is lower than $V_{th}$, and the off state of a p-channel transistor means that $V_G$ is higher than $V_{th}$. For example, the off-state current of an n-channel transistor refers to a drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_D$ used in a semiconductor device or the like including the transistor.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification, a high power supply potential is referred to as H level (or $V_{DD}$), and a low power supply potential is referred to as L level (or GND), in some cases.

Furthermore, in the present specification, any of the embodiments described below can be combined as appropriate. In addition, in the case where a plurality of structure examples are described in one embodiment, some of the structure examples can be combined as appropriate.

Embodiment 1

In this embodiment, the circuit structure of a semiconductor device of one embodiment of the present invention is described.

<<Circuit 10>>

A circuit 10 illustrated in FIG. 1 is a semiconductor device for driving a second gate of a transistor M0. The circuit 10 includes a voltage generation circuit 12 and a voltage holding circuit 11.

The transistor M0 represents a transistor used for various circuits such as a memory circuit, an arithmetic circuit, and a pixel circuit. Although three transistors M0 are shown in FIG. 1, the number of the transistors M0 is not limited to this, and the circuit 10 may be connected to more transistors M0. Note that in the following description, the transistors M0 are assumed as n-channel transistors.

The transistors M0 each include a first gate and a second gate. The second gates of the transistors M0 have a function of controlling $V_{th}$ of the transistors M0 which are connected to one another. A capacitor C0 represents wiring capacitance connected to the second gate. In the transistor M0, the first gate and the second gate preferably overlap with each other with a semiconductor layer therebetween.

The circuit 10 has a function of writing a potential to the second gate of the transistor M0 and holding the potential.

For example, in the case where a negative potential is written into the second gate of the transistor M0 by the circuit 10, $V_{th}$ of the transistor M0 can be kept high while the negative potential of the second gate is held. By keeping $V_{th}$ of the transistor M0 high, normally-on of the transistor can be prevented, thereby reducing power consumption of the whole semiconductor device including the transistor M0. For example, in the case where the transistor M0 is used as a selection transistor of a memory cell, electric charge in a capacitor functioning as a storage can be held for a long time.

The voltage holding circuit 11 has a function of applying a potential $V_{BG}$ generated in the voltage generation circuit 12 to the second gate of the transistor M0 and holding the potential.

The voltage generation circuit 12 has a function of generating $V_{BG}$ from GND or $V_{DD}$. To the voltage generation circuit 12, $V_{DD}$, a signal CLK, and a signal WAKE are input. The signal CLK is a clock signal and is used to operate the voltage generation circuit 12. The signal WAKE has a function of controlling input of the signal CLK to the voltage generation circuit 12. For example, when an H-level signal is applied as the signal WAKE, the signal CLK is input to the voltage generation circuit 12, and $V_{BG}$ is generated in the voltage generation circuit 12.

<Voltage Holding Circuit 11>

Next, a specific structure example of the voltage holding circuit 11 is described with reference to FIGS. 2A and 2B, FIGS. 3A to 3C, FIGS. 4A and 4B, and FIG. 5. As examples of the voltage holding circuit 11, a voltage holding circuit 11a (FIGS. 2A and 2B and FIGS. 3A to 3C) and a voltage holding circuit 11 (FIGS. 4A and 4B and FIG. 5) are described.

[Voltage Holding Circuit 11a]

Figure 2A:
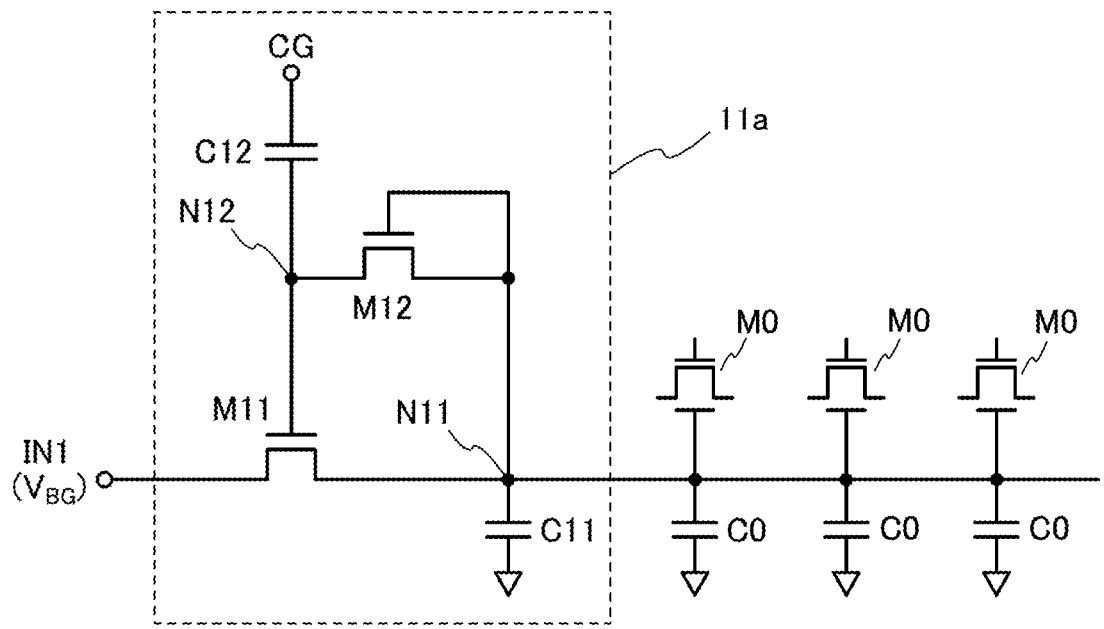
FIGS. 2A and 2B are circuit diagrams each illustrating a structure example of a voltage holding circuit.

The voltage holding circuit 11a shown in FIG. 2A includes a transistor M11, a transistor M12, a capacitor C11, and a capacitor C12.

A gate of the transistor M11 is electrically connected to a first terminal of the capacitor C12. A first terminal of the transistor M11 is electrically connected to a first terminal of the capacitor C11. A second terminal of the transistor M11 is electrically connected to a terminal IN1. The terminal IN1 is electrically connected to the voltage generation circuit 12 and is applied with the potential $V_{BG}$.

A gate of the transistor M12 is electrically connected to a first terminal of the transistor M12. The first terminal of the transistor M12 is electrically connected to the first terminal of the capacitor C11. A second terminal of the transistor M12 is electrically connected to the first terminal of the capacitor C12.

The first terminal of the capacitor C11 is electrically connected to the second gate of the transistor M0. A second terminal of the capacitor C11 is electrically connected to GND.

A second terminal of the capacitor C12 is electrically connected to a terminal CG.

Note that a node of the first terminal of the transistor M11, the first terminal of the transistor M12, and the first terminal of the capacitor C11 is referred to as a node N11. Furthermore, a node of the gate of the transistor M11, the second terminal of the transistor M12, and the first terminal of the capacitor C12 is referred to as a node N12.

Next, operation of the voltage holding circuit 11a is described with reference to FIGS. 3A to 3C. Note that in the following description, the transistors M11 and M12 are assumed as n-channel transistors. Here, 0 V is a ground potential and represents GND.

Figure 3A:
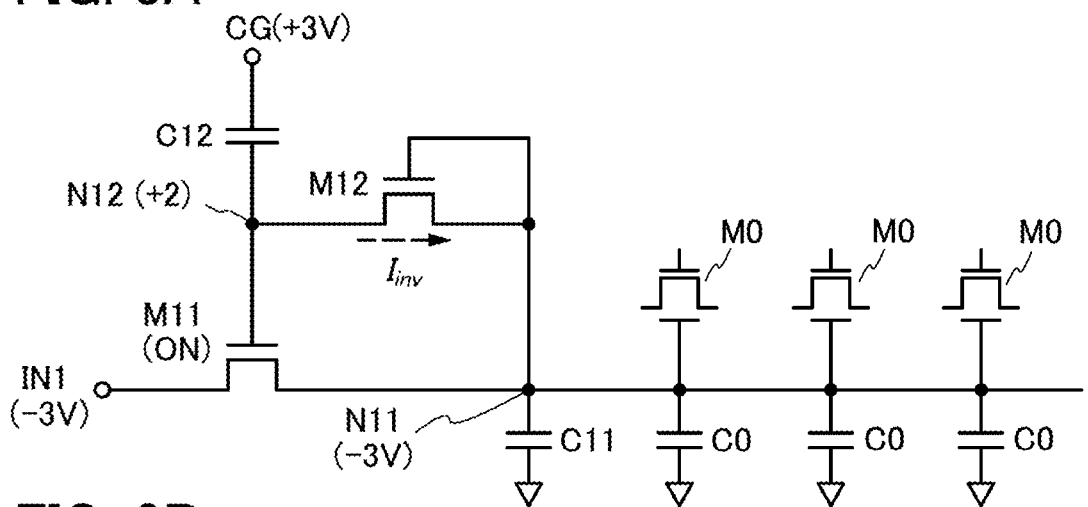
FIGS. 3A to 3C are circuit diagrams each illustrating an operation example of a voltage holding circuit.
Figure 3B:
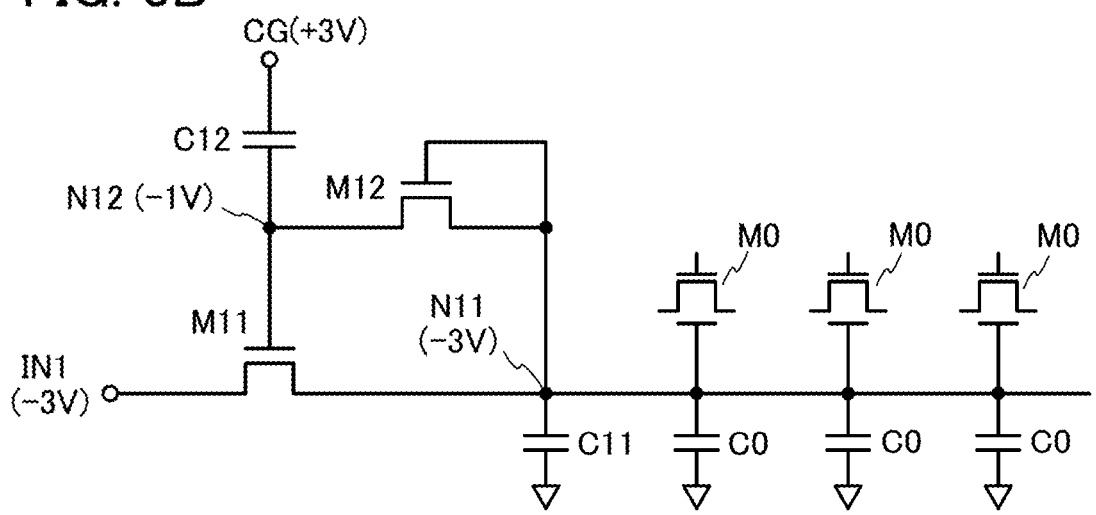
Figure 3C:
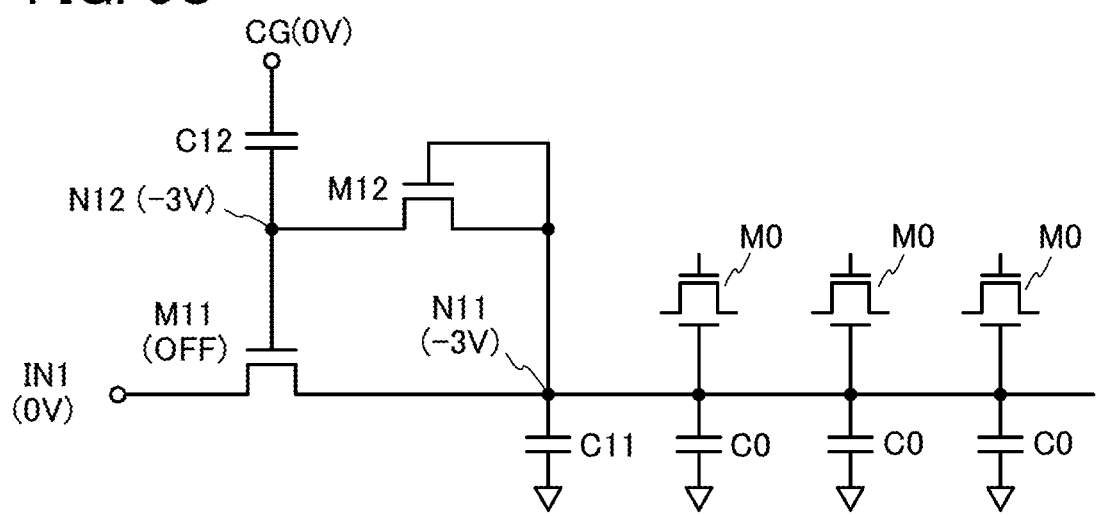

First, a negative potential (e.g., −3 V) is applied to the terminal IN1; then, a pulse signal from 0 V to a high potential (e.g., +3 V) is applied to the terminal CG (see FIG. 3A). The potential of the node N12 is increased (e.g., +2 V) due to capacitive coupling by the capacitor C12. At this time, the transistor M11 is turned on, and the potential of the node N11 is lowered to a potential around the terminal IN1. In the case of using the transistor M12 as a diode, a strong reverse voltage (e.g., −5 V) is applied to the transistor M12; thus, a leakage current $I_{inv}$ flows.

The potential of the node N12 is lowered (e.g., −1 V, see FIG. 3B) due to the leakage current $I_{inv}$.

Next, 0V is applied to the terminal CG. The potential of the node N12 is further decreased (e.g., −3 V, see FIG. 3C) due to capacitive coupling by the capacitor C12.

A potential difference between the node N11 and the node N12 is almost eliminated, thereby turning off the transistor M12. Then, 0 V is supplied to the terminal IN1, and the potential of the node N11 is held.

Figure 38A:
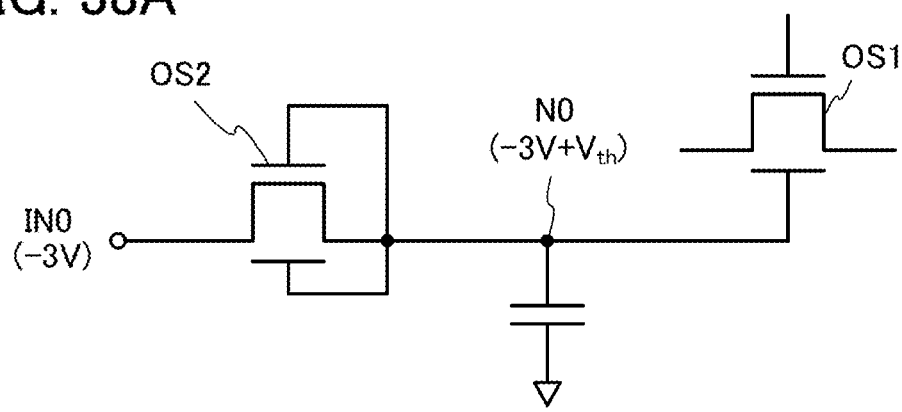
FIGS. 38A and 38B are circuit diagrams each illustrating a structure example of a semiconductor device.
Figure 38B:
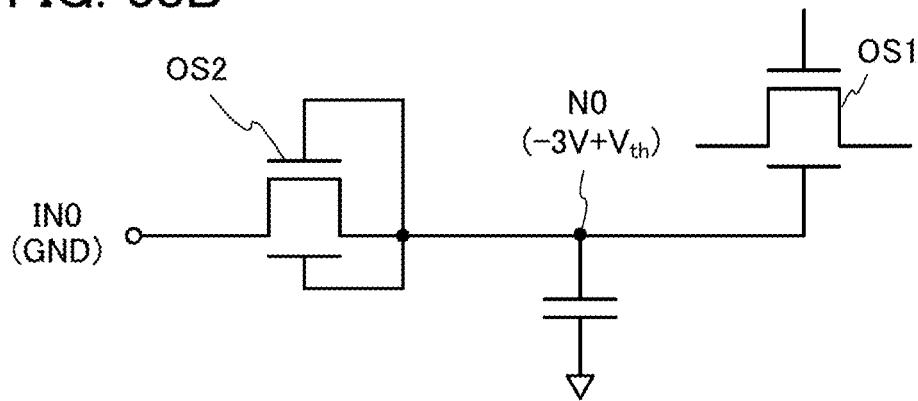

As a result, the negative potential applied to the terminal IN1 in FIG. 3A is supplied to the node N11 and is held. The voltage holding circuit 11a has such a structure; thus, an influence of $V_{th}$ of the transistor included in the voltage holding circuit, which is illustrated in FIGS. 38A and 38B, can be prevented. Thus, by the voltage holding circuit 11a, a negative potential can be effectively applied to the second gate of the transistor M0 and can be held.

Figure 2B:
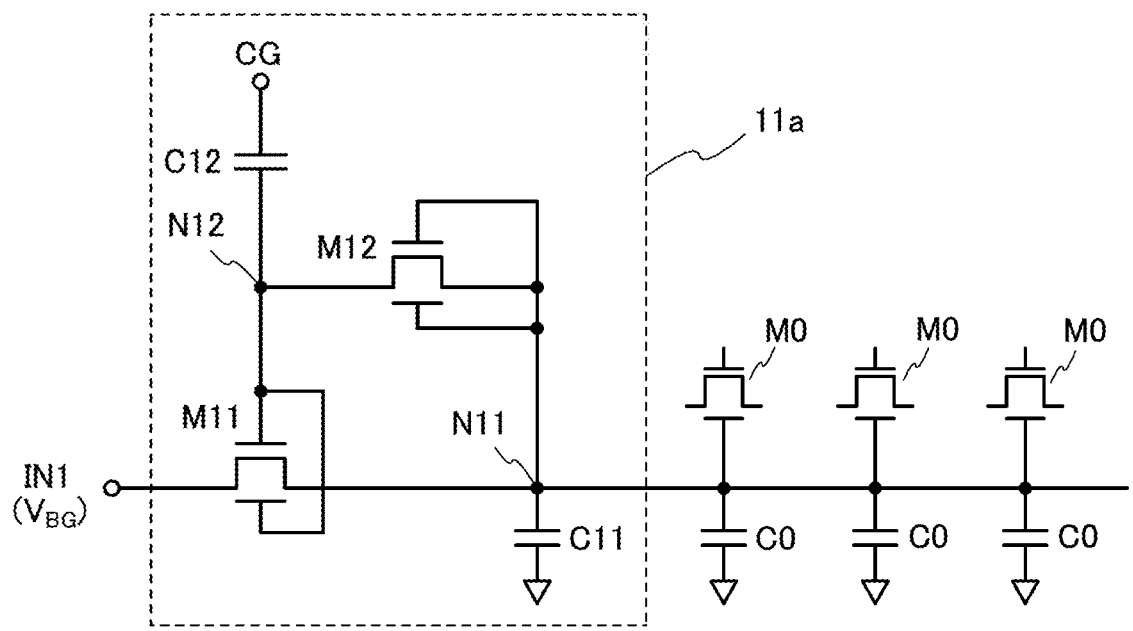

The transistor M11 may include a first gate and a second gate. Similarly, the transistor M12 may include a first gate and a second gate. FIG. 2B shows a circuit diagram in that case. As shown in FIG. 2B, it is preferable that the second gate of the transistor M11 be electrically connected to the first gate of the transistor M11. Furthermore, it is preferable that the second gate of the transistor M12 be electrically connected to the first terminal of the transistor M12.

In the transistor M11, the first gate and the second gate preferably overlap with each other with a semiconductor layer therebetween. In a similar manner, in the transistor M12, the first gate and the second gate preferably overlap with each other with a semiconductor layer therebetween.

The transistors M11 and M12 each preferably include the second gate, because $V_{th}$ of the transistors can be stabilized.

The channel length of the transistor M11 is preferably longer than that of the transistor M0. For example, in the case where the channel length of the transistor M0 is less than 1 μm, the channel length of the transistor M11 is 1 μm or more, preferably 3 μm or more, further preferably 5 μm or more, furthermore preferably 10 μm or more.

The transistor M11 has a longer channel length, whereby the transistor M11 is not affected by a short-channel effect, and the cutoff current can be low. Furthermore, the withstand voltage between a source and a drain of the transistor M11 can be increased. The high withstand voltage between the source and the drain of the transistor M11 facilitates a connection between the transistor M0 and the voltage generation circuit 12 generating a high voltage, which is preferable.

For example, in the case where the transistor M0 is used for a circuit that needs to have high integration such as a memory cell, the channel length of the transistor M0 is preferably short. Meanwhile, the transistor M11 can be formed outside the memory cell; thus, a long channel length does not become a problem. When the channel length of the transistor is long, the on-state current of the transistor is decreased; however, the transistor M11 is generally used in the off state and therefore high on-state current is not required.

An OS transistor or a transistor including a wide-bandgap semiconductor in the channel formation region is preferably used as the transistor M11. The cutoff current is low and the withstand voltage between a source and a drain is high in the OS transistor and the transistor including a wide-bandgap semiconductor. Note that in this specification, the term "wide-bandgap semiconductor" is a semiconductor whose bandgap is 2.2 eV or greater. Examples of the wide-bandgap semiconductor include silicon carbide, gallium nitride, and diamond.

The cutoff current of the OS transistor or the transistor including a wide-bandgap semiconductor remains low even in a high-temperature environment. Thus, the use of such a transistor as the transistor M11 enables operation of the circuit 10 in a high-temperature environment.

The transistor M12 may be formed of a semiconductor material that is different from a semiconductor material used for the transistor M11; alternatively, the transistor M12 and the transistor M11 may be formed using the same semiconductor material. The transistor M12 and the transistor M11 are preferably formed using the same material because the manufacturing process can be simplified.

[Voltage Holding Circuit 11b]

Figure 4A:
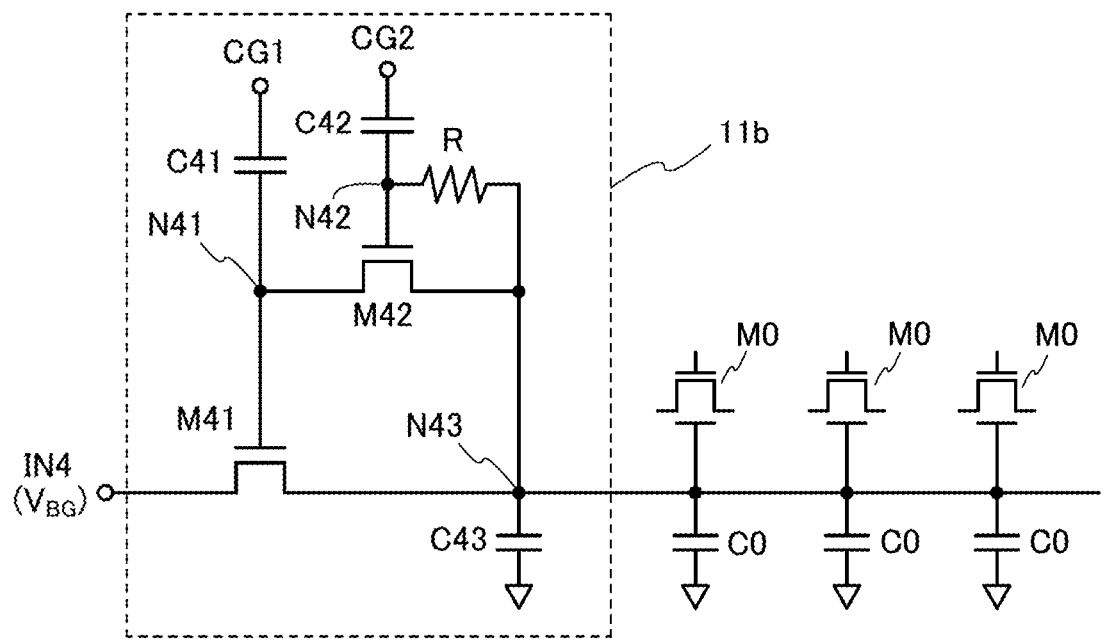
FIGS. 4A and 4B are circuit diagrams each illustrating a structure example of a voltage holding circuit.

The voltage holding circuit 11b in FIG. 4A includes a transistor M41, a transistor M42, a resistor R, a capacitor C41, a capacitor C42, and a capacitor C43.

A gate of the transistor M41 is electrically connected to a first terminal of the capacitor C41. A first terminal of the transistor M41 is electrically connected to a first terminal of the capacitor C43. A second terminal of the transistor M41 is electrically connected to a terminal IN4. The terminal IN4 is electrically connected to the voltage generation circuit 12 and is applied with the potential $V_{BG}$.

A gate of the transistor M42 is electrically connected to a first terminal of the transistor M42 though the resistor R. A first terminal of the transistor M42 is electrically connected to the first terminal of the capacitor C43. A second terminal of the transistor M42 is electrically connected to the first terminal of the capacitor C41.

The first terminal of the capacitor C43 is electrically connected to the second gate of the transistor M0. A second terminal of the capacitor C43 is connected to GND.

A second terminal of the capacitor C41 is electrically connected to a terminal CG1. A second terminal of the capacitor C42 is electrically connected to a terminal CG2.

Note that a node of the gate of the transistor M41, the second terminal of the transistor M42, and the first terminal of the capacitor C41 is referred to as a node N41. Furthermore, a node of the gate of the transistor M42 and a first terminal of the capacitor C42 is referred to as a node N42. Moreover, a node of the first terminal of the transistor M41, the first terminal of the transistor M42, and the first terminal of the capacitor C43 is referred to as a node N43.

Next, operation of the voltage holding circuit 11b is described with reference to FIG. 5. Note that in the following description, the transistors M41 and M42 are assumed as n-channel transistors.

Figure 5:
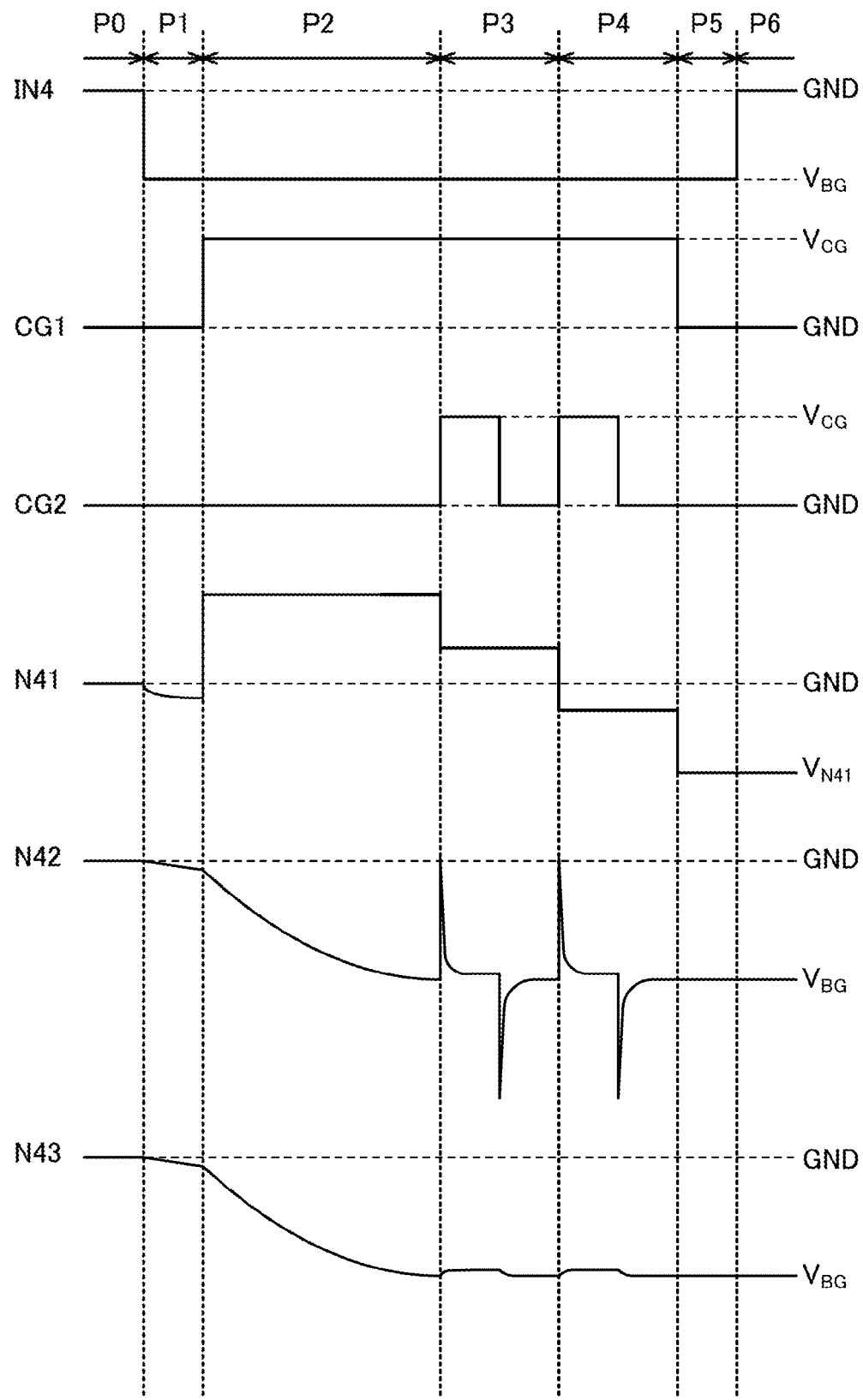
FIG. 5 is a timing chart illustrating an operation example of a voltage holding circuit.

FIG. 5 is a timing chart that illustrates operation of the voltage holding circuit 11b. FIG. 5 shows, from the top, the potentials of the terminal IN4, the terminal CG1, the terminal CG2, the node N41, the node N42, and the node N43. The timing chart is divided into periods P0 to P6.

In the period P0, GND is applied to each of the terminals and the nodes.

In the period P1, the potential $V_{BG}$ is applied to the terminal IN4. The potential $V_{BG}$ is a negative potential. At this time, a drain current slightly flows through the transistor M41, and the potentials of the node N43 and the node N42 are gradually lowered. In addition, the potential of the node N41 is also slightly lowered.

Next, in the period P2, a potential $V_{CG}$ is applied to the terminal CG1. The potential $V_{CG}$ is preferably at H level. At that time, the potential of the node N41 is increased due to capacitive coupling by the capacitor C41, and the transistor M41 is turned on. As a result, the potentials of the node N43 and the node N42 are lowered to the potential $V_{BG}$. Because the transistor M42 is kept in an off state, the potential of the node N41 is kept at a high potential.

Next, in the period P3, a pulse signal of the potential $V_{CG}$ is given to the terminal CG2. The input pulse signal is transmitted to the node N42 as a differential signal. When the differential signal in a positive direction is applied to the node N42, the transistor M42 is turned on and the potential of the node N41 is lowered.

Next, in the period P4, the pulse signal given in the period P3 is again given to the terminal CG2, thereby further lowering the potential of the node N41.

Next, in the period P5, the potential of the terminal CG1 is lowered to GND. At that time, the potential of the node N41 is lowered to a potential $V_{N41}$. The potential $V_{N4}$ is preferably lower than the $V_{BG}$. The transistor M41 is turned off by the reduction in the potential of the node N41.

Next, in the period P6, GND is applied to the terminal IN4. Because the transistor M41 is kept in an off state, the negative potential ($V_{BG}$) applied to the node N43 is held.

An influence of $V_{th}$ of transistor, as illustrated in FIGS. 38A and 38B, can be prevented from occurring in the voltage holding circuit 11b. Thus, by the voltage holding circuit 11b, the negative potential can be effectively applied to the second gate of the transistor M0 and can be held.

In the voltage holding circuit 11b, the pulse signal is applied to the terminal CG2, whereby the potential of the node N41 can be lowered. The number of pulse signals applied to the terminal CG2 is two (in the period P3 and the period P4) in FIG. 5; however, the number of pulse signals is not limited to this, and more pulse signals may be applied to the terminal CG2. An increase in the number of pulse signals can further reduce the potential of the node N41.

In the voltage holding circuit 11b, the potential of the node N41 can be eventually lower than that of the node N43, and the $V_G$ of the transistor M41 can be less than 0V. As a result, the cutoff current of the transistor M41 can be reduced, and the voltage holding circuit 11b can hold the negative potential applied to the second gate of the transistor M0 for a long time.

In order to accurately perform the above operation, the capacitance value of the capacitor C43 is preferably larger than that of the capacitor C42 in the voltage holding circuit 11b. The capacitance value of the capacitor C43 is preferably 5 times or more and 20 times or less of the capacitance value of the capacitor C42, further preferably 5 times or more and 15 times or less of the capacitance value of the capacitor C42.

In order to accurately perform the above operation, the capacitance value of the capacitor C41 is preferably larger than the gate capacitance value of the transistor M41 in the voltage holding circuit 11b. The capacitance value of the capacitor C41 is preferably 5 times or more and 20 times or less of the gate capacitance value of the transistor M41, further preferably 5 times or more and 15 times or less of the gate capacitance value of the transistor M41.

In order to accurately perform the above operation, the product (time constant $\tau$) of the capacitance value of the capacitor C42 and the resistance value of the resistor R is preferably $10^{-6}$ seconds or more in the voltage holding circuit 11b.

Figure 4B:
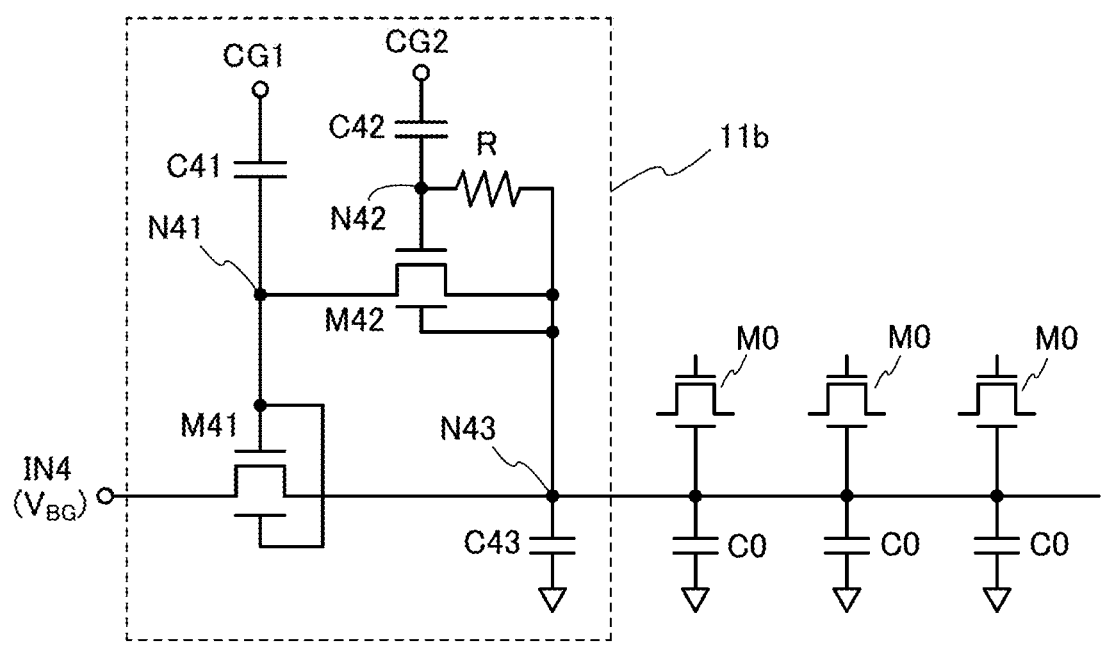

The transistor M41 may include a first gate and a second gate. Similarly, the transistor M42 may include a first gate and a second gate. FIG. 4B is a circuit diagram in that case. As shown in FIG. 4B, it is preferable that the second gate of the transistor M41 be electrically connected to the first gate of the transistor M41. Furthermore, it is preferable that the second gate of the transistor M42 be electrically connected to the first terminal of the transistor M42.

In the transistor M41, the first gate and the second gate preferably overlap with each other with a semiconductor layer therebetween. In a similar manner, in the transistor M42, the first gate and the second gate preferably overlap with each other with a semiconductor layer therebetween.

The transistors M41 and M42 each preferably include the second gate, because $V_{th}$ of the transistors can be stabilized.

The channel length of the transistor M41 is preferably longer than that of the transistor M0. For example, in the case where the channel length of the transistor M0 is less than 1 μm, the channel length of the transistor M41 is 1 μm or more, preferably 3 μm or more, further preferably 5 μm or more, furthermore preferably 10 μm or more.

The transistor M41 has a longer channel length, whereby the transistor M41 is not affected by a short-channel effect, and the cutoff current can be low. Furthermore, the withstand voltage between a source and a drain of the transistor M41 can be increased. The high withstand voltage between the source and the drain of the transistor M41 facilitates a connection between the transistor M0 and the voltage generation circuit 12 generating a high voltage, which is preferable.

For example, in the case where the transistor M0 is used for a circuit that needs to have high integration such as a memory cell, the channel length of the transistor M0 is preferably short. Meanwhile, the transistor M41 can be formed outside the memory cell; thus, a long channel length does not become a problem. When the channel length of the transistor is long, the on-state current of the transistor is decreased; however, the transistor M41 is generally used in the off state and therefore high on-state current is not required.

An OS transistor or a transistor including a wide-bandgap semiconductor in the channel formation region, is preferably used as the transistor M41. The cutoff current is low and the withstand voltage between a source and a drain is high in the OS transistor and the transistor including a wide-bandgap semiconductor. Note that in this specification, the term "wide-bandgap semiconductor" is a semiconductor whose bandgap is 2.2 eV or greater. Examples of the wide-bandgap semiconductor include silicon carbide, gallium nitride, and diamond.

The cutoff current of the OS transistor or the transistor including a wide-bandgap semiconductor remains small even in a high-temperature environment. Thus, the use of such a transistor as the transistor M41 enables operation of the circuit 10 in a high-temperature environment.

The transistor M42 may be formed of a semiconductor material that is different from a semiconductor material used for the transistor M41; alternatively, the transistor M42 and the transistor M41 may be formed using the same semiconductor material. The transistor M42 and the transistor M41 are preferably formed using the same material because the manufacturing process can be simplified.

<Voltage Generation Circuit 12>

Next, details of the voltage generation circuit 12 are described with reference to FIGS. 6A and 6B and FIGS. 7A to 7C.

The circuit diagrams in FIGS. 6A and 6B and FIGS. 7A to 7C are examples of the voltage generation circuit 12. These are step-down charge pump circuits, in each of which GND is input to an input terminal IN, and $V_{BG}$ that is a negative potential is output from an output terminal OUT. Here, although the number of stages of the charge pump circuit is four as an example, it is not limited to this, and the charge pump circuit may be formed with any number of stages.

[Voltage Generation Circuit 12a]

Figure 6A:
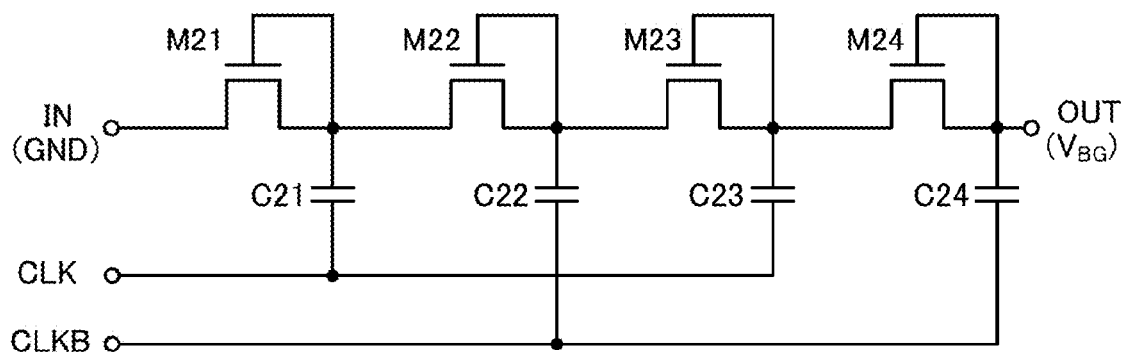
FIGS. 6A and 6B are circuit diagrams each illustrating a structure example of a voltage generation circuit.
Figure 6B:
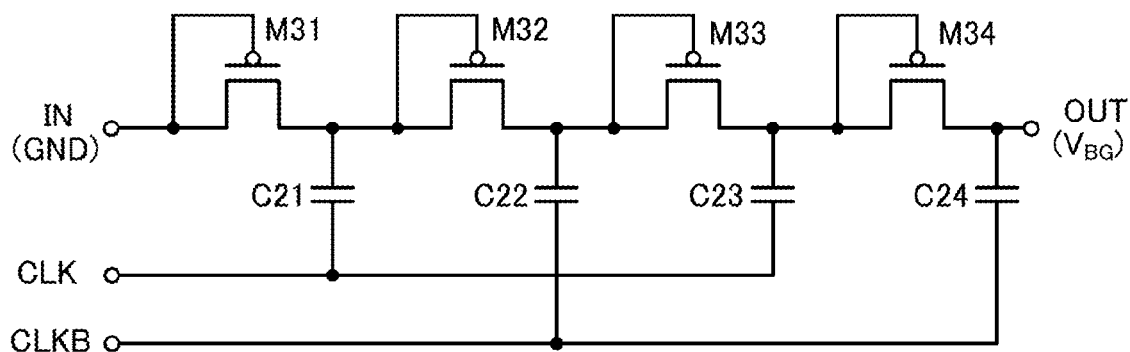

As shown in FIG. 6A, the voltage generation circuit 12a includes transistors M21 to M24 and capacitors C21 to C24. Note that in the following description, the transistors M21 to M24 are assumed as n-channel transistors.

The transistors M21 to M24 are connected in series between the input terminal IN and the output terminal OUT, and each has a structure in which a gate and a first terminal are connected so that the transistor functions as a diode. The capacitors C21 to C24 are connected to the gates of the transistors M21 to M24, respectively.

A signal CLK is input to the first terminals of the capacitors C21 and C23 in the odd-numbered stages, and a signal CLKB is input to the first terminals of the capacitors C22 and C24 in the even-numbered stages. The signal CLKB is an inverted clock signal obtained by phase inversion of the signal CLK.

The voltage generation circuit 12a has a function of stepping down GND input to the input terminal IN to generate $V_{BG}$. The voltage generation circuit 12a can generate a negative potential only by supply of the signals CLK and CLKB.

The transistors M21 to M24 may be formed using OS transistors. The OS transistors are preferably used because the reverse current of the diode-connected transistors M21 to M24 can be reduced.

[Voltage Generation Circuit 12b]

The voltage generation circuit 12 may be formed of p-channel transistors. A voltage generation circuit 12b in FIG. 6B includes transistors M31 to M34 that are p-channel transistors.

Figure 7A:
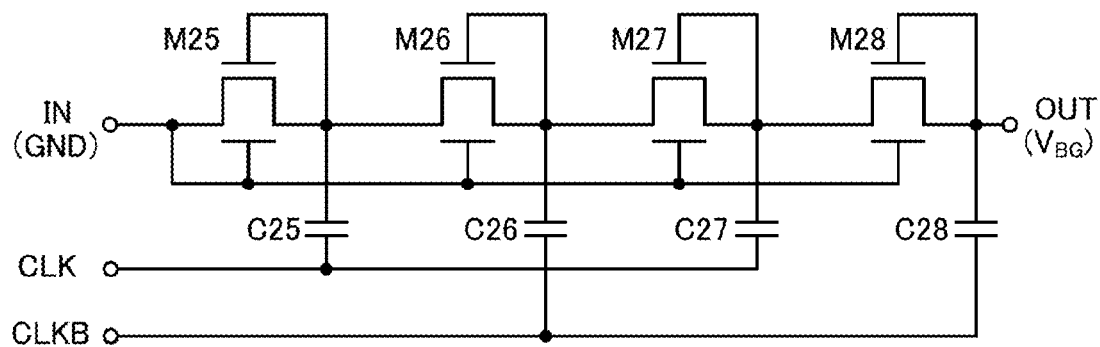
FIGS. 7A to 7C are circuit diagrams each illustrating a structure example of a voltage generation circuit.
Figure 7B:
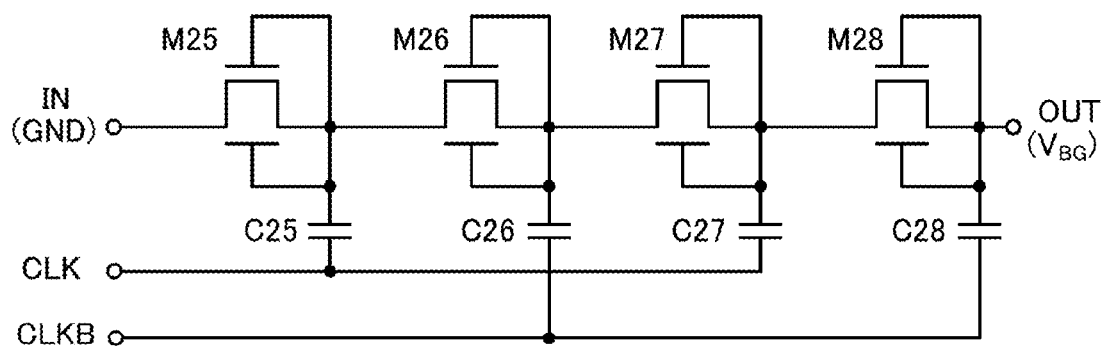
Figure 7C:
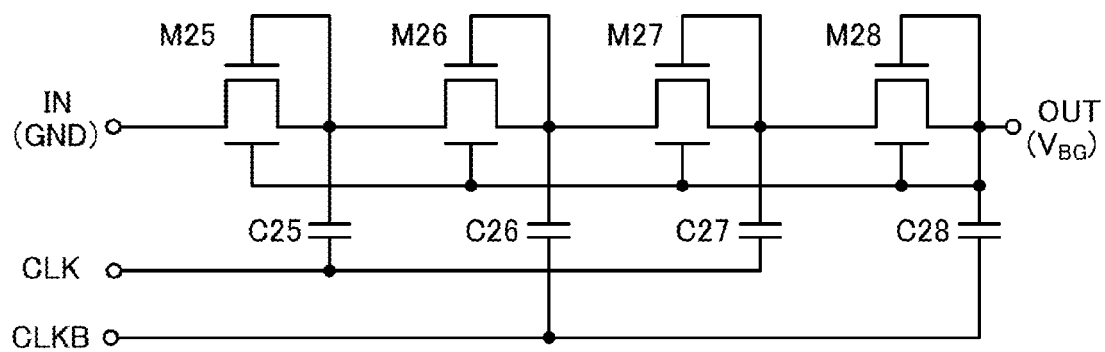

The voltage generation circuit 12 may be formed of a transistor including a first gate and a second gate. FIGS. 7A to 7C illustrate circuit diagrams in that case.

[Voltage Generation Circuit 12c]

As shown in FIG. 7A, a voltage generation circuit 12c includes transistors M25 to M28 and capacitors C25 to C28. Note that in the following description, the transistors M25 to M28 are assumed as n-channel transistors.

The transistors M25 to M28 each include a first gate and a second gate. In each transistor, the first gate and the second gate preferably overlap with each other with a semiconductor layer therebetween.

The transistors M25 to M28 are serially connected between the input terminal IN and the output terminal OUT, and each has a structure in which a first gate and a first terminal are connected so as to function as a diode. The capacitors C25 to C28 are connected to the first gates of the transistor M25 to M28, respectively.

A signal CLK is input to the first terminals of the capacitors C25 and C27 in the odd-numbered stages, and a signal CLKB is input to the first terminals of the capacitors C26 and C28 in the even-numbered stages. The signal CLKB is an inverted clock signal obtained by phase inversion of the signal CLK.

The voltage generation circuit 12c has a function of stepping down GND input to the input terminal IN and generating $V_{BG}$. The voltage generation circuit 12c can generate a negative potential only by supply of the signals CLK and CLKB.

In the voltage generation circuit 12c, the transistors M25 to M28 are provided with second gates, and a voltage is applied to the second gates to adjust $V_{th}$ of the transistors M25 to M28. In the voltage generation circuit 12c, the second gates of the transistors M25 to M28 are each connected to the input terminal IN.

The second gates of the transistors M25 to M28 are connected to the input terminal IN where the voltage is the highest in the voltage generation circuit 12c. That is, to the second gates of the transistors M25 to M28, voltages higher than those of the sources are applied. This can lower $V_{th}$ of the transistors M25 to M28 as compared with the case of not applying voltages to the second gates, increasing current driving characteristics of the transistors M25 to M28. Consequently, the voltage is stepped down with a small number of stages; the number of stages in the voltage generation circuit 12c can be reduced. The size of the voltage generation circuit 12c can be reduced, whereby power consumption can be reduced.

[Voltage Generation Circuit 12d]

In a voltage generation circuit 12d in FIG. 7B, the second gates of the transistors M25 to M28 are connected to their respective first gates of the transistors. The other structures are the same as those of the voltage generation circuit 12c.

In the voltage generation circuit 12d, because the same voltage is applied to the first gates and the second gates of the transistors M25 to M28, the on-state current is improved compared to the case where the voltages are not applied to the second gates. Consequently, the voltage is stepped down with a small number of stages; the number of stages in the voltage generation circuit 12d can be reduced. The size of the voltage generation circuit 12d can be reduced.

[Voltage Generation Circuit 12e]

In a voltage generation circuit 12e in FIG. 7C, the second gates of the transistors M25 to M28 are each connected to the output terminal OUT. The other structures are the same as those of the voltage generation circuit 12c.

The voltage generation circuit 12e puts more importance on a reduction of a leakage current flowing through the transistors M25 to M28 than the voltage generation circuits 12c and 12d. The second gates of the transistors M25 to M28 are connected to the output terminal OUT where the voltage is the lowest in the voltage generation circuit 12e. Since voltages lower than those of the sources are applied to the second gates of the transistors M25 to M28, $V_{th}$ of the transistors M25 to M28 in the voltage generation circuit 12e can be higher than that in the voltage generation circuits 12c and 12d. Thus, reverse currents of the diode-connected transistors M25 to M28 can be reduced, preventing leakage of charges from the capacitors C25 to C28. This allows the capacitance values of the capacitors C25 to C28 to be decreased, so that the size of the voltage generation circuit 12e can be reduced.

The transistors M25 to M28 may be formed using OS transistors. The OS transistors are preferably used because reverse currents of the diode-connected transistors M25 to M28 can be reduced.

As described above, the circuit 10 has the any one of the above-described structures, so that a semiconductor device capable of holding data for a long time can be provided. Furthermore, a semiconductor device capable of reducing power consumption can be provided.

Embodiment 2

In this embodiment, application examples of the circuit 10 described in Embodiment 1 are described with reference to FIGS. 8A and 8B, FIG. 9, FIG. 10, FIG. 11, FIG. 12, FIG. 13, FIG. 14, FIG. 15, FIG. 16, FIG. 17, FIG. 18, FIG. 19, and FIGS. 20A and 20B.

<<Nonvolatile Memory>>

First, an example in which the circuit 10 is used for a nonvolatile memory is described.

[Memory Cell 100]

Figure 8A:
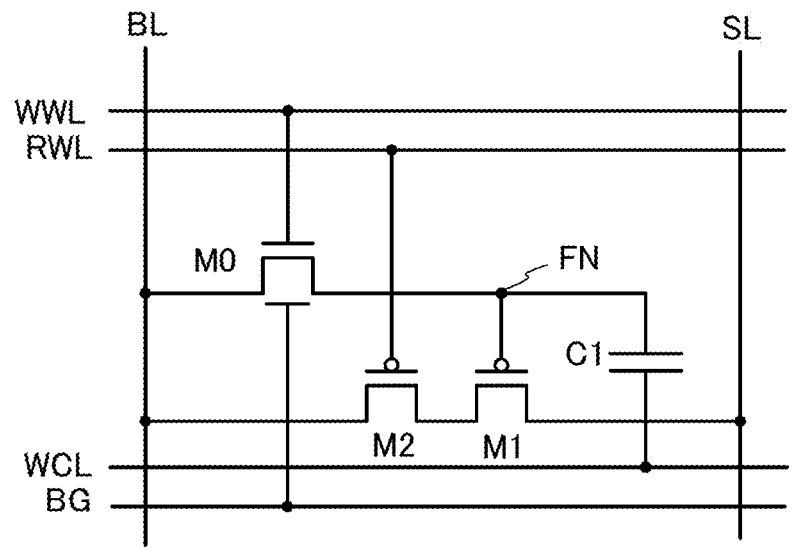
FIGS. 8A and 8B are circuit diagrams each illustrating a structure example of a memory cell.

A memory cell 100 in FIG. 8A includes the transistor M0, a transistor M1, a transistor M2, and a capacitor C1.

The memory cell 100 is electrically connected to a wiring BL, a wiring SL, a wiring WWL, a wiring RWL, a wiring WCL, and a wiring BG.

A node where one of a source and a drain of the transistor M0, a gate of the transistor M1, and a first terminal of the capacitor C1 are electrically connected to one another is referred to as the node FN. One of a source and a drain of the transistor M1 is electrically connected to the wiring SL, and the other of the source and the drain of the transistor M1 is electrically connected to the wiring BL through the transistor M2. A gate of the transistor M2 is electrically connected to the wiring RWL.

The other of the source and the drain of the transistor M0 is electrically connected to the wiring BL. A first gate of the transistor M0 is electrically connected to the wiring WWL, and a second gate of the transistor M0 is electrically connected to the wiring BG.

A second terminal of the capacitor C1 is electrically connected to the wiring WCL.

The transistor M0 has a function as a switch that controls writing of data to the node FN by being switched between a conducting state and a non-conducting state.

Note that as the transistor M0, a transistor with a low cutoff current is preferably used. As the transistor M0, an OS transistor or a transistor including a wide-bandgap semiconductor in a channel formation region is preferably used.

The node FN can retain 1-bit (binary) data when the transistor M0 is turned off. The node FN can retain not only 1-bit data but also K-bit ($2^K$-valued, K is a natural number of two or more) data.

The case where 1-bit data is retained in the node FN is described below.

Writing and reading operations of the memory cell 100 are described below with reference to FIG. 9. Note that the transistor M0 is an n-channel transistor and the transistors M1 and M2 are p-channel transistors in the following description.

Figure 9:
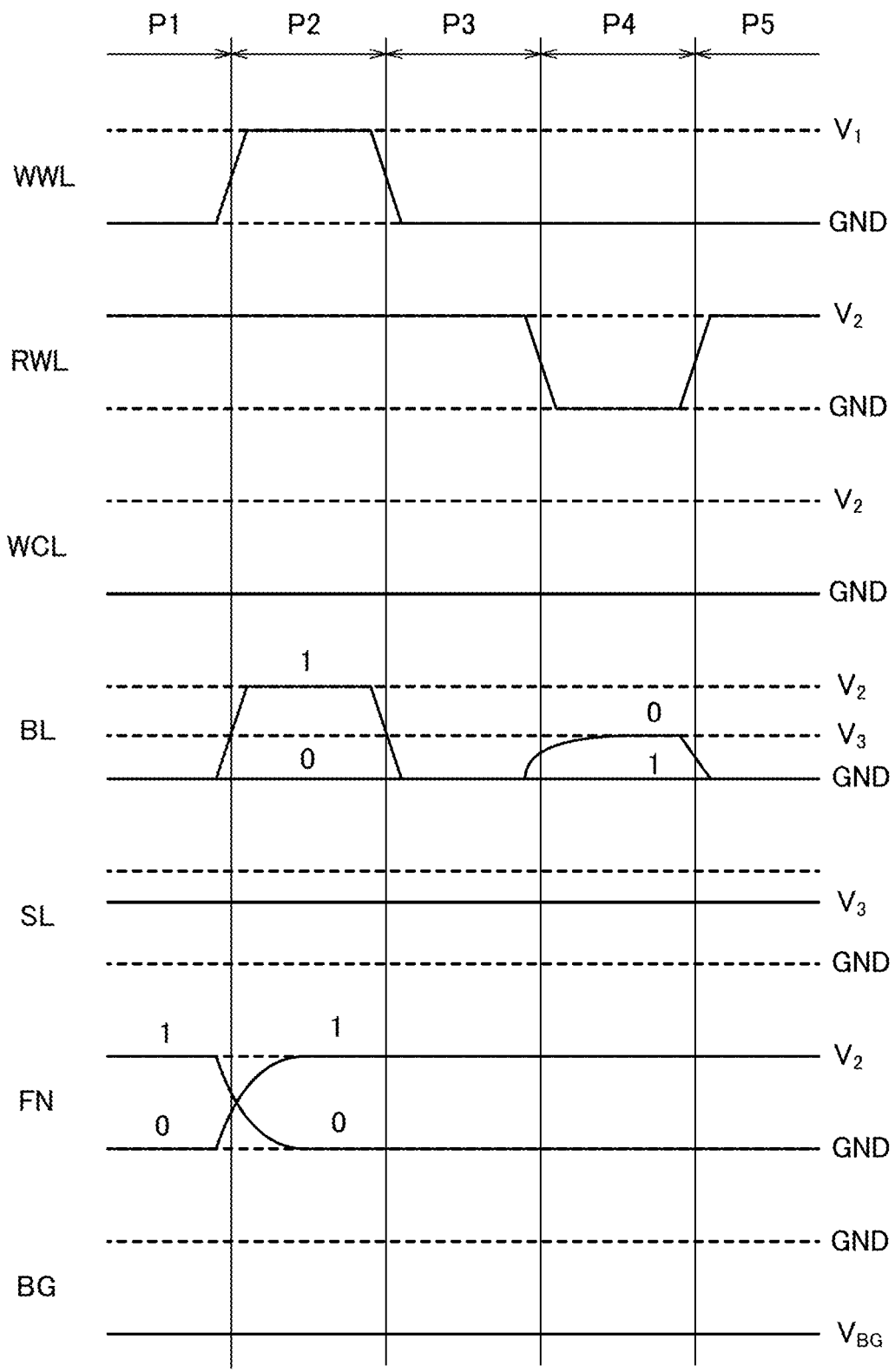
FIG. 9 is a timing chart illustrating an operation example of a memory cell.

FIG. 9 is a timing chart illustrating an operation example of the memory cell 100. The timing chart shows the potentials applied to, from the top, the wiring WWL, the wiring RWL, the wiring WCL, the wiring BL, the wiring SL, the node FN, and the wiring BG. The timing chart in FIG. 9 can be divided into the periods P1 to P5.

The periods P1, P3, and P5 are standby periods of the memory cell 100. The period P2 is a write period of the memory cell 100. The period P4 is a read period of the memory cell 100.

Note that in the periods P1 to P5, the wiring WCL is constantly supplied with the potential GND. The potential GND is preferably a low power supply potential or a ground potential.

Furthermore, in the periods P1 to P5, the wiring SL is constantly supplied with a potential $V_3$ and the wiring BG is constantly supplied with a potential $V_{BG}$. The potential $V_{BG}$ is preferably a negative potential. When the potential $V_{BG}$ that is a negative potential is supplied, the transistor M0 can be normally off.

Operations in the respective periods are described in order below.

First, in the period P1, the wirings WWL and BL are supplied with the potential GND and the wiring RWL is supplied with a potential $V_2$. At this time, the transistor M2 is off and no current flows between the wiring BL and the wiring SL. In order that the transistor M2 can be off, a difference between the potential $V_2$ and the potential $V_3$ ($V_2-V_3$) is preferably larger than the threshold voltage of the transistor M2.

Then, in the period P2, the wiring WWL is supplied with a potential $V_1$ and the wiring BL is supplied with the potential $V_2$ (data "1") or the potential GND (data "0"). The potential $V_1$ is preferably higher than the sum of the potential $V_2$ and the threshold voltage of the transistor M0. At this time, the transistor M0 is turned on and the data applied to the wiring BL is written in the node FN.

Next, in the period P3, the wiring WWL and the wiring BL are supplied with the potential GND. At this time, the transistor M0 is turned off and the data written in the node FN is retained.

Next, in the period P4, the wiring BL is brought into an electrically floating state and the wiring RWL is supplied with the potential GND. At this time, the transistor M2 is turned on.

If the data "1" is written in the node FN, the transistor M1 is off, so that no current flows between the wiring SL and the wiring BL and the wiring BL remains at the potential GND. In order that the transistor M1 can be off, a difference between the potential $V_2$ and the potential $V_3$ ($V_2-V_3$) is preferably larger than the threshold voltage of the transistor M1.

If the data "0" is written in the node FN, the transistor M1 is on, so that the wiring SL and the wiring BL are electrically connected and the wiring BL is charged until it has the potential $V_3$ (until the potential of the wiring BL becomes equal to that of the wiring SL). In order that the transistor M1 can be on, a difference between the potential GND and the potential $V_3$ ($-V_3$) is preferably smaller than the threshold voltage of the transistor M1. In order that the transistor M2 can be on, a difference between the potential GND and the potential $V_3$ ($-V_3$) is preferably smaller than the threshold voltage of the transistor M2.

In the period P4, the potential of the wiring BL is read to determine the data written in the node FN.

Then, in the period P5, the wiring RWL is supplied with the potential $V_2$ and the wiring BL is supplied with the potential GND, so that the data in the node FN is retained.

As described above, through the operations in the periods P1 to P5, data reading from and data writing to the memory cell 100 can be performed.

Figure 8B:
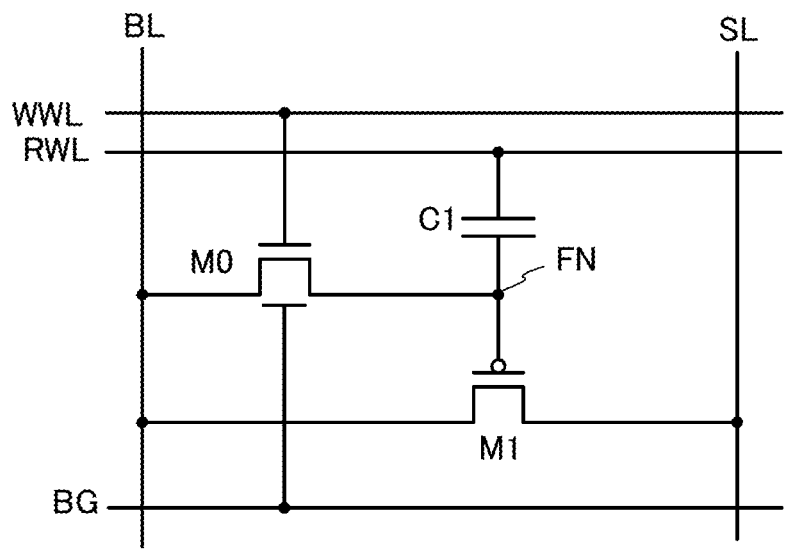

Note that in the memory cell 100 in FIG. 8A, the transistor M2 and the wiring WCL are not necessarily provided, and the second terminal of the capacitor C1 may be connected to the wiring RWL. FIG. 8B illustrates a circuit diagram in that case. The number of transistors in a memory cell 101 in FIG. 8B is smaller than that in the memory cell 100 in FIG. 8A. Thus, the area occupied by the circuit in FIG. 8B can be reduced. As a result, the degree of integration of a memory cell can be increased.

Unlike a flash memory, the memory cells 100 and 101 have no limitation on the number of writing. Furthermore, power consumption in writing and reading is reduced. Thus, a memory device with high reliability and low power consumption can be provided by the use of the memory cell 100 for a nonvolatile memory.

[Memory Device 110]

Figure 10:
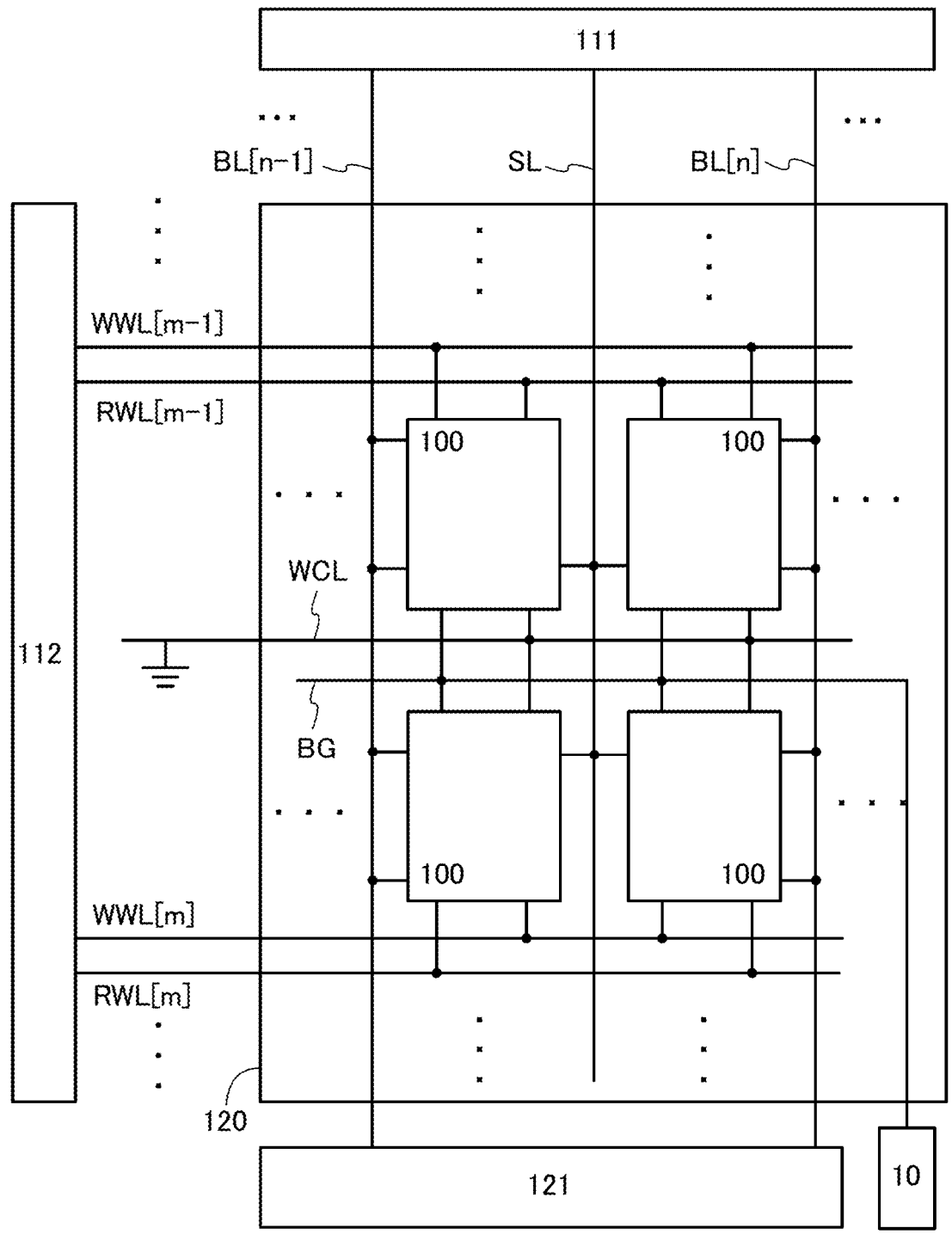
FIG. 10 is a circuit block diagram illustrating a structure example of a memory.

A memory device 110 in FIG. 10 includes a memory cell array 120 provided with a plurality of memory cells 100, a row driver 112, a column driver 111, a reading circuit 121, and the circuit 10. The memory device 110 includes the memory cells 100 arranged in a matrix of m rows (m is a natural number of two or more) and n columns (n is a natural number of two or more).

FIG. 10 shows a wiring WWL[m-1] and a wiring RWL[m-1] that are connected to the memory cells 100 in the (m-1)-th row, a wiring WWL[m] and a wiring RWL[m] that are connected to the memory cells 100 in the m-th row, the wiring WCL that is connected to the memory cells 100 in the (m-1)-th and m-th rows, and the wiring BG that is connected to the memory cells 100 in the (m-1)-th and m-th rows.

In addition, FIG. 10 shows a wiring BL[n-1] that is connected to the memory cells 100 in the (n-1)-th column, a wiring BL[n] that is connected to the memory cells 100 in the n-th column, and the wiring SL that is connected to the memory cells 100 in the (n-1)-th and n-th columns.

In the memory cell array 120 shown in FIG. 10, the wirings SL, WCL, and BG are shared by adjacent memory cells. This structure reduces the area occupied by the wirings. Thus, a memory device with this structure can have high memory capacity per unit area.

Note that in FIG. 10, the memory cell 101 in FIG. 8B may be used instead of the memory cell 100. In that case, the wiring WCL can be omitted.

The row driver 112 is a circuit having a function of selectively turning on the transistors M0 and M2 in the memory cells 100 of each row. With the row driver 112, the memory cells 100 can be selected row by row, and data can be written and read to/from the selected memory cells 100 in the memory device 110.

The column driver 111 is a circuit having a function of selectively writing data in the node FN in the memory cells 100 of each column, a function of initializing the potential of the wiring BL, and a function of making the wiring BL electrically floating. Specifically, the column driver 111 is a circuit that supplies a potential corresponding to data to the wiring BL. With the column driver 111, the memory cells 100 can be selected column by column, and data can be written and read to/from the selected memory cells 100 in the memory device 110.

The reading circuit 121 is a circuit that has a function of reading out data held in the memory cells 100 from the wiring BL and outputting it to the outside as digital data.

The circuit 10 described in Embodiment 1 is connected to the wiring BG. The circuit 10 has a function of controlling the potential of the second gate of the transistor M0 included in each memory cell connected to the wiring BG.

By the circuit 10, a negative potential can be applied to the second gate of the transistor M0 included in the memory cell 100 and can be continuously held. By the circuit 10 in the memory device 110, the cutoff current of the transistors M0 can be lowered, and data holding characteristics can be improved.

[Row Driver 112]

Figure 11:
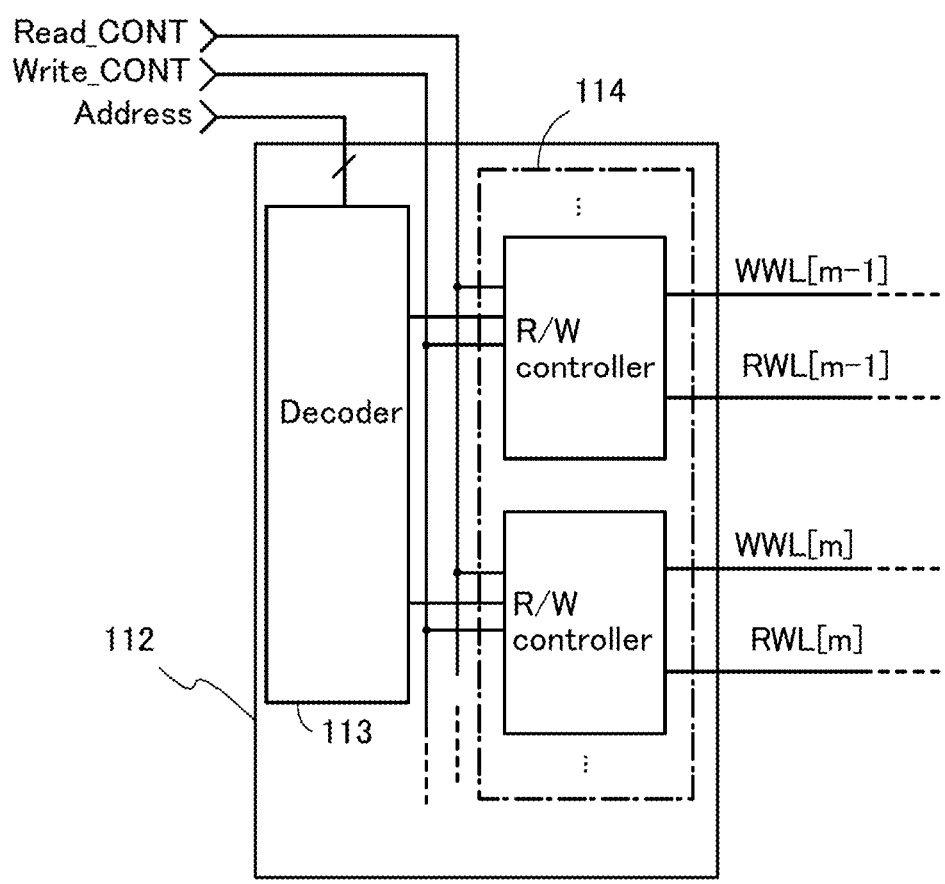
FIG. 11 is a circuit diagram illustrating a structure example of a row driver.

FIG. 11 is a block diagram showing a structure example of the row driver 112 illustrated in FIG. 10.

The row driver 112 in FIG. 11 includes a decoder 113 and read/write controller 114. The read/write controller 114 is connected to the wirings WWL and the wiring RWL.

The decoder 113 is a circuit that outputs a signal for selecting any of the rows. Specifically, the decoder 113 is a circuit which receives an address signal (Address) and selects the read/write controller 114 of any of rows in accordance with the Address. With the decoder 113, the row driver 112 can select a given row to perform writing and reading of data.

The read/write controller 114 is a circuit that has a function of outputting a write signal and selectively outputting a read signal, in a row selected by the decoder 113. Specifically, the read/write controller 114 is a circuit that receives a write control signal Write_CONT or a read control signal Read_CONT and selectively outputs a write signal or a read signal in accordance with the signal. With the read/write controller 114, the row driver 112 can select and output the write signal or the read signal in the row selected by the decoder 113.

[Column Driver 111]

Figure 12:
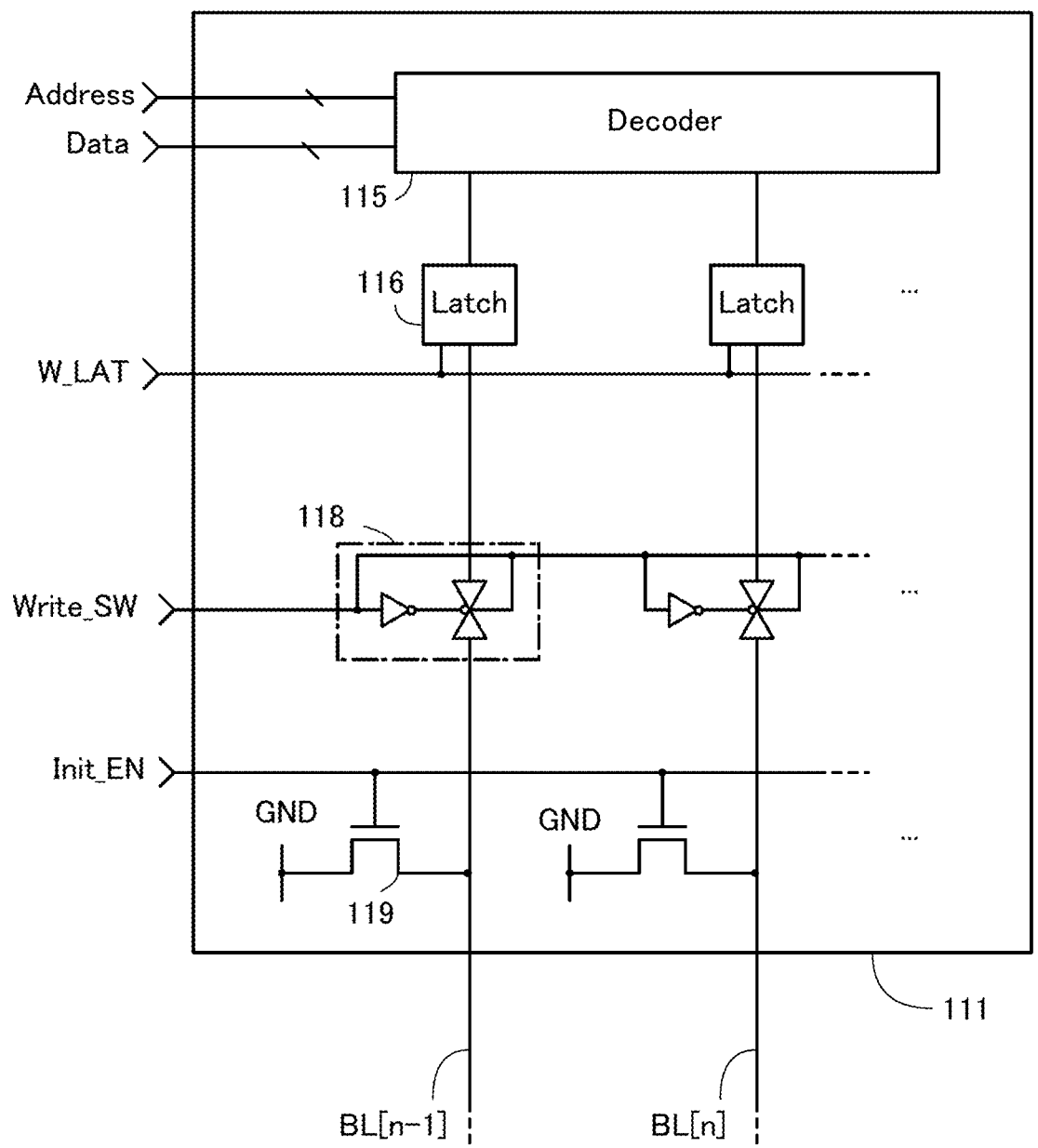
FIG. 12 is a circuit block diagram illustrating a structure example of a column driver.

FIG. 12 is a block diagram illustrating a structure example of the column driver 111 in FIG. 10.

The column driver 111 in FIG. 12 includes a decoder 115, latch circuits 116, a switch circuit 118, and a transistor 119. The latch circuit 116, the switch circuit 118, and the transistor 119 are provided for every column. Furthermore, the switch circuit 118 and the transistor 119 in each column are connected to the wiring BL.

The decoder 115 is a circuit having a function of selecting a column of the wiring BL and sorting and outputting input data. Specifically, the decoder 115 receives an address signal (Address) and data (Data) and outputs the data (Data) to the latch circuit 116 of any of columns in accordance with the address signal (Address). With the decoder 115, the column driver 111 can select a given column to perform writing of data.

The latch circuit 116 is a circuit having a function of temporarily storing the input data (Data). Specifically, the latch circuit 116 is a flip-flop circuit that receives a latch signal W_LAT and outputs the data (Data) to the switch circuit 118 in accordance with the latch signal W_LAT. With the latch circuit 116, the column driver 111 can perform writing of data at given timing.

The switch circuit 118 is a circuit which has functions of supplying the input data to the wiring BL and bringing the wiring BL into an electrically floating state. Specifically, the switch circuit 118 includes an analog switch and an inverter, supplies the input data to the wiring BL in accordance with the control of a switch control signal Write_SW, and then, turning off the analog switch to bring the wiring BL into an electrically floating state. The switch circuit 118 enables the column driver 111 to keep the bit line BL in an electrically floating state after the data is supplied to the wiring BL.

The transistor 119 has a function of supplying an initialization voltage (GND) to the wiring BL and a function of bringing the wiring BL into an electrically floating state. Specifically, the transistor 119 is a switch that supplies an initialization voltage to the wiring BL in accordance with the control of an initialization control signal Init_EN, and then brings the wiring BL into an electrically floating state. The transistor 119 enables the column driver 111 to keep the wiring BL in an electrically floating state after the initialization voltage is supplied to the wiring BL.

[Reading Circuit 121]

Figure 13:
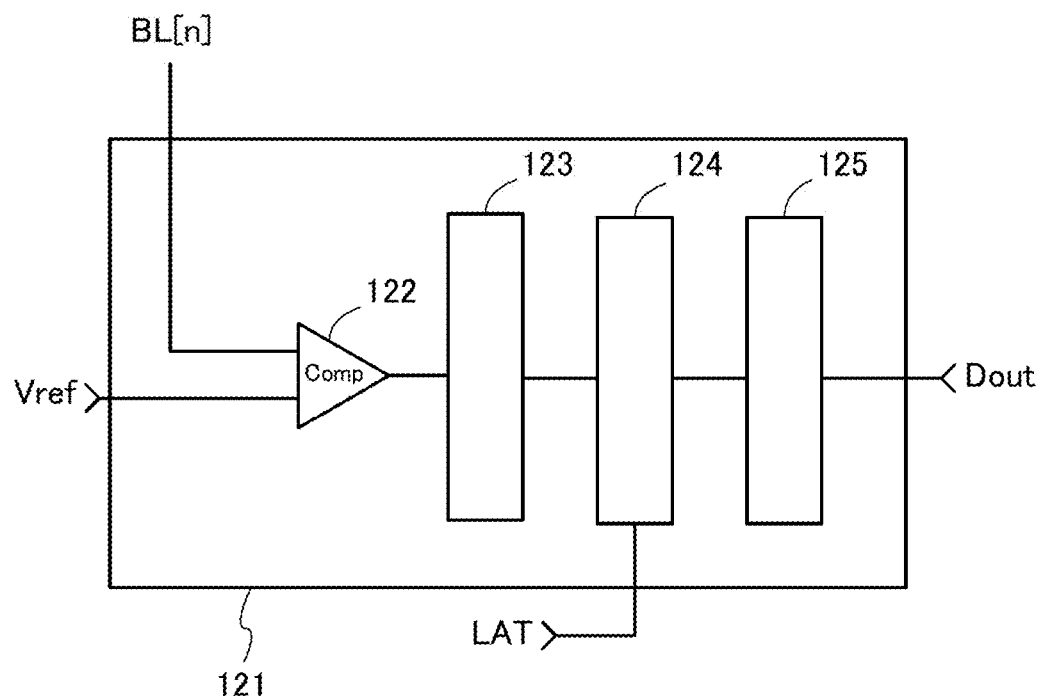
FIG. 13 is a circuit diagram illustrating a structural example of a reading circuit.

FIG. 13 is a block diagram illustrating a structure example of the reading circuit 121 illustrated in FIG. 10.

The reading circuit 121 in FIG. 13 includes a comparator 122, an encoder 123, a latch 124, and a buffer 125. The buffer 125 in each column outputs data Dout.

The comparator 122 is a circuit having a function of determining whether the potential of the wiring BL is a potential corresponding to either "0" or "1" by comparing the levels of the potentials of the wiring BL and the levels of the potentials of reference voltages Vref.

The encoder 123 is a circuit having a function of generating a digital signal on the basis of a signal for determining the potential of the wiring BL which is output from the comparator 122. Specifically, the encoder 122 is a circuit which encodes a H-level or L-level signal output from the comparator 122 to generate a digital signal.

The latch 124 is a circuit having a function of temporarily storing input data of a digital value. Specifically, the latch 124 is a flip-flop circuit that receives a latch signal LAT and outputs the data to the buffer 125 in accordance with the latch signal LAT. With the latch 124, the reading circuit 121 can output data at an opportune time. Note that the latch 124 can be omitted.

The buffer 125 is a circuit having a function of amplifying data output from the latch 124 and outputting the amplified data as an output signal Dout. Specifically, the buffer 125 is a circuit which includes an even number of stages of inverter circuits. With the buffer 125, noise to a digital signal can be reduced in the circuit 121. Note that the buffer 125 can be omitted.

<<DRAM>>

Next, an example in which the circuit 10 is used for a DRAM is described.

[Memory Cell 130]

Figure 14:
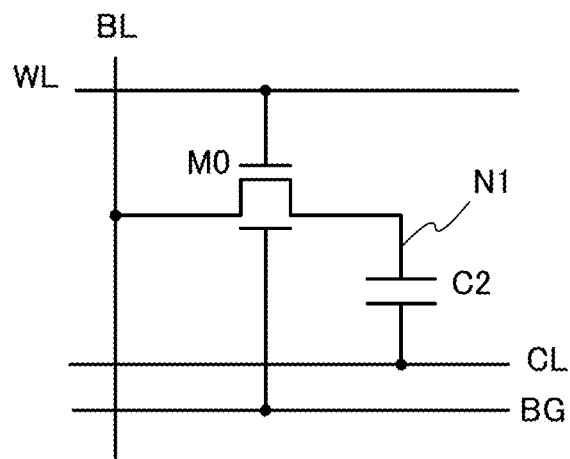
FIG. 14 is a circuit diagram illustrating a structure example of a memory cell.

FIG. 14 illustrates a structure example of the memory cell 130. The memory cell 130 includes the transistor M0 and a capacitor C2. The first gate of the transistor M0 is electrically connected to the wiring WL, the first terminal of the transistor M0 is electrically connected to a first terminal of the capacitor C2, and the second terminal of the transistor M0 is electrically connected to the wiring BL. A second terminal of the capacitor C2 is electrically connected to a wiring CL. The second gate of the transistor M0 is electrically connected to the wiring BG. Here, a node of the first terminal of the transistor M0 and the first terminal of the capacitor C2 is denoted by the node N1.

Note that as the transistor M0, a transistor with a low cutoff current is preferably used. As the transistor M0, an OS transistor or a transistor including a wide-bandgap semiconductor in a channel formation region is preferably used.

When the cutoff current of the transistor M0 is low, leakage of charge held in the node N1 can be reduced. Data stored in the memory cell 130 can be held for a long time, and therefore the interval between refresh operations can be long. Specifically, the interval between refresh operations can be an hour or longer.

In the memory device including the memory cell 130 is used, power supply can be stopped for a long time during which data is not written or read; thus, power consumption can be reduced.

[Memory Device 131]

Figure 15:
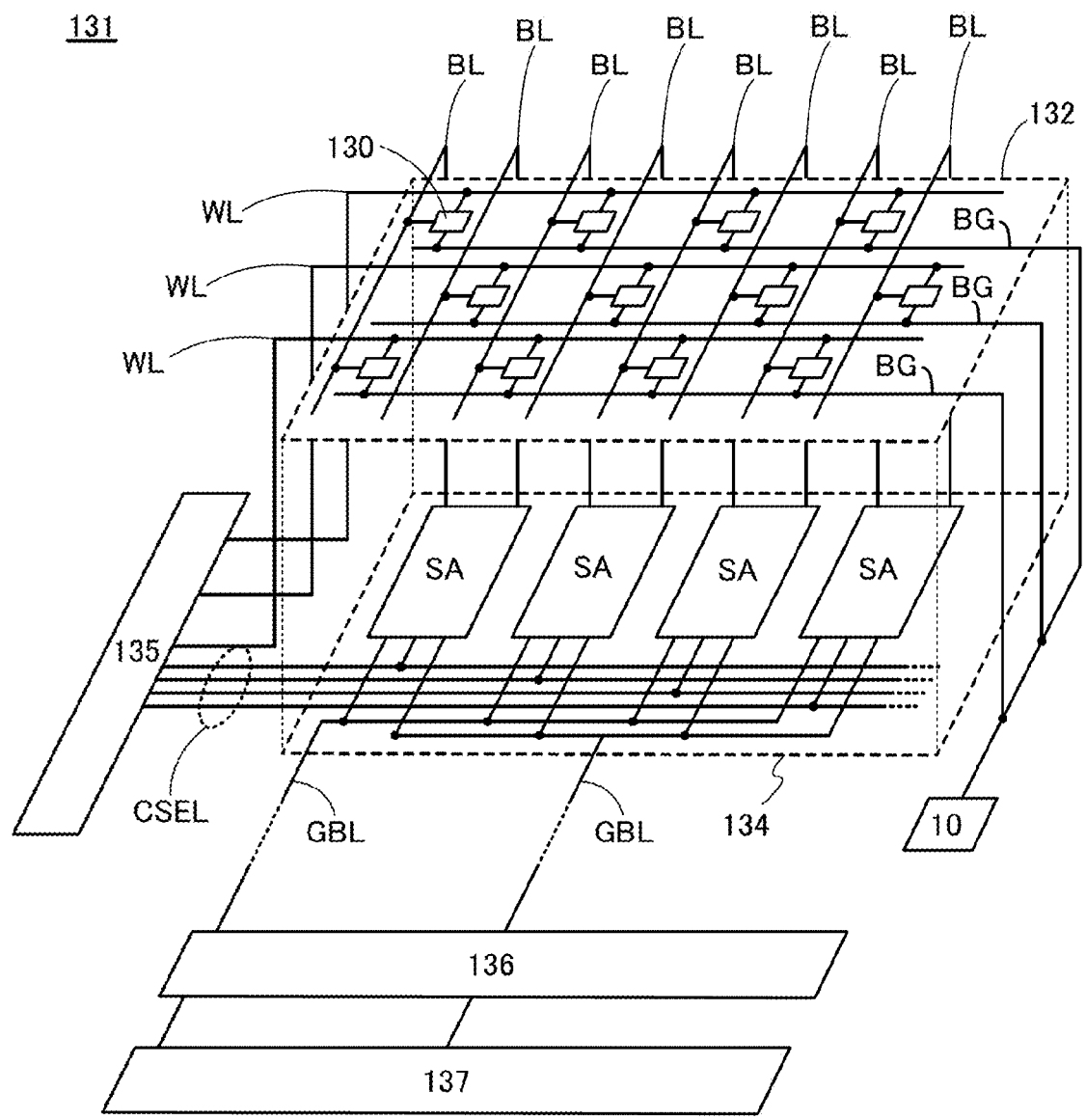
FIG. 15 is a circuit block diagram illustrating a structure example of a memory.

A memory device 131 in FIG. 15 includes a cell array 132, a sense amplifier circuit 134, a driver circuit 135, a main amplifier 136, an input output circuit 137, and the circuit 10. The cell array 132 includes a plurality of memory cells 130. Each of the memory cells 130 is connected to the wiring WL and the wiring BL. The memory cells 130 are selected according to a potential supplied to the wiring WL, and a potential corresponding to data to be written to the memory cells 130 is supplied to the wiring BL (hereinafter, the potential is also referred to as writing potential); in this manner, data is written to the memory cells 130. Here, the case where the cell array 132 includes the memory cells 130 arranged in a matrix of i rows and j columns (i and j are natural numbers of 2 or more) is shown. Therefore, in the cell array 132, i wirings WL and j wirings BL are provided.

The sense amplifier circuit 134 is connected to the plurality of wirings BL and a plurality of wirings GBL. The sense amplifier circuit 134 has a function of amplifying a signal that is input and controlling output of the amplified signal. Specifically, the sense amplifier circuit 134 has a function of amplifying the potentials of the wirings BL (hereinafter, the potentials are also referred to as reading potentials), which correspond to data stored in the memory cells 130, and outputting them to the wirings GBL at a predetermined timing. Since the reading potentials are amplified by the sense amplifier circuit 134, data can be surely read even in the case where a potential read from the memory cell 130 is extremely low. Furthermore, since output of the amplified potentials to the wirings GBL is controlled, each of the wirings GBL can be shared.

The sense amplifier SA has a function of amplifying a difference between a reference potential and a reading potential that is supplied to the wiring BL and holding the amplified potential difference. Furthermore, the sense amplifier SA has a function of controlling the output of the amplified potential to the wiring GBL. Here, the sense amplifier SA is connected to two wirings BL and two wirings GBL.

In one embodiment of the present invention, the memory cells 130 and the sense amplifiers SA are formed in different layers. In particular, the memory cells 130 are preferably formed over the sense amplifiers SA. In addition, at least one memory cells 130 is preferably positioned so as to overlap with the sense amplifiers SA. Accordingly, the area of the memory device 131 can be smaller than that in the case where the memory cells 130 and the sense amplifiers SA are positioned in the same layer. Accordingly, the memory capacity per unit area of the memory device 131 can be increased. When all the memory cells 130 are positioned so as to overlap with the sense amplifier SA, the area of the memory device 131 can be further reduced. The memory cells 130 may be positioned so as to overlap with one sense amplifier SA; alternatively, the memory cells 130 may be positioned so as to overlap with the plurality of sense amplifiers SA.

In addition, because the memory cells MC and the sense amplifiers SA are stacked, the length of the wirings BL electrically connecting the memory cells 130 to the sense amplifiers SA can be reduced. Consequently, the wiring resistance of the wirings BL can be low, and a reduction in the power consumption and an increase in the operation speed of the memory device 131 can be achieved. Furthermore, the areas of the capacitors provided in the memory cells 130 can be small; thus the sizes of the memory cells 130 can be small.

The main amplifier 136 is connected to the sense amplifier circuit 134 and the input/output circuit 137. The main amplifier 136 has a function of amplifying a signal that is input. Specifically, the main amplifier 136 has a function of amplifying the potentials of the wirings GBL and outputting them to the input/output circuit 137. Note that the main amplifier 136 is not necessarily provided.

The input/output circuit 137 has a function of outputting the potentials of the wirings GBL or the potentials output from the main amplifier 136 as reading data to the outside.

The driver circuit 135 is connected to the memory cells 130 through the wirings WL. The driver circuit 135 has a function of supplying a signal for selecting the memory cells 130 in which data is written (hereinafter, the signal is also referred to as a write word signal) to the wiring WL. The driver circuit 135 can be formed using a decoder or the like.

The memory device 131 is capable of selecting a signal to be output to the outside with the use of the sense amplifiers SA and wirings CSEL. Therefore, the input/output circuit 137 does not need to select a signal with the use of a multiplexer or the like, and thus can have a simple circuit structure and a small occupied area.

Note that the number of the wirings GBL is not particularly limited, and may be a given number smaller than the number of the wirings BL (i.e., j) in the cell array 132. For example, in the case where the number of the wirings BL connected to one wiring GBL is k (k is an integer of 2 or more), the number of the wirings GBL is j/k.

The memory cells 130 are each connected to the wiring BG. The wiring BG is connected to the circuit 10 described in Embodiment 1. The circuit 10 has a function of controlling the potential of the second gate of the transistor M0 included in each memory cell connected to the wiring BG.

By the circuit 10, a negative potential can be applied to the second gates of the transistors M0 included in the memory cells 130 and can be continuously held. The memory device 131 can reduce the cutoff current of the transistors M0 by provision of the circuit 10; thus, data holding characteristics can be improved. As a result, the frequency of refresh operations in the memory cells 130 can be reduced, and power consumption of the memory device 131 can be reduced.

[Sense Amplifier SA]

Figure 16:
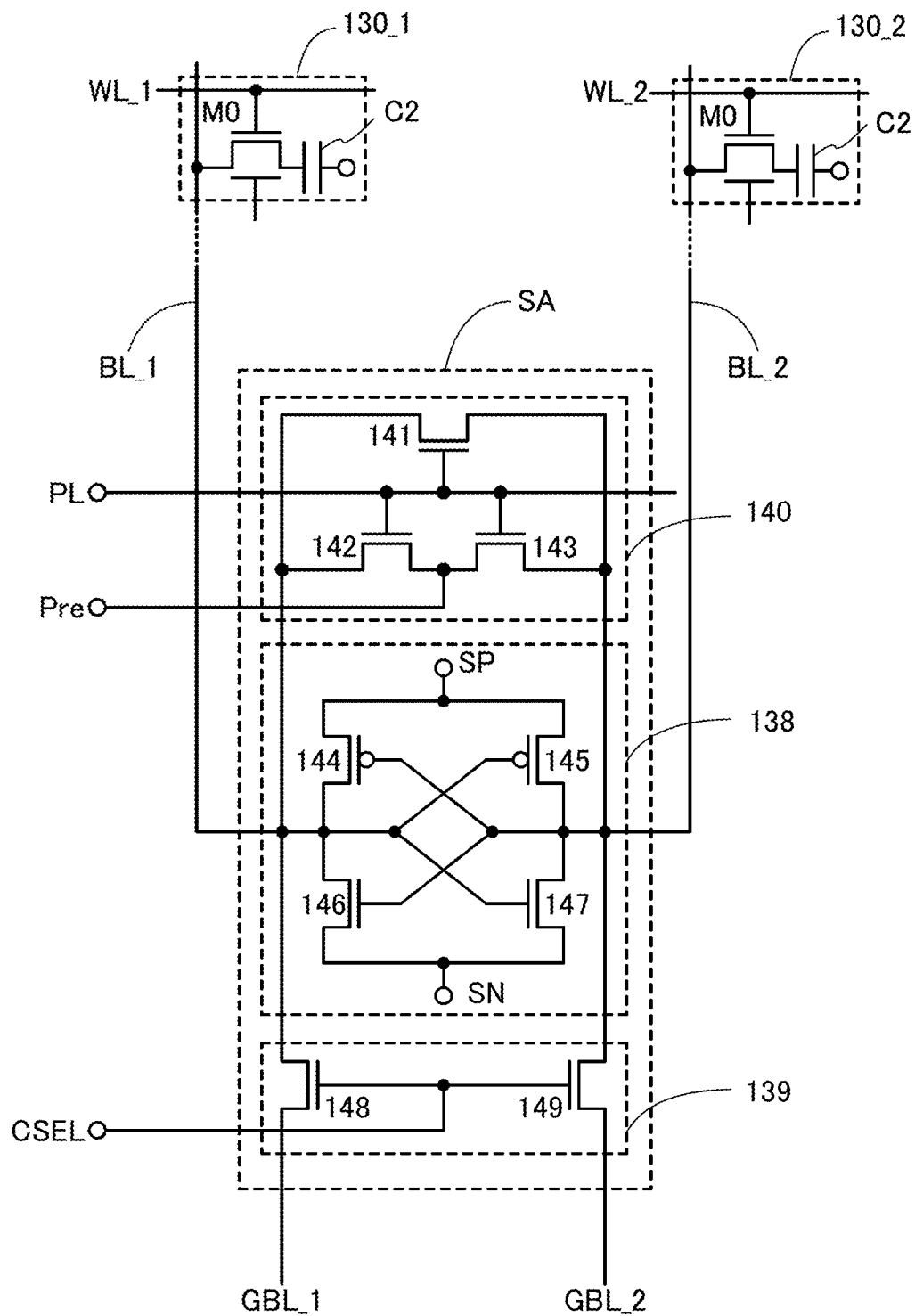
FIG. 16 is a circuit diagram illustrating a structure example of a sense amplifier.

A specific structural example of the sense amplifier SA is described. FIG. 16 illustrates an example of a circuit structure of the memory cells 130 and the sense amplifier SA electrically connected to the memory cells 130. The memory cells 130 are connected to the sense amplifier SA through the wirings BL. In the example shown here, a memory cell 130_1 is connected to the sense amplifier SA through a wiring BL_1, and a memory cell 130_2 is connected to the sense amplifier SA through the wiring BL_2.

In the example of FIG. 16, one memory cell 130 is connected to one wiring BL; however, a plurality of memory cells 130 may be connected to one wiring BL.

The sense amplifier SA includes an amplifier circuit 138, a switch circuit 139, and a precharge circuit 140.

The amplifier circuit 138 includes p-channel transistors 144 and 145 and n-channel transistors 146 and 147. One of a source and a drain of the transistor 144 is connected to a wiring SP, and the other thereof is connected to a gate of the transistor 145, a gate of the transistor 147, and the wiring BL_1. One of a source and a drain of the transistor 146 is connected to the gate of the transistor 145, the gate of the transistor 147, and the wiring BL_1, and the other thereof is connected to a wiring SN. One of a source and a drain of the transistor 145 is connected to the wiring SP, and the other thereof is connected to a gate of the transistor 144, a gate of the transistor 146, and a wiring BL_2. One of a source and a drain of the transistor 147 is connected to the gate of the transistor 144, the gate of the transistor 146, and the wiring BL_2, and the other thereof is connected to the wiring SN. The amplifier circuit 138 has a function of amplifying the potential of the wiring BL_1 and the potential of the wiring BL_2. In FIG. 16, the sense amplifier SA including the amplifier circuit 138 functions as a latch sense amplifier.

The switch circuit 139 includes n-channel transistors 148 and 149. The transistors 148 and 149 may be p-channel transistors. One of a source and a drain of the transistor 148 is connected to the wiring BL_1, and the other thereof is connected to a wiring GBL_1. One of a source and a drain of the transistor 149 is connected to the wiring BL_2, and the other thereof is connected to a wiring GBL_2. Gates of the transistor 148 and the transistor 149 are connected to wiring CSEL. The switch circuit 139 has a function of controlling electrical connection between the wiring BL_1 and the wiring GBL_1 and electrical connection between the wiring BL_2 and the wiring GBL_2 on the basis of a potential supplied to the wiring CSEL.

The precharge circuit 140 includes n-channel transistors 141, 142, and 143. The transistors 141 to 143 may be p-channel transistors. One of a source and a drain of the transistor 142 is connected to the wiring BL_1, and the other thereof is connected to a wiring Pre. One of a source and a drain of the transistor 143 is connected to the wiring BL_2, and the other thereof is connected to the wiring Pre. One of a source and a drain of the transistor 141 is connected to the wiring BL_1, and the other thereof is connected to the wiring BL_2. A gate of the transistor 142, a gate of the transistor 143, and a gate of the transistor 141 are connected to a wiring PL. The precharge circuit 140 has a function of initializing the potentials of the wiring BL_1 and the wiring BL_2.

Next, operation examples of the memory cells 130 and the sense amplifier SA illustrated in FIG. 16 in data reading will be described with reference to a timing chart of FIG. 17.

First, in the period T1, the transistors 141 to 143 included in the precharge circuit 140 are turned on, so that the potentials of the wirings BL_1 and BL_2 are initialized. Specifically, a high-level potential VH_PL is supplied to the wiring PL, whereby the transistors 141 to 143 in the precharge circuit 140 are turned on. Accordingly, a potential Vpre of the wiring Pre is supplied to the wirings BL_1 and BL_2. Note that the potential Vpre can be, for example, (VH_SP+VL_SN)/2.

Note that in the period T1, a low-level potential VL_CSEL is supplied to the wiring CSEL, and accordingly, the transistors 148 and 149 in the switch circuit 139 are off. A low-level potential VL_WL is supplied to the wiring WL_1, and accordingly, the transistor M0 in the memory cell 130_1 is off. The low-level potential VL_WL is also supplied to the wiring WL_2, and accordingly, the transistor M0 in the memory cell 130_2 is off (not shown in FIG. 17). The potential Vpre is supplied to the wirings SP and SN, and accordingly, the amplifier circuit 138 is off.

Then, a low-level potential VL_PL is supplied to the wiring PL to turn off the transistors 141 to 143 in the precharge circuit 140. In a period T2, the wiring WL_1 is selected. Specifically, in FIG. 17, a high-level potential VH_WL is supplied to the wiring WL_1 to select the wiring WL_1 and turn on the transistor M0 in the memory cell 130_1. With the above structure, the wiring BL_1 and the capacitor C2 are thus electrically connected to each other through the transistor M0. Since the wiring BL_1 and the capacitor C2 are electrically connected to each other, the potential of the wiring BL_1 changes according to the amount of charge held in the capacitor C2.

Figure 17:
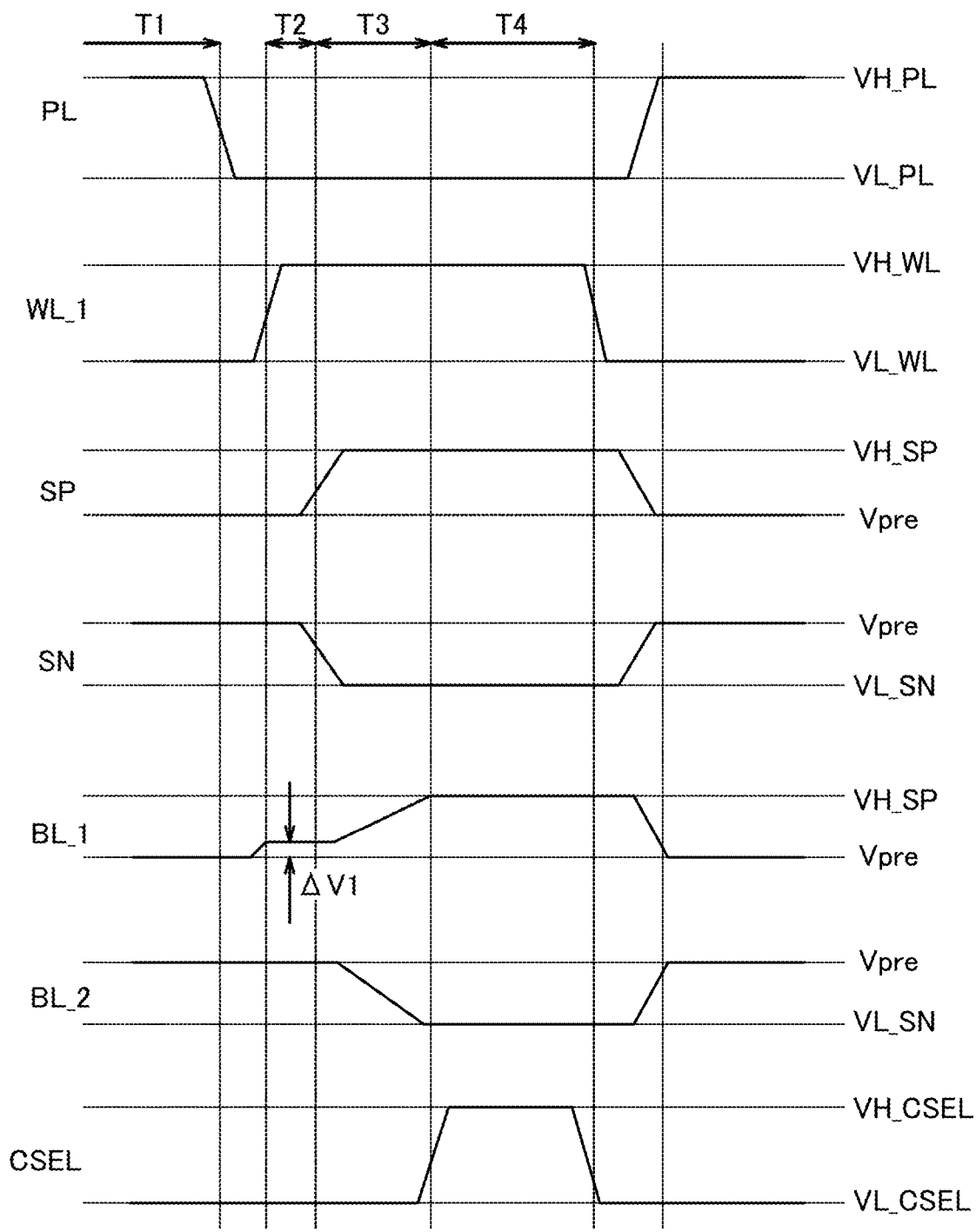
FIG. 17 is a timing chart showing an operation example of a sense amplifier.

The timing chart in FIG. 17 shows, as an example, the case where the amount of charge accumulated in the capacitor C2 is large. Specifically, in the case where the amount of charge accumulated in the capacitor C2 is large, charge is released from the capacitor C2 to the wiring BL_1, so that the potential of the wiring BL_1 rises from the potential Vpre by ΔV1. In the case where the amount of charge accumulated in the capacitor C2 is small, charge flows from the wiring BL_1 into the capacitor C2, so that the potential of the wiring BL_1 falls by ΔV2.

Note that in the period T2, the low-level potential VL_CSEL is kept applied to the wiring CSEL, and thus the transistors 148 and 149 in the switch circuit 139 remain off. The potential Vpre is kept applied to the wirings SP and SN, and thus the sense amplifier SA remains off.

In a period T3, the high-level potential VH_SP is applied to the wiring SP and the low-level potential VL_SN is applied to the wiring SN, whereby the amplifier circuit 138 is turned on. The amplifier circuit 138 has a function of amplifying the potential difference between the wirings BL_1 and BL_2 (ΔV1 in FIG. 17). Accordingly, in the timing chart in FIG. 17, the amplifier circuit 138 is turned on, whereby the potential of the wiring BL_1 rises from the potential Vpre+ΔV1 to approach the potential VH_SP of the wiring SP. The potential of the wiring BL_2 falls from the potential Vpre to approach the potential VL_SN of the wiring SN.

Note that in the case where the potential of the wiring BL_1 is Vpre−ΔV2 at the beginning of the period T3, the amplifier circuit 138 is turned on, whereby the potential of the wiring BL_1 falls from the potential Vpre−ΔV2 to approach the potential VL_SN of the wiring SN. The potential of the wiring BL_2 rises from the potential Vpre to approach the potential VH_SP of the wiring SP.

In the period T3, the low-level potential VL_PL is kept applied to the wiring PL to keep the transistors 141 to 143 in the precharge circuit 140 off. The low-level potential VL_CSEL is kept applied to the wiring CSEL, thereby keeping the transistors 148 and 149 in the switch circuit 139 off. The high-level potential VH_WL is kept applied to the wiring WL_1; thus, the transistor M0 in the memory cell 130_1 remains on. Consequently, charge corresponding to the potential VH_SP of the wiring BL_1 is accumulated in the capacitor C2 in the memory cell 130_1.

Next, in a period T4, the potential supplied to the wiring CSEL is changed to turn on the switch circuit 139. Specifically, in FIG. 17, a high-level potential VH_CSEL is applied to the wiring CSEL, so that the transistors 148 and 149 in the switch circuit 139 are turned on. Accordingly, the potential of the wiring BL_1 is supplied to the wiring GBL_1, and the potential of the wiring BL_2 is supplied to the wiring GBL_2.

In the period T4, the low-level potential VL_PL is still supplied to the wiring PL, so that the transistors 141 to 143 in the precharge circuit 140 remain off. The high-level potential VH_WL is kept supplied to the wiring WL_1; thus, the transistor M0 in the memory cell 130_1 remains on. The high-level potential VH_SP is kept supplied to the wiring SP and the low-level potential VL_SP is kept supplied to the wiring SN; thus, the amplifier circuit 138 remains on. As a result, charge corresponding to the potential VH_SP of the wiring BL_1 is accumulated in the capacitor C2 in the memory cell 130_1.

When the period T4 is over, the potential supplied to the wiring CSEL is changed to turn off the switch circuit 139. Specifically, in FIG. 17, the low-level potential VL_CSEL is supplied to the wiring CSEL, so that the transistors 148 and 149 in the switch circuit 139 are turned off.

Furthermore, when the period T4 is over, the wiring WL_1 is deselected. Specifically, in FIG. 17, the low-level potential VL_WL is supplied to the wiring WL_1, whereby the wiring WL_1 is deselected to turn off the transistor M0 in the memory cell 130_1. Through the operation, charge corresponding to the potential VH_SP of the wiring BL_1 is held in the capacitor C2; thus, data is held in the memory cell 130_1 even after the data is read out.

Through the operation in the periods T1 to T4, data is read from the memory cell 130_1. Data in the memory cell 130_2 can be read similarly.

Note that data can be written to the memory cell 130 on the basis of the above principle. Specifically, as in the case where data is read, first, the transistors 141 to 143 in the precharge circuit 140 are temporarily turned on to initialize the potentials of the wirings BL_1 and BL_2. Then, the wiring WL_1 connected to the memory cell 130_1 to which data is to be written or the wiring WL_2 connected to the memory cell 1302 to which data is to be written is selected to turn on the transistor M0 in the memory cell 130_1 or 130_2. The wiring BL_1 or BL_2 and the capacitor C2 are thus electrically connected to each other through the transistor M0. Then, the high-level potential VH_SP is supplied to the wiring SP and the low-level potential VL_SN is supplied to the wiring SN to turn on the amplifier circuit 138. The potential supplied to the wiring CSEL is then changed to turn on the switch circuit 139. Specifically, the high-level potential VH_CSEL is supplied to the wiring CSEL, so that the transistors 148 and 149 in the switch circuit 139 are turned on. Consequently, the wirings BL_1 and GBL_1 are electrically connected to each other and the wirings BL_2 and GBL_2 are electrically connected to each other. Writing potentials are supplied to the wirings GBL_1 and GBL_2, whereby the writing potentials are supplied to the wirings BL_1 and BL_2 through the switch circuit 139. Consequently, charge is accumulated in the capacitor C2 according to the potential of the wiring BL_1 or BL_2 and thus data is written to the memory cell 130_1 or 130_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 138 as long as the sense amplifier SA is on even after the transistors 148 and 149 in the switch circuit 139 are turned off. Therefore, the timing of turning off the transistors 148 and 149 in the switch circuit 139 may be either before or after the wiring WL_1 is selected.

<<SRAM>>

Next, an example in which the circuit 10 is used for Static Random Access Memory (SRAM) is described.

[Memory Cell 150]

Figure 18:
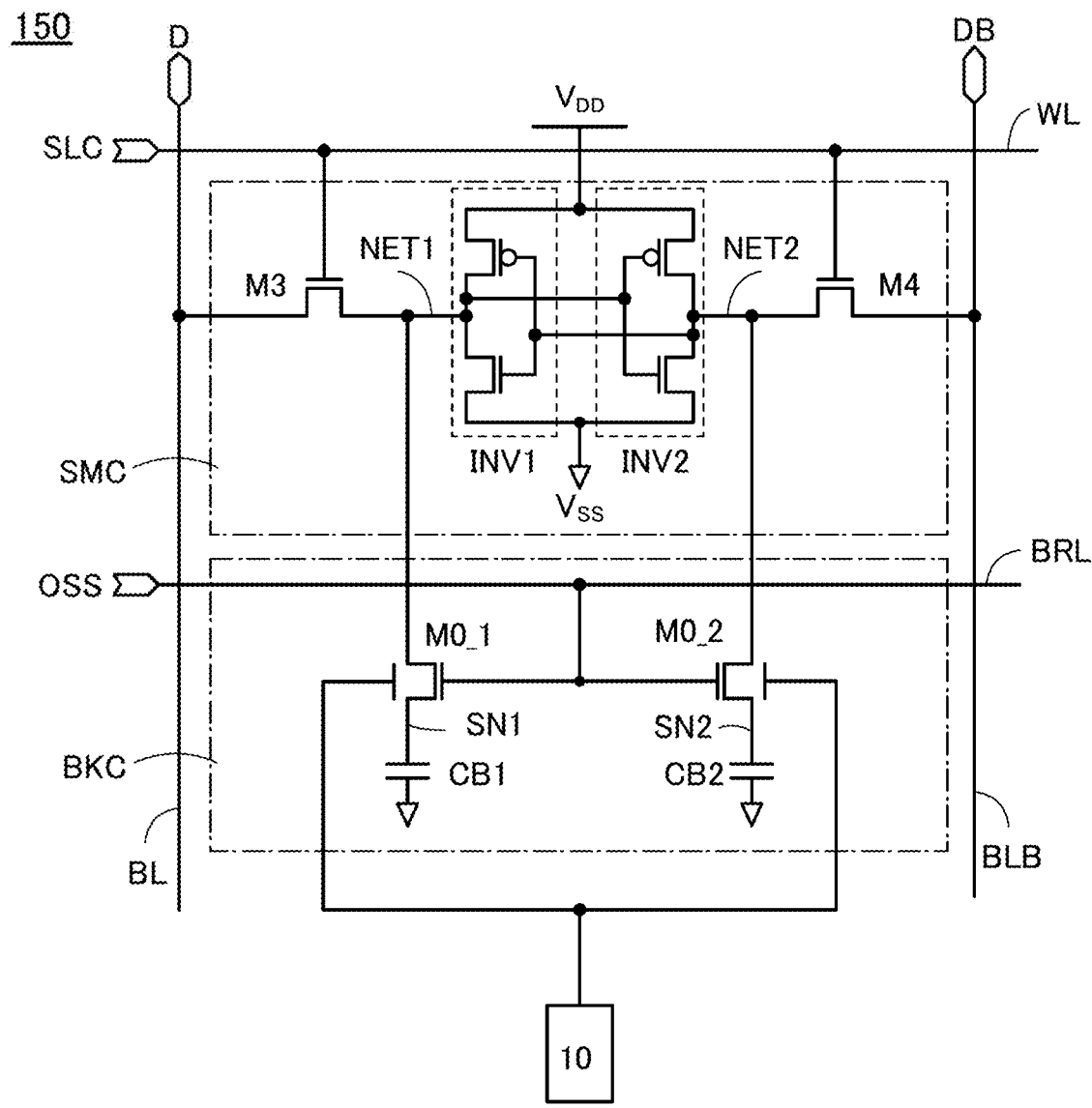
FIG. 18 is a circuit diagram illustrating a structure example of a SRAM.

A memory cell 150 in FIG. 18 includes a circuit SMC and a circuit BKC. The circuit SMC may have a circuit structure similar to that of a standard SRAM memory cell. The circuit SMC in FIG. 18 includes an inverter INV1, an inverter INV2, a transistor M3, and a transistor M4.

The circuit BKC functions as a backup circuit of the circuit SMC. The circuit BKC includes a transistor M0_1, a transistor M0_2, a capacitor CB1, and a capacitor CB2.

Note that as each of the transistors M0_1 and M0_2, a transistor with a low cutoff current is preferably used. As each of the transistors M0_1 and M0_2, an OS transistor or a transistor including a wide-bandgap semiconductor in a channel formation region is preferably used.

The circuit BKC includes a holding circuit including the transistor M0_1 and the capacitor CB1 and a holding circuit including the transistor M0_2 and the capacitor CB2. Data is held in a node SN1 and a node SN2 in the holding circuits. The holding circuit including the transistor M0_1 and the capacitor CB1 is capable of backing up data of a node NET1. The holding circuit including the transistor M0_2 and the capacitor CB2 is capable of backing up data of a node NET2.

Power supply potentials $V_{DD}$ and $V_{SS}$ are supplied to the memory cell 150. The memory cell 150 is electrically connected to wirings WL, BL, BLB, and BRL. A signal SLC is input to the wiring WL. A data signal D and a data signal DB are input to the wiring BL and the wiring BLB at the time of data writing. Data is read by detecting the potentials of the wiring BL and the wiring BLB. A signal OSS is input to the wiring BRL.

Operation of the memory cell 150 is described.

[Data Backup]

First, when the signal OSS is set to H level, the transistors M0_1 and M0_2 are turned on and the nodes SN1 and SN2 have the same potential levels as the nodes NET1 and NET2. That is, data in the nodes NET1 and NET2 are written to the nodes SN1 and SN2, respectively.

Then, the signal OSS is set to L level, so that the transistors M0_1 and M0_2 are turned off and data backup operation is terminated. Since the cutoff current of the transistors M0_1 and M0_2 is low, electric charge written to the nodes SN1 and SN2 are held for a long time.

[Power Off]

Then, power of the memory cell 150 is turned off. The circuit BKC keeps data even after the power is turned off.

[Data Restoring]

Power of the memory cell 150 is turned on again to set the signal OSS to H level, whereby the data stored in the circuit BKC can be written back to the circuit SMC. That is, the memory cell 150 can be restored to the state immediately before the power is stopped.

As described above, the memory cell 150 can hold the data for a long time even when power is turned off. Thus, in the semiconductor device including the memory cell 150, power is positively turned off, so that power consumption can be reduced. For example, the memory cell 150 is used as a cache memory of a central processing unit (CPU), so that power consumption of the CPU can be reduced.

By the circuit 10, a negative potential can be applied to the second gates of the transistors M0_1 and M0_2 and can be continuously held. By the circuit 10 in the memory cell 150, the cutoff current of each of the transistors M0_1 and M0_2 can be lowered, thus, data retention characteristics can be improved. As a result, power can be turned off for a longer time in the memory cell 150, and more power can be saved.

<<Power Supply Circuit>>

A power supply circuit used for a circuit including the above nonvolatile memory, DRAM, or SRAM, is described.

Figure 19:
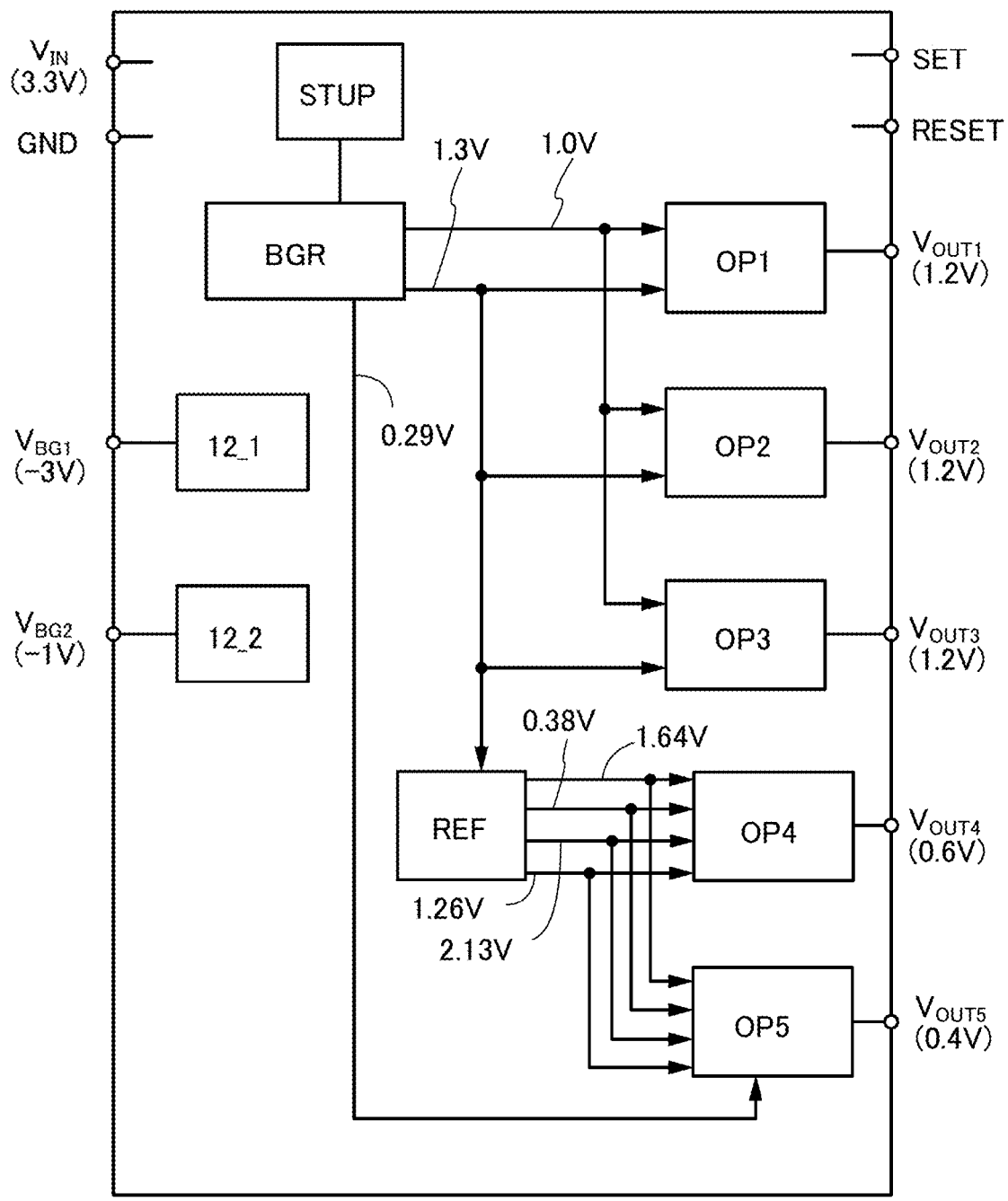
FIG. 19 is a circuit block diagram illustrating a structure example of a power supply circuit.

FIG. 19 is a block diagram of a power supply circuit 160. The power supply circuit 160 includes a circuit STUP, a circuit BGR, a circuit REF, a circuit OP1, a circuit OP2, a circuit OP3, a circuit OP4, a circuit OP5, a circuit 12_1, and a circuit 12_2.

In the power supply circuit 160, a voltage needed for each circuit is generated from a voltage $V_{IN}$ (e.g., 3.3 V) and is supplied to each circuit.

The voltage $V_{IN}$ and GND are supplied to all the circuits in FIG. 19.

Furthermore, a signal SET and a signal RESET are input to each circuit in the power supply circuit 160. The signal SET is a signal for starting up each circuit, and the signal RESET is a signal for initializing each signal.

The circuit STUP is a startup circuit and has a function of generating a voltage to be supplied to the circuit BGR from the voltage $V_{IN}$.

The circuit BGR is a band gap reference circuit, and has a function of generating a plurality of voltages from the voltage $V_{IN}$ and supplying the voltages to the circuits OP1 to OP3, the circuit OP5, and the circuit REF. For example, the circuit BGR has a function of supplying a voltage of 1.0 V to the circuits OP1 to OP3. Alternatively, for example, the circuit BGR has a function of supplying a voltage of 1.3 V to the circuits OP1 to OP3 and the circuit REF. Alternatively, for example, the circuit BGR has a function of supplying a voltage of 0.29 V to the circuit OP5.

The circuit REF is a reference voltage generation circuit, which has a function of supplying a voltage to the circuits OP4 and OP5. For example, the circuit REF has a function of supplying a voltage of 1.64 V, 0.38 V, 2.13 V, or 1.26 V to the circuits OP4 and OP5.

The circuit OP1 is an operational amplifier, which has a function of supplying a voltage $V_{out1}$ (e.g., 1.2 V). The voltage $V_{out1}$ functions as a power supply voltage that operates a logic circuit such as a CPU.

The circuit OP2 is an operational amplifier, which has a function of supplying a voltage $V_{out2}$ (e.g., 1.2 V). The voltage $V_{out2}$ functions as a power supply voltage that operates a decoder of the above memory device 110 or a peripheral circuit of the above memory device 131.

The circuit OP3 is an operational amplifier, which has a function of supplying a voltage $V_{out3}$ (e.g., 1.2 V). The voltage $V_{out3}$ functions as a voltage to be supplied to the wiring SL of the above memory device 110.

The circuit OP4 is an operational amplifier, which has a function of supplying a voltage $V_{out4}$ (e.g., 0.6 V). The voltage $V_{out4}$ functions as a precharge voltage (Vpre) of the wiring BL in the memory device 131.

The circuit OP5 is an operational amplifier, which has a function of supplying a voltage $V_{out5}$ (e.g., 0.4 V). The voltage $V_{out5}$ functions as a reference voltage (Vref) in the above reading circuit 121.

The structure of the power supply circuit 160 is not limited to that shown in FIG. 19. A larger or smaller number of operational amplifiers may be provided as necessary.

The circuit 12_1 is a charge pump circuit, which corresponds to the voltage generation circuit 12 in Embodiment 1. The circuit 12_1 has a function of supplying a voltage $V_{BG1}$ (e.g., −3 V). The voltage $V_{BG1}$ is applied to the second gates of the transistors M0, M0_1, and M0_2.

The circuit 12_2 is a charge pump circuit, which corresponds to the voltage generation circuit 12 described in Embodiment 1. The circuit 12_2 has a function of supplying a voltage $V_{BG2}$ (e.g., −1 V). The voltage $V_{BG2}$ is applied to a second gate of a transistor used in a logic circuit, or a second gate of a transistor used in a peripheral circuit or the like of the memory device.

The power supply circuit 160 has a function of generating a negative voltage that is different from the voltage $V_{BG1}$ and the voltage $V_{BG2}$. In the case of $V_{BG}<V_{BG2}$, the voltage $V_{BG1}$ is preferably applied to a second gate of a transistor that needs a low cutoff current, such as a transistor in the memory cell. Meanwhile, the voltage $V_{BG2}$ is preferably applied to a second gate of a transistor that needs a high on-state current, such as a transistor in a logic circuit or a peripheral circuit of the memory device. In such a manner, a voltage to be applied to the second gate is changed depending on the characteristics needed for the transistor, so that the semiconductor device including the power supply circuit 160 can operate at high speed with low power consumption.

The nonvolatile memory, the DRAM, the SRAM, the CPU, the power supply circuit, and the like which are described above are preferably provided in one IC chip. By provision of these circuits in one IC chip, access speed of the circuits can be improved.

<<Display Device>>

Figure 20A:
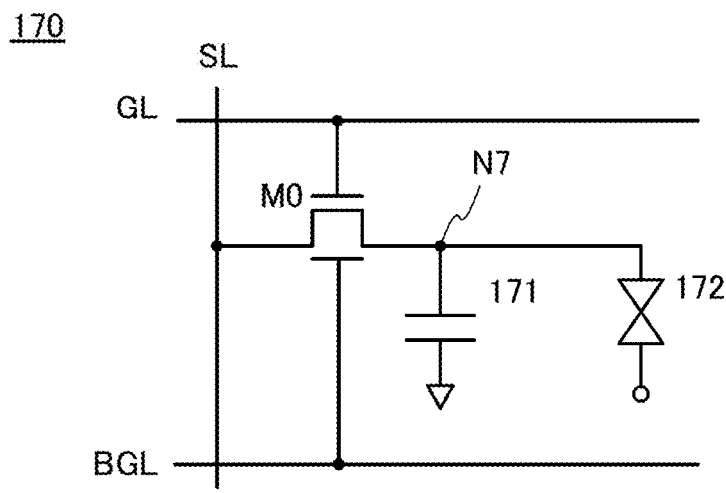
FIGS. 20A and 20B are circuit diagrams each illustrating a structure example of a display device.
Figure 20B:
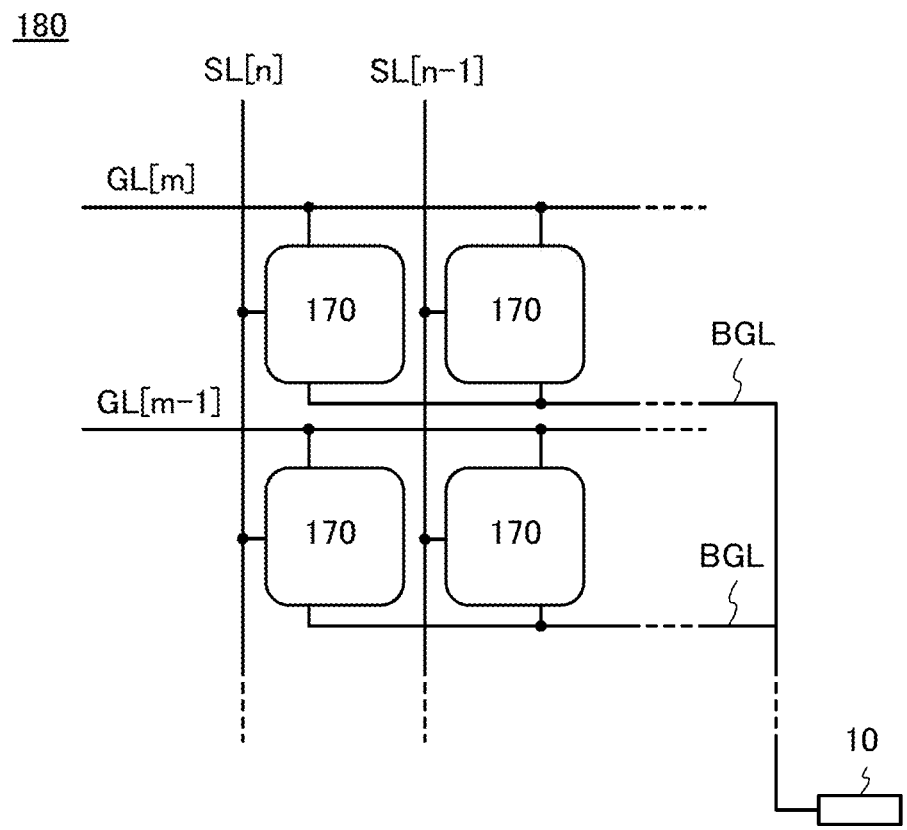

FIGS. 20A and 20B each illustrate an example in which the circuit 10 described in Embodiment 1 is used in a display device.

FIG. 20A illustrates a structure example of a pixel 170 that can be used in the display device. The pixel 170 includes the transistor M0 including the first and second gates, a capacitor 171, a display element 172, a node N7, a wiring GL, the wiring SL, and a wiring BGL.

The first gate of the transistor M0 is electrically connected to the wiring GL; the second gate of the transistor M0 is electrically connected to the wiring BGL; one of the source and the drain of the transistor M0 is electrically connected to the wiring SL; and the other of the source and the drain of the transistor M0 is electrically connected to the node N7.

A first terminal of the capacitor 171 is electrically connected to the node N7, and a constant low potential is applied to a second terminal of the capacitor 171.

The capacitor 171 may be provided as needed. In the case where parasitic capacitance of an electrode, a wiring, or the like can be used as capacitance needed to drive the pixel 170, the capacitor 171 may be omitted.

The transistor M0 preferably has a low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An OS transistor can be used as a transistor having a low off-state current.

A first terminal of the display element 172 is electrically connected to the node N7, and a constant low potential is applied to a second terminal of the display element 172. The ground potential may be applied as the low potential. A dielectric element whose optical characteristics are changed when a voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying a voltage applied to the display element 172 through the transistor M0.

Since the off-state current of the transistor M0 is extremely low, when the transistor M0 is turned off, the node N7 can hold a voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of a power supply voltage is stopped. For example, even in the case where a liquid crystal element that cannot store data, such as a twisted nematic (TN) liquid crystal, is used, the element can be always maintained in a state in which a voltage is applied. Consequently, it is possible to exclude rewrite operation or it is possible to reduce the frequency of rewrite operation markedly.

FIG. 20B illustrates the circuit structure of a display device 180 including the pixels 170 arranged in a matrix and the circuit 10 described in Embodiment 1.

The display device 180 includes the pixels 170 arranged in a matrix of m rows and n columns. The pixels 170 provided in the m-th row are electrically connected to a wiring GL[m], and the pixels 170 provided in the n-th column are electrically connected to a wiring SL[n].

The second gates of the transistors M0 included in the pixels 170 are electrically connected to the circuit 10 through the wirings BGL. In other words, the circuit 10 has a function of controlling the second gates of the transistors M0 included in all the pixels.

When the circuit 10 controls the second gate of the transistor M0, the transistor M0 can have appropriate $V_{th}$ and can be prevented from being normally-on. Consequently, the off-state current of the transistor M0 can be reduced, and the transistor M0 can hold charge given to the node N7.

The circuit 10 can control and hold $V_{th}$ of the transistors M0 in the pixels 170 connected to the circuit 10 at optimal levels and can temporarily change the $V_{th}$ so that the transistors M0 are set as normally-on transistors. When m×n transistors connected to the circuit 10 are temporarily changed into normally-on transistors, a voltage (i.e., display images) stored in the pixels can be refreshed at the same time by one signal.

When the display device 180 has such a structure, it is possible to provide a display device capable of operating with low power consumption and low rewrite frequency. In addition, it is possible to obtain a display device including a plurality of pixels that can easily perform refresh operation. Furthermore, it is possible to obtain a display device capable of displaying an image even when supply of power is stopped.

Embodiment 3

In this embodiment, structures of the OS transistor used in the above embodiment is described.
<Oxide Semiconductor>

First, an oxide semiconductor used for the OS transistor is described.

An oxide semiconductor preferably contains at least indium or zinc. In particular, indium and zinc are preferably contained. Here, the case where an oxide semiconductor contains indium, an element M, and zinc is considered.

First, preferred ranges of the atomic ratio of indium, the element M, and zinc contained in an oxide semiconductor according to the present invention are described with reference to FIGS. 21A to 21C. Note that the proportion of oxygen atoms is not shown in FIGS. 21A to 21C. The terms of the atomic ratio of indium, the element M, and zinc contained in the oxide semiconductor are denoted by [In], [M], and [Zn], respectively.

Figure 21A:
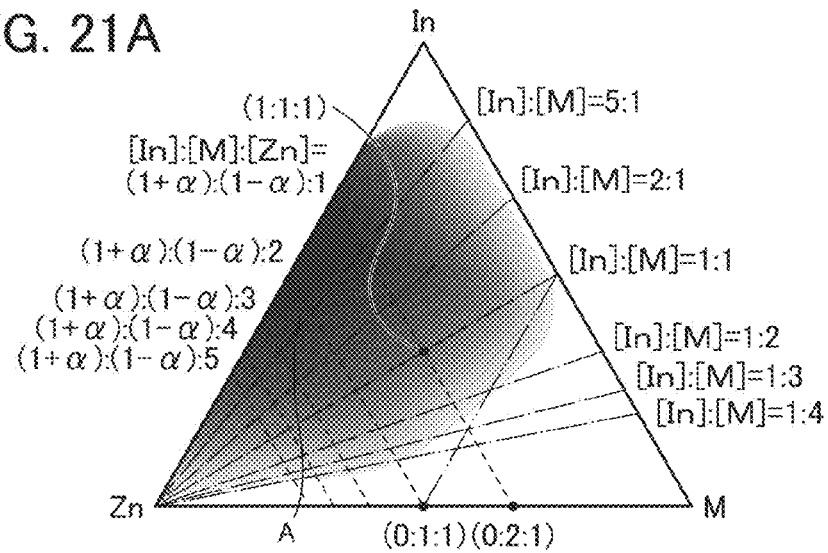
FIGS. 21A to 21C each show the range of the atomic ratio of an oxide semiconductor.
Figure 21B:
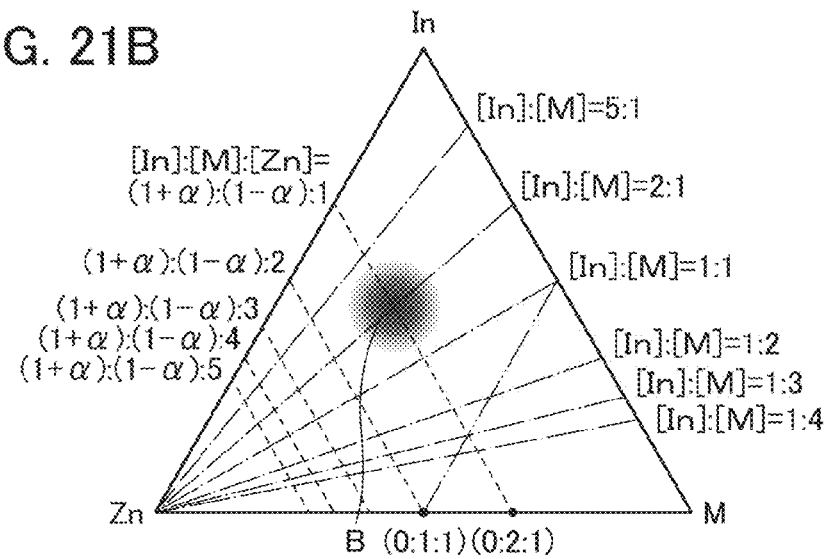
Figure 21C:
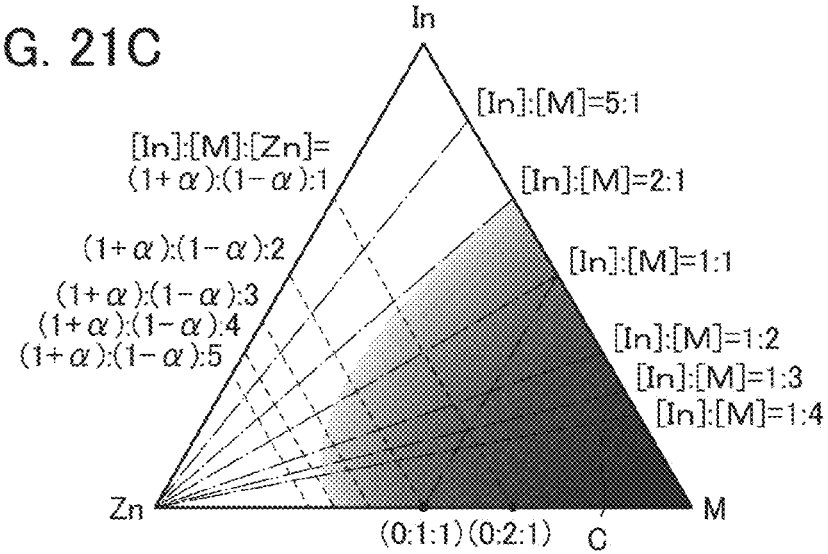

In FIGS. 21A to 21C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$, where $-1 \le \gamma \le 1$. An oxide semiconductor having the atomic ratio of [In]:[M]:[Zn]=0:2:1 or a neighborhood thereof in FIGS. 21A to 21C tends to have a spinel crystal structure.

FIGS. 21A and 21B illustrate examples of the preferred ranges of the atomic ratio of indium, the element M, and zinc contained in an oxide semiconductor in one embodiment of the present invention.

Figure 22:
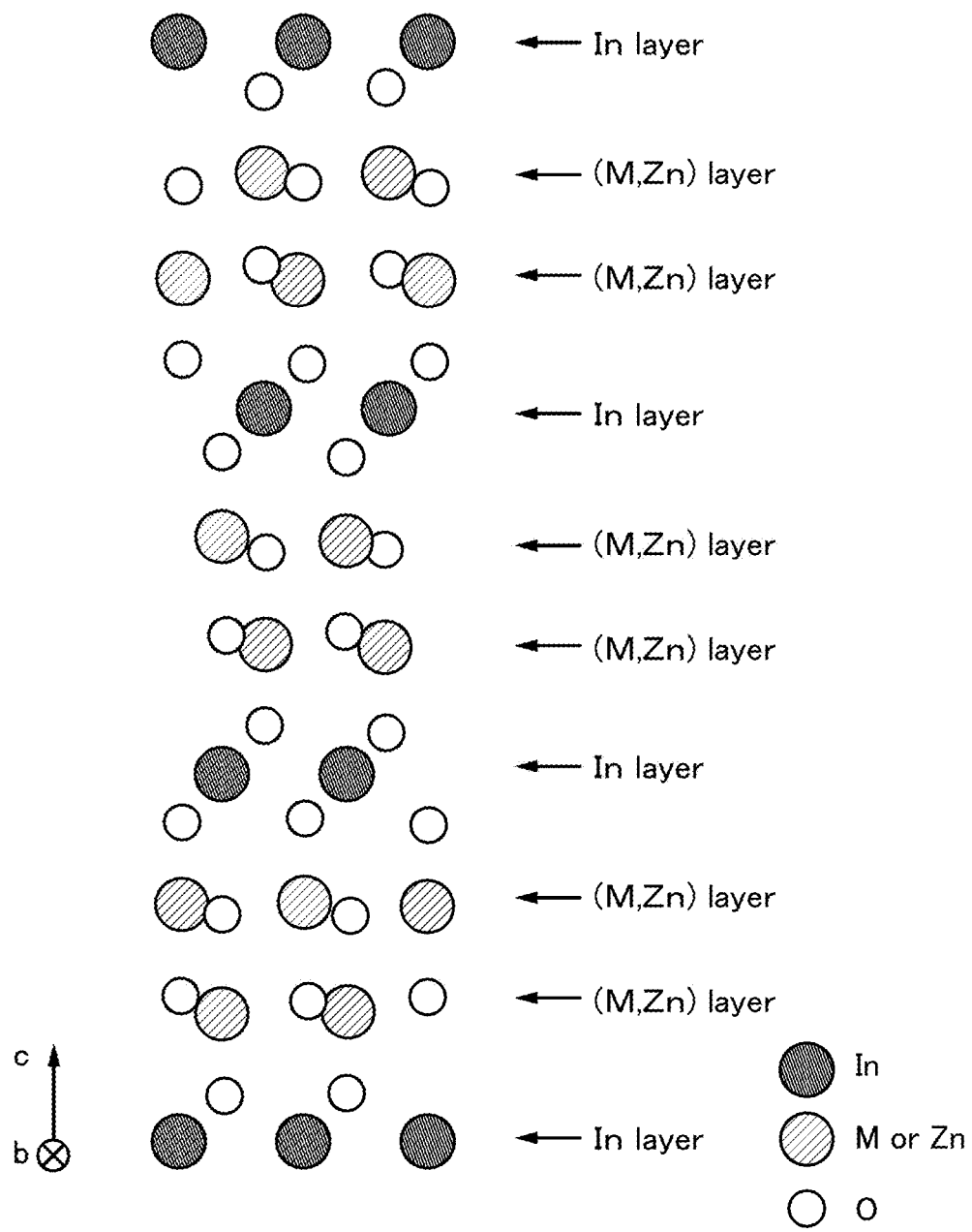
FIG. 22 illustrates a crystal of $InMZnO_4$.

FIG. 22 illustrates an example of the crystal structure of $InMZnO_4$ with an atomic ratio [In]:[M]:[Zn] of 1:1:1. The crystal structure illustrated in FIG. 22 is $InMZnO_4$ observed from a direction parallel to the b-axis. Note that a metal element in a layer that contains M, Zn, and oxygen (hereinafter this layer is referred to as "(M,Zn) layer") in FIG. 22 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 22.

Indium and the element M can be replaced with each other. Accordingly, when the element M in the (M, Zn) layer is replaced by indium, the layer can also be referred to as an (In, M, Zn) layer. In that case, a layered structure that includes two (In, M, Zn) layers with respect to one In layer is obtained.

An oxide semiconductor with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor may have a mix of a layered structure including one In layer for every two (M,Zn) layers and a layered structure including one In layer for every three (M,Zn) layers.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. In addition, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 21C), insulation performance becomes better.

Accordingly, an oxide semiconductor in one embodiment of the present invention preferably has an atomic ratio represented by a region A in FIG. 21A. With this atomic ratio, a layered structure with high carrier mobility and a few grain boundaries is easily obtained.

A region B in FIG. 21B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions in FIGS. 21A to 21C each represent an atomic ratio with which an oxide semiconductor has a layered structure, and boundaries of the regions A to C are not clear.

<Transistor Structure 1>

Figure 23A:
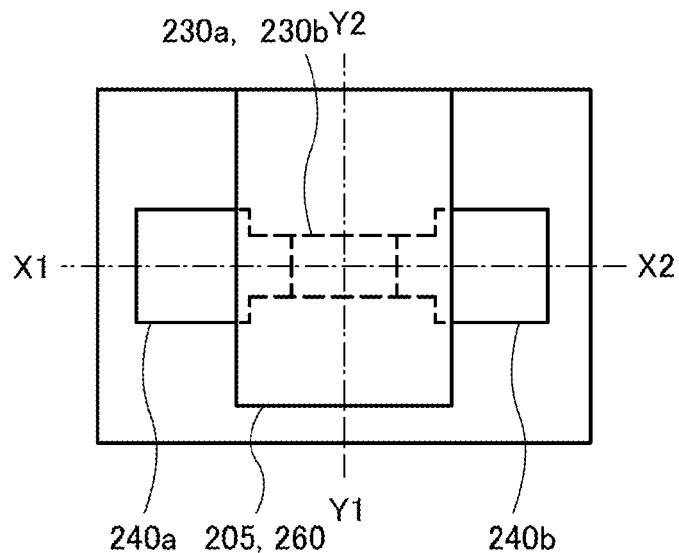
FIGS. 23A to 23C are a top view and cross-sectional views illustrating a structure example of a transistor.
Figure 23B:
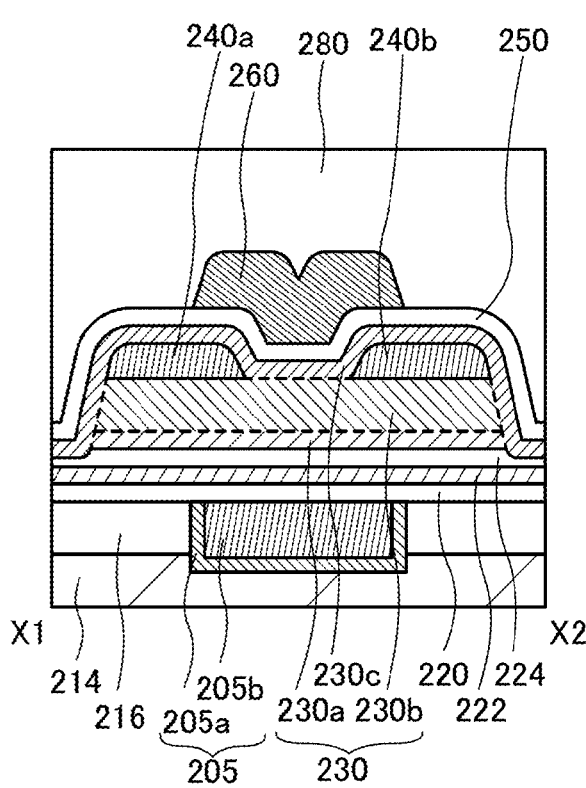
Figure 23C:
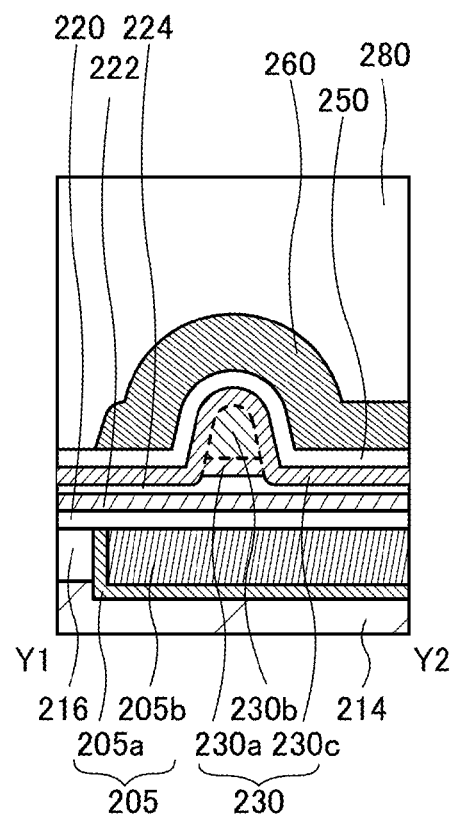

FIGS. 23A to 23C are a top view and cross-sectional views which illustrate the transistor 200. FIG. 23A is the top view. FIG. 23B is the cross-sectional view taken along dashed-dotted line X1-X2 in FIG. 23A. FIG. 23C is the cross-sectional view taken along dashed-dotted line Y1-Y2 in FIG. 23A. Note that for simplification of the drawing, some components are not illustrated in the top view in FIG. 23A.

FIGS. 23B and 23C illustrate an example in which the transistor 200 is provided over the insulator 214 and the insulator 216.

The transistor 200 includes a conductor 205 (conductors 205a and 205b) and a conductor 260 that function as gate electrodes; an insulator 220, an insulator 222, an insulator 224, and an insulator 250 that function as gate insulating layers; an oxide semiconductor 230 (an oxide semiconductors 230a, 230b, and 230c); a conductor 240a that functions as one of a source and a drain; a conductor 240b that functions as the other of the source and the drain; and the insulator 280 that includes excess oxygen The oxide semiconductor 230 includes the oxide semiconductor 230a, the oxide semiconductor 230b over the oxide semiconductor 230a, and the oxide semiconductor 230c over the oxide semiconductor 230b. When the transistor 200 is turned on, a current flows mainly in the oxide semiconductor 230b. That is, the oxide semiconductor 230b functions as a channel formation region. Meanwhile, although a current sometimes flows through regions in the vicinity of the interfaces (mixed regions in some cases) between the oxide semiconductor 230b and the oxide semiconductors 230a and 230c, the other regions of the oxide semiconductors 230a and 230c function as insulators.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide semiconductor 230 while conductivity of a wiring is ensured. A two-layer structure of the conductor 205a and the conductor 205b is shown in FIGS. 23A to 23C, but the structure of the conductor 205 is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with the oxide semiconductor in the transistor 200, oxygen vacancies in the oxide can be compensated. Note that the insulators 220 and 224 are not necessarily formed of the same material.

The insulator 222 preferably has a single-layer structure or a stacked-layer structure formed using an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, the insulator 222 can be negatively charged. That is, the insulator 222 can function as a charge accumulation layer.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, $V_{th}$ is shifted in the positive direction. By controlling the voltage of the conductor 205, the amount of electrons to be trapped can be controlled, and thus $V_{th}$ can be controlled.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

Furthermore, $V_{th}$ can be controlled by appropriate adjustment of the thicknesses of the insulator 220, the insulator 222, and the insulator 224. A transistor having a low leakage current in an off state can be provided. The insulator 220, the insulator 222, and the insulator 224 are preferably thin, in which case, $V_{th}$ can be easily controlled by the conductor 205. For example, each of the insulator 220, the insulator 222, and the insulator 224 has a thickness of 50 nm or less, preferably 30 nm or less, further preferably 10 nm or less, furthermore preferably 5 nm or less.

The oxide semiconductor 230a, the oxide semiconductor 230b, and the oxide semiconductor 230c are formed using metal oxide such as In—M-Zn oxide (M is Al, Ga, Y, or Sn). In—Ga oxide or In—Zn oxide may be used as the oxide semiconductor 230.

The energy level of the conduction band minimum of each of the oxide semiconductors 230a and 230c is closer to the vacuum level than that of the oxide semiconductor 230b. Typically, a difference in the energy level between the conduction band minimum of the oxide semiconductor 230b and the conduction band minimum of each of the oxide semiconductors 230a and 230c is preferably greater than or equal to 0.15 eV or greater than or equal to 0.5 eV, and less than or equal to 2 eV or less than or equal to 1 eV. That is, a difference in the electron affinity between each of the oxide semiconductors 230a and 230c and the oxide semiconductor 230b is preferably greater than or equal to 0.15 eV or greater than or equal to 0.5 eV, and less than or equal to 2 eV or less than or equal to 1 eV.

The energy gap of the oxide semiconductor 230b is preferably 2 eV or more, further preferably, 2.5 eV or more and 3.0 eV or less. The energy gap of each of the oxide semiconductors 230a and 230c is preferably 2 eV or more, further preferably, 2.5 eV or more, furthermore preferably 2.7 eV or more and 3.5 eV or less. The energy gap of each of the oxide semiconductors 230a and 230c is preferably greater than that of the oxide semiconductor 230b. For example, a difference in the energy gap between the oxide semiconductors 230a and 230b is preferably greater than or equal to 0.15 eV or greater than or equal to 0.5 eV, and less than or equal to 2 eV or less than or equal to 1 eV. Similarly, a difference in the energy gap between the oxide semiconductors 230c and 230b is preferably greater than or equal to 0.15 eV or greater than or equal to 0.5 eV, and less than or equal to 2 eV or less than or equal to 1 eV.

The thickness of each of the oxide semiconductors 230a, 230b, and 230c is greater than or equal to 3 nm and less than or equal to 200 nm, preferably greater than or equal to 3 nm and less than or equal to 100 nm, further preferably greater than or equal to 3 nm and less than or equal to 60 nm.

A decrease in the carrier density of the oxide semiconductor film can inhibit the negative shift of the threshold voltage of the transistor or reduce the off-state current of the transistor, which is preferable.

Examples of a factor affecting the carrier density of an oxide semiconductor include oxygen vacancy (Vo) and impurities in the oxide semiconductor. As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A state with a low impurity concentration and a low density of defect states is referred to as a highly purified intrinsic or substantially highly purified intrinsic state. A highly purified intrinsic or substantially highly purified intrinsic oxide semiconductor film has few carrier generation sources, and thus can have a low carrier density.

A highly purified intrinsic or substantially highly purified intrinsic oxide semiconductor is preferably used as each of the oxide semiconductors 230a and 230c. For example, the carrier density of each of the oxide semiconductors 230a and 230c is lower than $8\times10^{15}$ cm$^{-3}$, preferably lower than $1\times10^{11}$ cm$^{-3}$, and further preferably lower than $1\times10^{10}$ cm$^{-3}$ and higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_D$-$V_G$ characteristics of the transistor can be regarded as substantially intrinsic. Furthermore, an oxide semiconductor that has a narrow bandgap so as to increase the density of thermally excited electrons (carriers) can be regarded as a substantially intrinsic semiconductor. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of the oxide semiconductor 230b is preferably higher than those of the oxide semiconductor 230a and the oxide semiconductor 230c. The carrier density of the oxide semiconductor 230b is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The density of defect states in a mixed layer formed at an interface between the oxide semiconductors 230a and 230b or an interface between the oxide semiconductors 230b and 230c is preferably made low.

Specifically, when the oxide semiconductors 230a and 230b or the oxide semiconductors 230b and 230c contain the same element (as a main component) in addition to oxygen, a mixed layer with a low density of defect states can be formed. For example, in the case where the oxide semiconductor 230b is an In—Ga—Zn oxide semiconductor, it is preferable to use an In—Ga—Zn oxide semiconductor, a Ga—Zn oxide semiconductor, gallium oxide, or the like as each of the oxide semiconductors 230a and 230c.

At this time, the oxide semiconductor 230b serves as a main carrier path. Since the density of defect states at the interface between the oxide semiconductors 230a and 230b and the interface between the oxide semiconductors 230b and 230c can be made low, the influence of interface scattering on carrier conduction is small, and a high on-state current can be obtained.

When an electron is trapped in a trap state, the trapped electron behaves like fixed charge; thus, $V_{th}$ of the transistor is shifted in a positive direction. The oxide semiconductors 230a and 230c can make the trap state apart from the oxide semiconductor 230b. This structure can prevent the positive shift of the $V_{th}$ of the transistor.

A material whose conductivity is sufficiently lower than that of the oxide semiconductor 230b is used for the oxide semiconductors 230a and 230c. In that case, the oxide semiconductor 230b, the interface between the oxide semiconductors 230a and 230b, and the interface between the oxide semiconductors 230b and 230c mainly function as a channel region. For example, an oxide semiconductor with high insulation performance and the atomic ratio represented by the region C in FIG. 21C can be used as the oxide semiconductors 230a and 230c. Note that the region C in FIG. 21C represents the atomic ratio of [In]:[M]:[Zn]=0:1:0 or the vicinity thereof.

In the case where an oxide semiconductor with the atomic ratio represented by the region A in FIG. 21A is used as the oxide semiconductor 230b, it is particularly preferable to use an oxide semiconductor with [M]/[In] of greater than or equal to 1, preferably greater than or equal to 2, as each of the oxide semiconductors 230a and 230c. In addition, it is suitable to use an oxide semiconductor with sufficiently high insulation performance and [M]/([Zn]+[In]) of greater than or equal to 1 as the oxide semiconductor 230c.

Here, in the transistor 200 shown in FIGS. 23A to 23C and the like, the conductor 260 and the conductor 205 are referred to as a top gate and a bottom gate, in some cases. Alternatively, the conductor 260 and the conductor 205 are referred to as a front gate and a back gate, in some cases.

The oxide semiconductor 230c has lower crystallinity than the oxide semiconductor 230b in some cases. The oxide semiconductor 230b preferably includes a CAAC-OS which will be described later. The reduction in crystallinity of the oxide semiconductor 230c makes the oxide semiconductor 230c have a higher oxygen-transmitting property, leading to easy supply of oxygen from the insulator positioned above the oxide semiconductor 230c to the oxide semiconductor 230b. Here, the oxide semiconductor 230c may be an amorphous semiconductor or amorphous-like (a-like) OS described later.

The oxide semiconductor 230a may include a CAAC-OS. Furthermore, the oxide semiconductor 230a preferably has higher crystallinity than the oxide semiconductor 230c.

The insulator 250 can have a single-layer structure or a stacked-layer structure using, for example, an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film formed of aluminum oxide, aluminum oxynitride, hafnium oxide, hafnium oxynitride, silicon nitride, or the like, which has barrier properties with respect to oxygen and hydrogen, can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, V$_{th}$ of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 23A to 23C. The oxide semiconductor 230c may have a barrier property.

For example, an insulating film containing excess oxygen is provided in contact with the oxide semiconductor 230 and covered by a barrier film, whereby the composition of the oxide semiconductor can be almost the same as the stoichiometric composition or can be in a supersaturated state containing more oxygen than that in the stoichiometric composition. It is also possible to prevent entry of impurities such as hydrogen into the oxide semiconductor 230.

One of a pair of the conductor 240a and the conductor 240b functions as a source electrode, and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single layer structure is shown, a stacked-layer structure of two or more layers may be used.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure in which a titanium film is stacked over an aluminum film may be employed. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure of the above light-transmitting conductive material and the above metal.

$V_{th}$ of the transistor 200 can be increased and the cutoff current can be lowered by the use of a material with a high work function for the conductor 260. A conductive material whose work function is preferably 4.8 eV or more, further preferably 5.0 eV or more, further more preferably 5.2 eV or more, still further preferably 5.4 eV or more, yet still further preferably 5.6 eV or more is used for the conductor 260. Examples of the conductive material with a high work function include molybdenum, molybdenum oxide, platinum, platinum silicide, nickel silicide, indium tin oxide, and an In—Ga—Zn oxide to which nitrogen is added.

The insulator 280 is provided over the transistor 200. The insulator 280 preferably includes an insulator containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide material that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder.

<Transistor Structure 2>

Figure 24A:
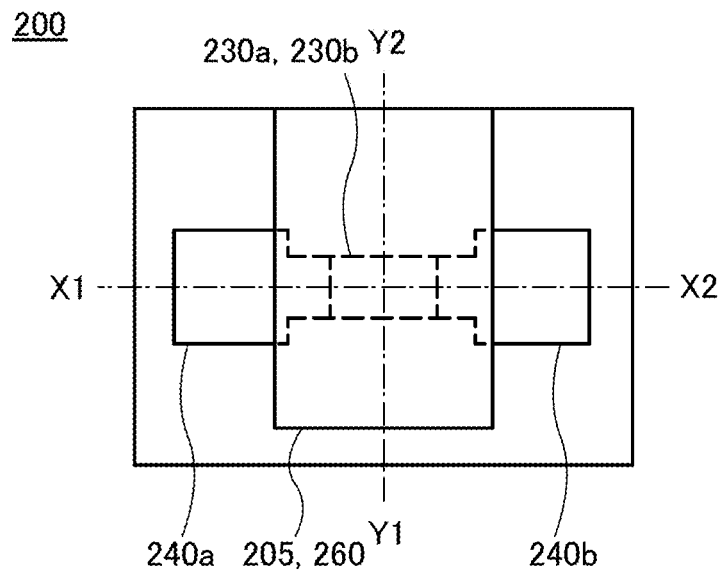
FIGS. 24A to 24C are a top view and cross-sectional views illustrating a structure example of a transistor.
Figure 24B:
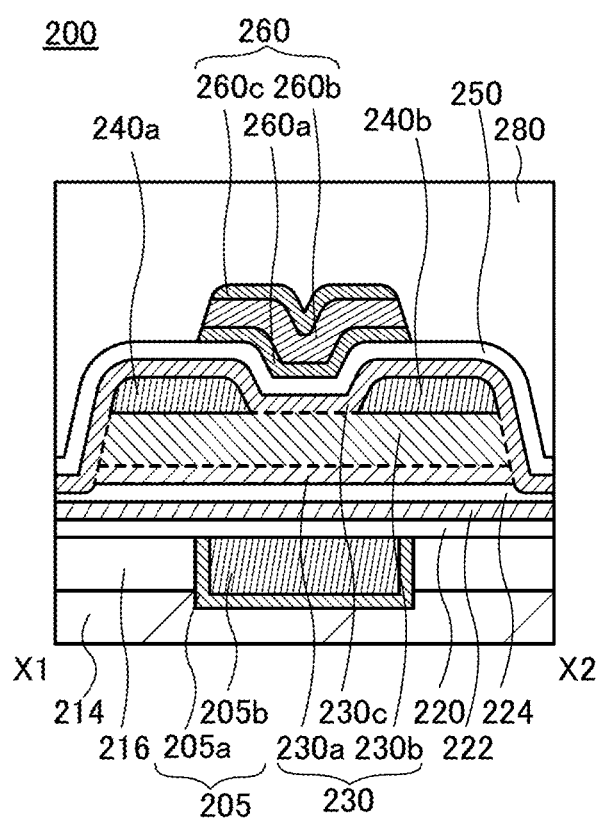
Figure 24C:
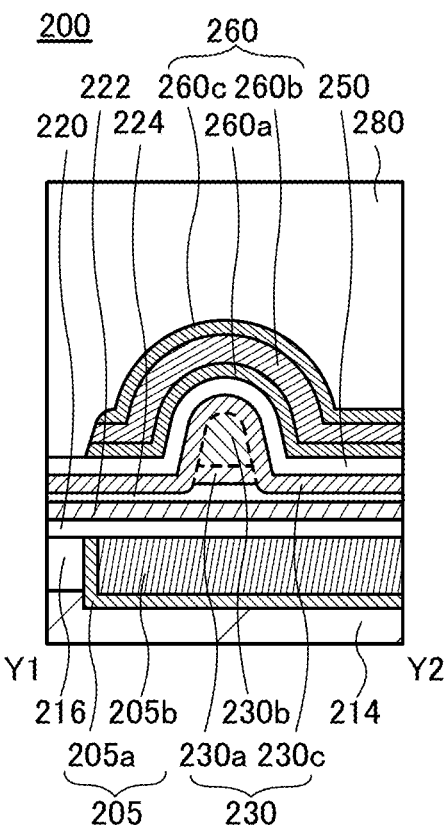

FIGS. 24A to 24C illustrate an example of a structure that can be used for the transistor 200. FIG. 24A illustrates a top surface of the transistor 200. For simplification of the figure, some films are omitted in FIG. 24A. FIG. 24B is a cross-sectional view taken along dashed-dotted line X1-X2 in FIG. 24A, and FIG. 24C is a cross-sectional view taken along dashed-dotted line Y1-Y2 in FIG. 24A.

Note that in the transistor 200 in FIGS. 24A to 24C, components having the same function as the components in the transistor 200 in FIGS. 23A to 23C are denoted by the same reference numerals.

In the structure shown in FIGS. 24A to 24C, the conductor 260 functioning as a gate electrode includes conductors 260a to 260c.

The conductor 260a is formed by a thermal CVD method, an MOCVD method, or an ALD (atomic layer deposition) method. In particular, the conductor 260a is preferably formed by an ALD method. By employing an ALD method or the like, plasma damage to the insulator 250 can be reduced. Furthermore, it is preferable to form the conductor 260a by an ALD method or the like, because coverage can be improved. Thus, the transistor 200 having high reliability can be provided.

The conductor 260b is formed using a material having high conductivity such as tantalum, tungsten, copper, or aluminum. The conductor 260c formed over the conductor 260b is preferably formed using a conductor that is hardly oxidized, such as tungsten nitride. In the case where the insulator 280 is formed using an oxide material from which oxygen is released, the conductor 260 can be prevented from being oxidized by the released oxygen.

Thus, the oxidation of the conductor 260 can be prevented, and oxygen released from the insulator 280 can be supplied to the oxide semiconductor 230 efficiently.

A conductor that is not easily oxidized is used for the conductor 260c having a large contact area with the insulator 280 including the excess-oxygen region, whereby excess oxygen in the insulator 280 can be prevented from being absorbed into the conductor 260. Furthermore, a conductor that has high conductivity is used for the conductor 260b, whereby the transistor 200 with low power consumption can be provided.

<Transistor Structure 3>

Figure 25A:
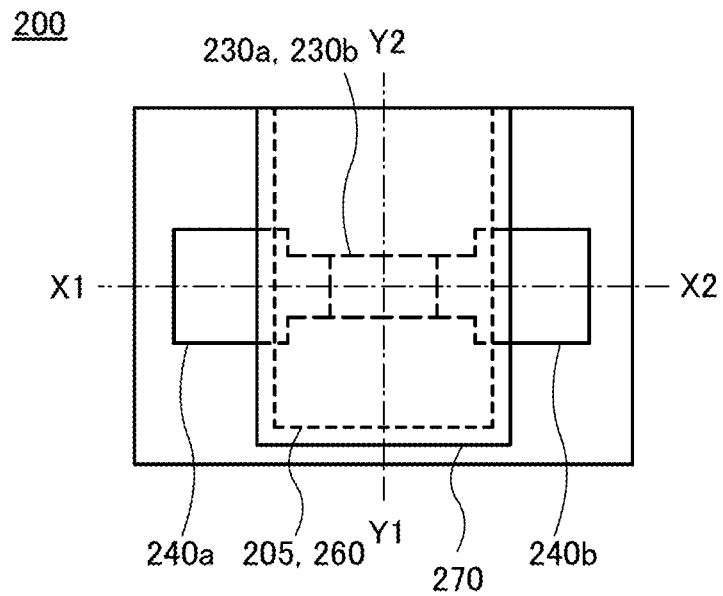
FIGS. 25A to 25C are a top view and cross-sectional views illustrating a structure example of a transistor.
Figure 25B:
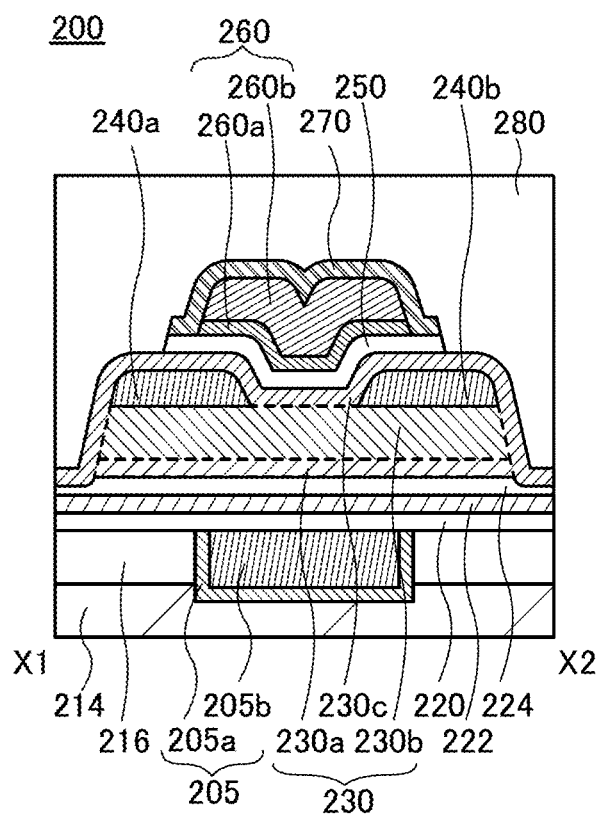
Figure 25C:
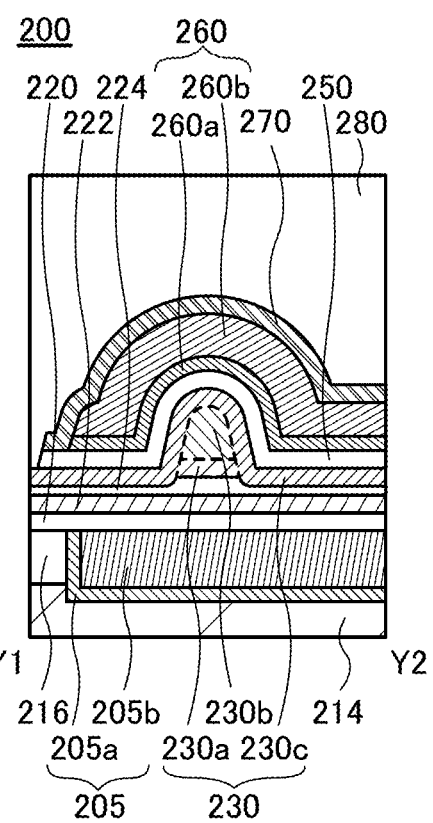

FIGS. 25A to 25C illustrate an example of a structure that can be used for the transistor 200. FIG. 25A illustrates a top surface of the transistor 200. For simplification of the figure, some films are omitted in FIG. 25A. FIG. 25B is a cross-sectional view taken along dashed-dotted line X1-X2 in FIG. 25A, and FIG. 25C is a cross-sectional view taken along dashed-dotted line Y1-Y2 in FIG. 25A.

Note that in the transistor 200 in FIGS. 25A to 25C, components having the same function as the components in the transistor 200 in FIGS. 23A to 23C are denoted by the same reference numerals.

In the structure shown in FIGS. 25A to 25C, the conductor 260 functioning as a gate electrode has a stacked structure of the conductors 260a and 260b. Furthermore, an insulator 270 is formed over the conductor 260 functioning as the gate electrode.

The conductor 260a is formed by a thermal CVD method, an MOCVD method, or an ALD method. In particular, the conductor 260a is preferably formed by an ALD method. By employing an ALD method or the like, plasma damage to the insulator 250 can be reduced. Furthermore, it is preferable to form the conductor 260a by an ALD method or the like, because coverage can be improved. Thus, the transistor 200 having high reliability can be provided.

The conductor 260b is formed using a material having high conductivity such as tantalum, tungsten, copper, or aluminum.

The insulator 270 is provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

<Transistor Structure 4>

Figure 26A:
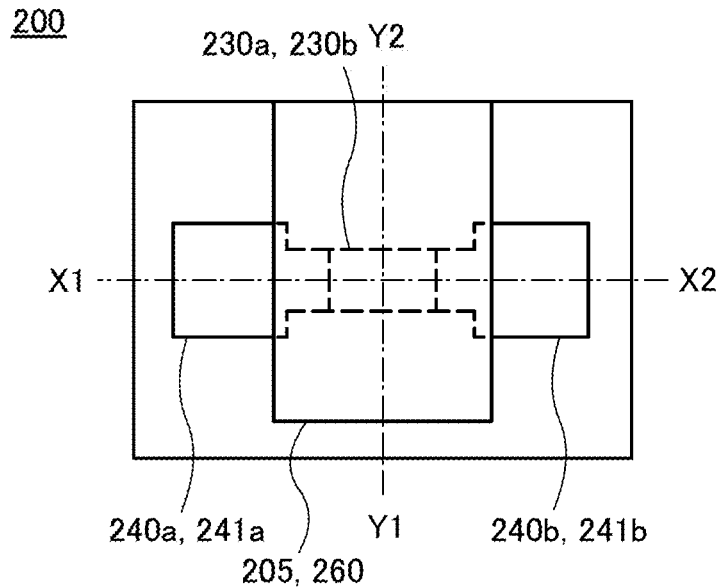
FIGS. 26A to 26C are a top view and cross-sectional views illustrating a structure example of a transistor.
Figure 26B:
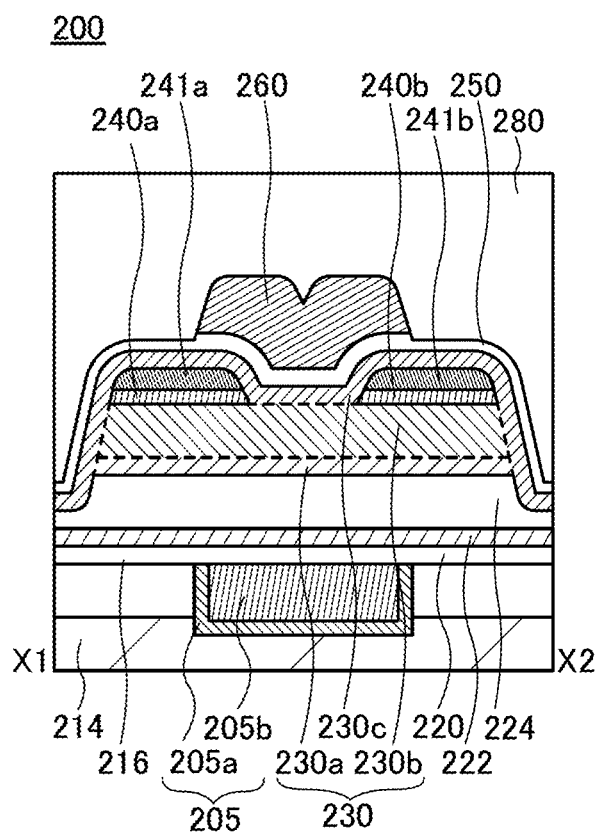
Figure 26C:
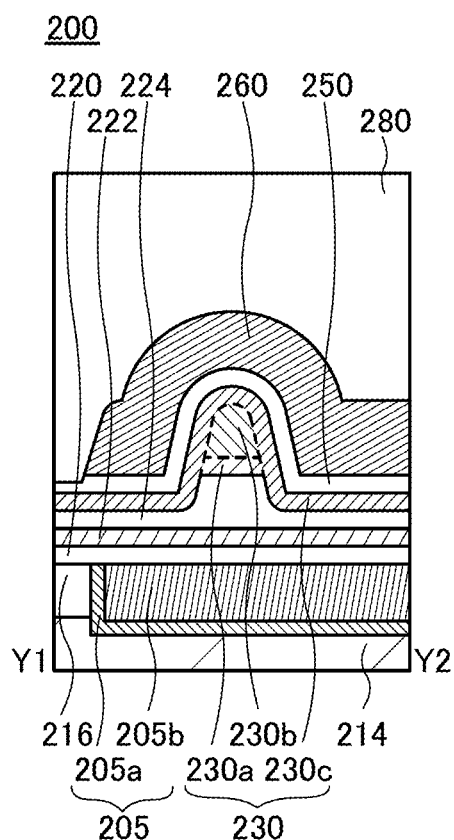

FIGS. 26A to 26C illustrate an example of a structure that can be used for the transistor 200. FIG. 26A illustrates a top surface of the transistor 200. For simplification of the figure, some films are omitted in FIG. 26A. FIG. 26B is a cross-sectional view taken along the dashed-dotted line X1-X2 in FIG. 26A, and FIG. 26C is a cross-sectional view taken along the dashed-dotted line Y1-Y2 in FIG. 26A.

Note that in the transistor 200 in FIGS. 26A to 26C, components having the same function as the components in the transistor 200 in FIGS. 23A to 23C are denoted by the same reference numerals.

In the structure shown in FIGS. 26A to 26C, conductors serving as a source and a drain has a stacked structure. Conductors having high adhesion to the oxide semiconductor 230b are used as the conductors 240a and 240b, and conductors having high conductivity are preferably used as the conductors 241a and 241b. The conductors 240a and 240b are preferably formed by an ALD method. It is preferable to use an ALD method or the like, because coverage can be improved.

For example, in the case of using a metal oxide including indium for the oxide semiconductor 230b, titanium nitride or the like may be used for the conductors 240a and 240b. Furthermore, the conductors 241a and 241b are formed using a material having high conductivity such as tantalum, tungsten, copper, or aluminum, so that the transistor 200 with high reliability and low power consumption can be provided.

As shown in FIG. 26C, in the channel width direction of the transistor 200, the oxide semiconductor 230b is covered with the conductor 260. By adjusting the shape of the projection of the insulator 224, the side surfaces of the oxide semiconductor 230b can be covered with the conductor 260. For example, a bottom surface of the conductor 260 is preferably positioned closer to the substrate than a bottom surface of the oxide semiconductor 230b at the side surface of the oxide semiconductor 230b. That is, the transistor 200 has a structure in which the oxide semiconductor 230b can be electrically surrounded by an electric field of the conductors 205 and 260. Such a structure in which the oxide semiconductor 230b is electrically surrounded by an electric field of the conductors is referred to as a surrounded channel (s-channel) structure. In the s-channel structure of the transistor 200, a channel can be formed in the whole (bulk) of the oxide semiconductor 230b. In the s-channel structure, the drain current of the transistor is increased, so that a larger amount of on-state current (current which flows between the source and the drain when the transistor is on) can be obtained. Furthermore, the entire channel formation region of the oxide semiconductor 230b can be depleted by the electric field of the conductors 205 and 260. Accordingly, the off-state current of the s-channel transistor can be further reduced. When the channel width is shortened, the effects of the s-channel structure, such as an increase in on-state current and a reduction in off-state current, can be enhanced.

<Transistor Structure 5>

Figure 27A:
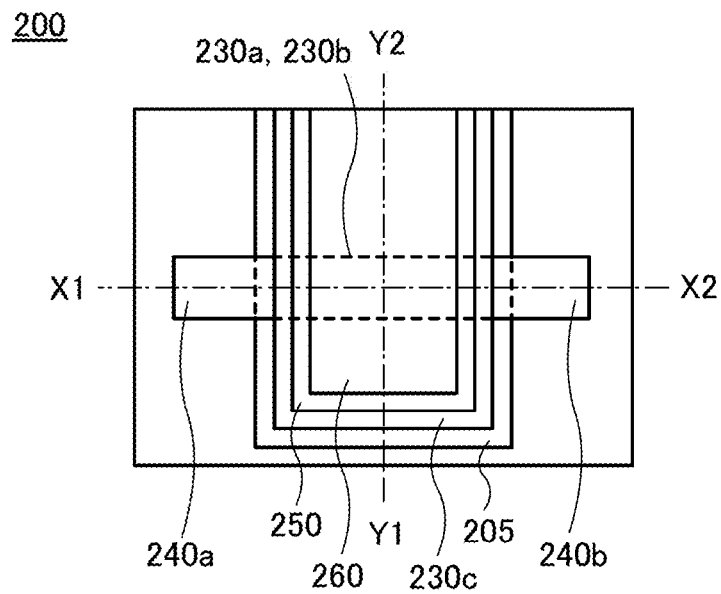
FIGS. 27A to 27C are a top view and cross-sectional views illustrating a structure example of a transistor.
Figure 27B:
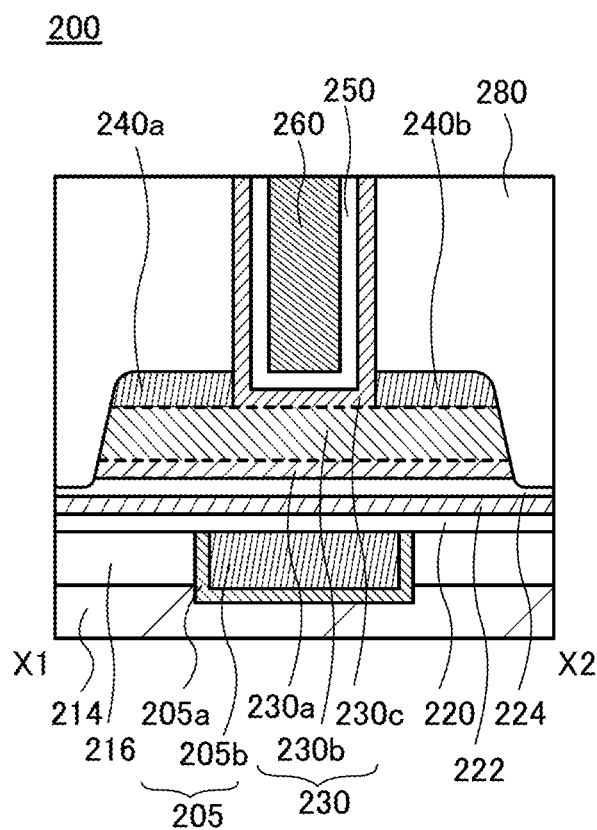
Figure 27C:
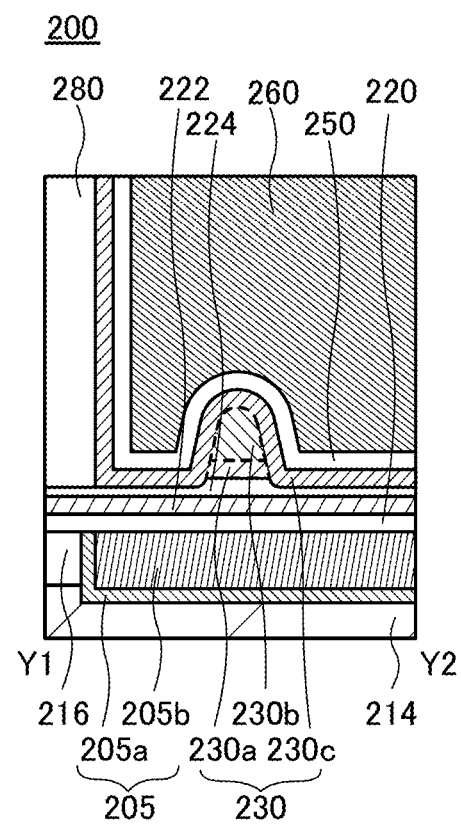

FIGS. 27A to 27C illustrate an example of a structure that can be used for the transistor 200. FIG. 27A illustrates a top surface of the transistor 200. For simplification of the figure, some films are omitted in FIG. 27A. FIG. 27B is a cross-sectional view taken along the dashed-dotted line X1-X2 in FIG. 27A, and FIG. 27C is a cross-sectional view taken along the dashed-dotted line Y1-Y2 in FIG. 27A.

Note that in the transistor 200 in FIGS. 27A to 27C, components having the same function as the components in the transistor 200 in FIGS. 23A to 23C are denoted by the same reference numerals.

The oxide semiconductor 230c, the insulator 250, and the conductor 260 are formed in an opening formed in the insulator 280.

Since the transistor 200 illustrated in FIGS. 27A to 27C has a structure in which the conductors 240a and 240b hardly overlap with the conductor 260, the parasitic capacitance added to the conductor 260 can be reduced. Thus, the transistor 200 with a high operation frequency can be provided.

<Transistor Structure 6>

Figure 28A:
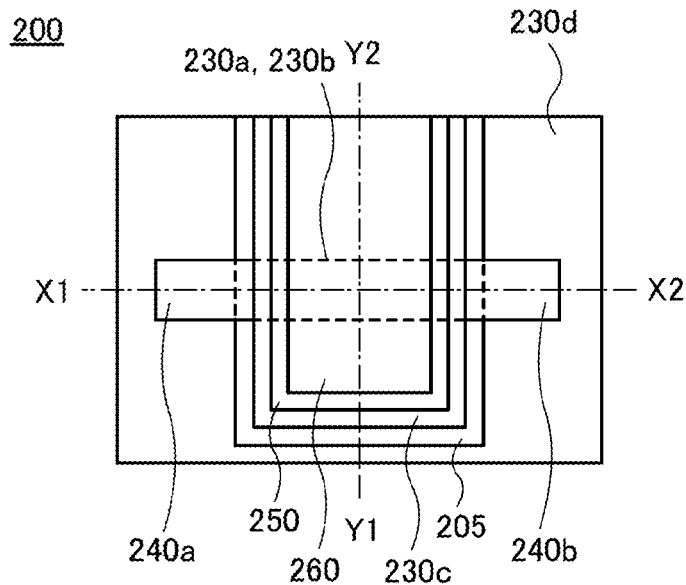
FIGS. 28A to 28C are a top view and cross-sectional views illustrating a structure example of a transistor.
Figure 28B:
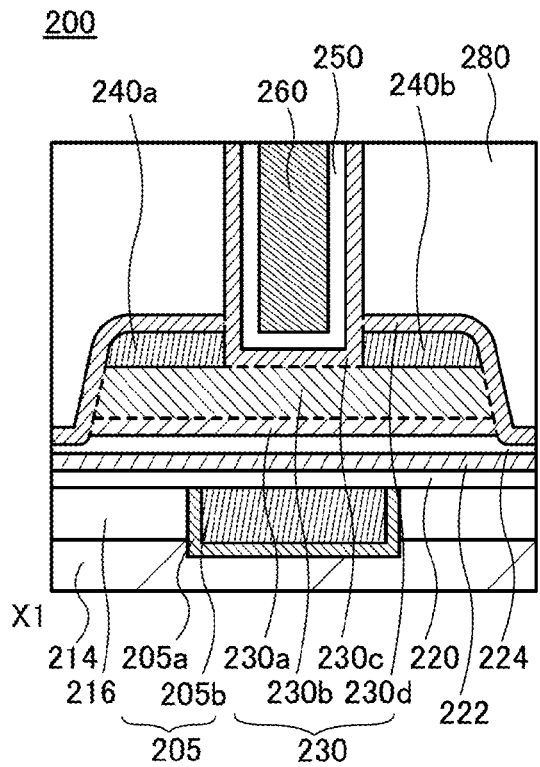
Figure 28C:
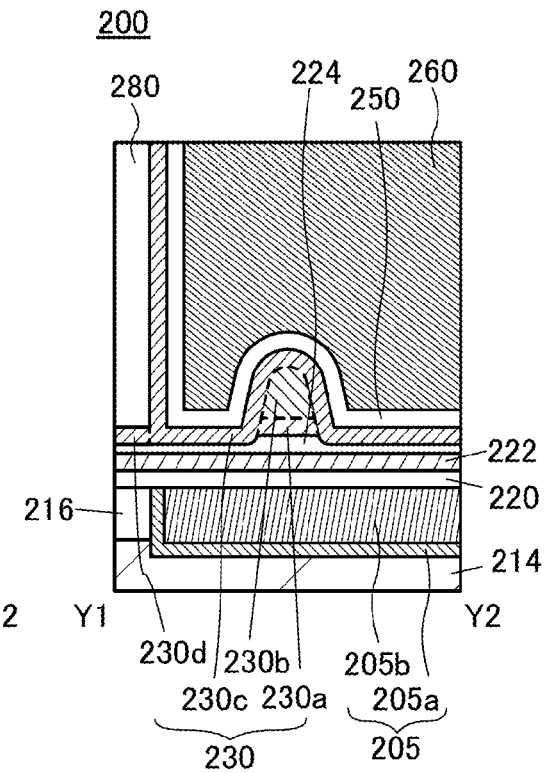

FIGS. 28A to 28C illustrate an example of a structure that can be used for the transistor 200. FIG. 28A illustrates a top surface of the transistor 200. For simplification of the figure, some films are omitted in FIG. 28A. FIG. 28B is a cross-sectional view taken along dashed-dotted line X1-X2 in FIG. 28A, and FIG. 28C is a cross-sectional view taken along dashed-dotted line Y1-Y2 in FIG. 28A.

Note that in the transistor 200 in FIGS. 28A to 28C, components having the same function as the components in the transistor 200 in FIGS. 23A to 23C are denoted by the same reference numerals.

In the transistor 200 illustrated in FIGS. 28A to 28C, the oxide semiconductor 230c, the insulator 250, and the conductor 260 are formed in an opening formed in the insulator 280.

Since the transistor 200 illustrated in FIGS. 28A to 28C has a structure in which the conductors 240a and 240b hardly overlap with the conductor 260, the parasitic capacitance added to the conductor 260 can be reduced. Thus, the transistor 200 with a high operation frequency can be provided.

The oxide semiconductor 230d is formed between the oxide semiconductor 230b and the insulator 280 including the excess-oxygen region. Therefore, generation of a shallow level in the vicinity of the channel formed in the oxide semiconductor 230b is inhibited more than in the case where the oxide semiconductor 230b is directly in contact with the insulator 280 as in FIGS. 27A to 27C; thus, a semiconductor device with high reliability can be provided.

Embodiment 4

In this embodiment, one embodiment of the semiconductor device shown in any of the above embodiments is described with reference to FIG. 29, FIG. 30, FIGS. 31A and 31B.

<Structure of Semiconductor Device>

Figure 29:
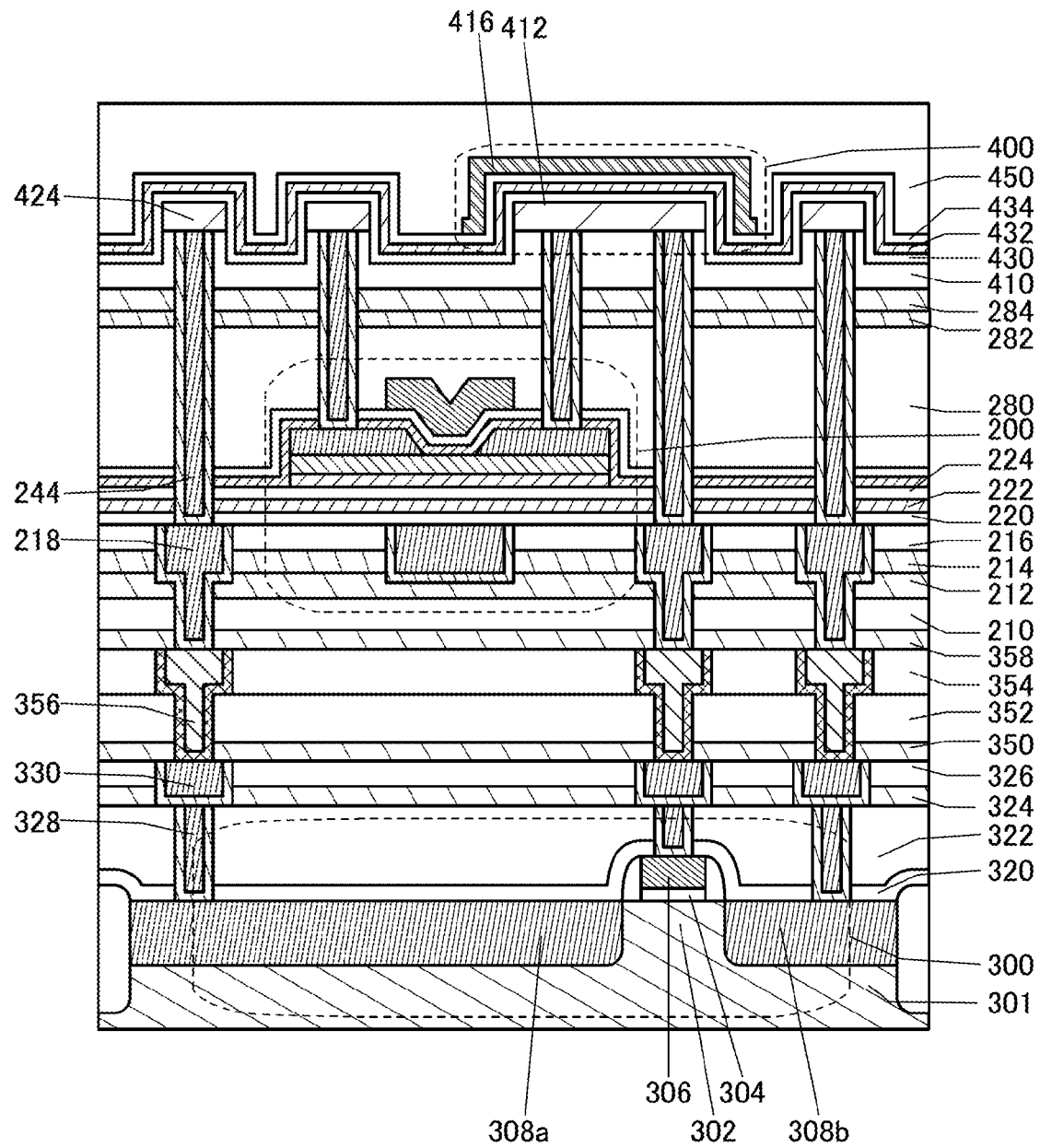
FIG. 29 is a cross-sectional view illustrating a structural example of a semiconductor device.

The semiconductor device of one embodiment of the present invention includes a transistor 300, the transistor 200, and a capacitor 400 as shown in FIG. 29. The transistor 200 is provided over the transistor 300, and the capacitor 400 is provided over the transistor 300 and the transistor 200.

The transistor 300 is provided on a substrate 301 and includes a conductor 306, an insulator 304, a semiconductor region 302 that is a part of the substrate 301, and low-resistance regions 308a and 308b functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308a and 308b functioning as a source region and a drain region, and the like contain silicon, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 308a and 308b contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 shown in FIG. 29 is just an example and is not limited to the structure shown therein; an appropriate transistor may be used in accordance with a circuit structure or a driving method.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor 200 is formed.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 400 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 328 and the conductor 330 preferably include a conductor having a barrier property with respect to hydrogen. The conductor having a barrier property with respect to hydrogen is formed particularly in an opening of the insulator 324 having a barrier property with respect to hydrogen. In such a structure, the transistor 300 and the transistor 200 can be separated by a layer having a barrier property, so that diffusion of hydrogen from the transistor 300 to the transistor 200 can be prevented.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 324 having a barrier property with respect to hydrogen.

A wiring layer may be provided over the insulator 326 and the conductor 330. For example, in FIG. 29, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

In addition, the conductor 356 is preferably formed using a low-resistance conductive material such as aluminum or copper. The use of a low-resistance conductive material can reduce wiring resistance. Note that in the case where copper is used for the conductor 356, a conductor which inhibits diffusion of copper and the conductor 356 are preferably stacked. Examples of the conductor which inhibits diffusion of copper include tantalum, an alloy containing tantalum such as tantalum nitride, ruthenium, and alloy containing ruthenium.

Furthermore, the insulator 350 is preferably formed using an insulator that inhibits diffusion of copper or an insulator barrier property with respect to oxygen and hydrogen. As an example of a film which inhibits diffusion of copper, silicon nitride can be used. Thus, the material similar to that used for the insulator 324 can be used.

In particular, it is preferable that the conductor which inhibits diffusion of copper be provided in an opening of the insulator 350 which inhibits diffusion of copper, and copper be stacked over the conductor which inhibits diffusion of copper. With such a structure, diffusion of copper in the vicinity of the wiring can be inhibited.

An insulator 358, an insulator 210, an insulator 212, and an insulator 214 are stacked sequentially over the insulator 354. A material which inhibits diffusion of copper or which has a barrier property with respect to oxygen or hydrogen is preferably used for one or all of the insulator 358, insulator 210, the insulator 212, and the insulator 214.

The insulator 358 and the insulator 212 are preferably formed using, for example, a film having a barrier property that inhibits copper or prevents hydrogen or impurities from diffusing from a region where the substrate 301 or the transistor 300 is formed or the like into a region where the transistor 200 is formed. Therefore, the insulator 358 and the insulator 212 can be formed using a material similar to that used for forming the insulator 324.

The insulator 210 can be formed using a material similar to that used for the insulator 320. For example, a silicon oxide film, a silicon oxynitride film, or the like can be used as the insulator 210.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

An insulator 216 is provided over the insulator 214. The insulator 216 can be formed using a material similar to that used for forming the insulator 320. For example, a silicon oxide film, a silicon oxynitride film, or the like can be used as the insulator 216.

A conductor 218 and the like are embedded in the insulator 358, the insulator 210, the insulator 212, the insulator 214, and the insulator 216. Note that the conductor 218 functions as a plug or a wiring that is electrically connected to the capacitor 400 or the transistor 300. The conductor 218 can be formed using a material similar to that used for forming the conductor 328 and the conductor 330.

In particular, the conductor 218 in a region in contact with the insulator 358, the insulator 212, and the insulator 214 is preferably a conductor that inhibits diffusion of copper or that has a barrier property with respect to oxygen, hydrogen, and water. In such a structure, the transistor 300 and the transistor 200 can be completely separated by a layer that inhibits diffusion of copper or that has a barrier property with respect to oxygen, hydrogen, and water. That is, diffusion of copper from the conductor 356 can be inhibited and diffusion of hydrogen from the transistor 300 into the transistor 200 can be prevented.

The transistor 200 and the insulator 280 are provided over the insulator 214. Note that the transistor 200 shown in FIG. 29 is just an example and is not limited to the structure shown therein; an appropriate transistor may be used in accordance with a circuit structure or a driving method.

An insulator 282, an insulator 284, and an insulator 410 are sequentially stacked over the insulator 280. A conductor 244 and the like are embedded in the insulator 220, the insulator 222, the insulator 224, the insulator 280, the insulator 282, the insulator 284, and the insulator 410. Note that the conductor 244 functions as a plug or a wiring that is electrically connected to the capacitor 400, the transistor 200, or the transistor 300. The conductor 244 can be formed using a material similar to that used for forming the conductor 328 and the conductor 330.

A material having a barrier property with respect to oxygen or hydrogen is preferably used for one or both of the insulator 282 and the insulator 284. Thus, the insulator 282 can be formed using a material similar to that used for forming the insulator 214. The insulator 284 can be formed using a material similar to that used for forming the insulator 212. The insulator 410 can be formed using an insulator similar to that of the insulator 210.

As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The insulator 284 is preferably formed using, for example, a film having a barrier property that prevents hydrogen or impurities from diffusing from a region where the capacitor 400 is formed into a region where the transistor 200 is formed. Therefore, the insulator 284 can be formed using a material similar to that used for forming the insulator 324.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282, the insulator 284, and the insulator 102. The insulator 212, the insulator 214, the insulator 282, and the insulator 284 have a barrier property that prevents diffusion of oxygen or impurities such as hydrogen and water.

Oxygen released from the insulator 280 and the transistor 200 can be prevented from diffusing into a layer where the capacitor 400 is formed or a layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to the oxide semiconductor in the transistor 200, so that oxygen vacancies can be reduced. Moreover, oxygen vacancies can be prevented from being formed by impurities in the oxide semiconductor in the transistor 200. Thus, the oxide semiconductor in the transistor 200 can be an oxide semiconductor with a low density of defect states and stable characteristics. That is, a change in electrical characteristics of the transistor 200 can be prevented and the reliability can be improved.

The capacitor 400 and a conductor 424 are provided over the insulator 410. The capacitor 400 is provided over the insulator 410 and includes a conductor 412, an insulator 430, an insulator 432, an insulator 434, and a conductor 416. Note that the conductor 424 functions as a plug or a wiring that is electrically connected to the capacitor 400, the transistor 200, or the transistor 300.

The conductor 412 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 412 is formed concurrently with another component such as a conductor, copper, aluminum, or the like which is a low-resistance metal material may be used.

Note that the conductor 424 can be formed using a material similar to that used for forming the conductor 412 functioning as an electrode of the capacitor.

The insulator 430, the insulator 432, and the insulator 434 are provided over the conductor 424 and the conductor 412. The insulator 430, the insulator 432, and the insulator 434 may be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like. Although a three-layer structure is shown in the figure, a single-layer structure or a stacked-layer structure of two layers, four layers, or more layers may be used.

For example, it is preferable that a high dielectric strength material such as silicon oxynitride be used for each of the insulator 430 and the insulator 434. Moreover, it is prefer-able that a high dielectric constant (high-k) material such as aluminum oxide is used for the insulator 432. In the capacitor 400 having the structure, a sufficient capacitance can be provided because of a high dielectric constant (high-k) insulator, and the dielectric strength can be increased and the electrostatic breakdown of the capacitor 400 can be prevented because of an insulator with high dielectric strength.

The conductor 416 is provided over the conductor 412 with the insulator 430, the insulator 432, and the insulator 434 provided therebetween. Note that the conductor 416 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 416 is formed concurrently with another component such as a conductor, copper, aluminum, or the like which is a low-resistance metal material may be used.

For example, as shown in FIG. 29, the insulator 430, the insulator 432, and the insulator 434 are provided to cover a top surface and side surfaces of the conductor 412. Furthermore, the conductor 416 is provided to cover the top surface and the side surfaces of the conductor 412 with the insulator 430, the insulator 432, and the insulator 434 provided therebetween.

That is, a capacitance is formed also on the side surfaces of the conductor 412, so that a capacitance per projected area of a capacitor can be increased. Thus, the semiconductor device can be reduced in area, highly integrated, and miniaturized.

An insulator 450 is provided over the conductor 416 and the insulator 434. The insulator 450 can be formed using a material similar to that used for forming the insulator 320. The insulator 450 covering the capacitor 400 may function as a planarization film that covers a roughness thereunder.

The above is the description of the structure example. With the use of the structure, a change in electrical characteristics can be prevented and reliability can be improved in a semiconductor device including an OS transistor. An OS transistor with high on-state current can be provided. A transistor including an OS transistor with low off-state current can be provided. A semiconductor device with low power consumption can be provided.

Modification Example 1

Figure 30:
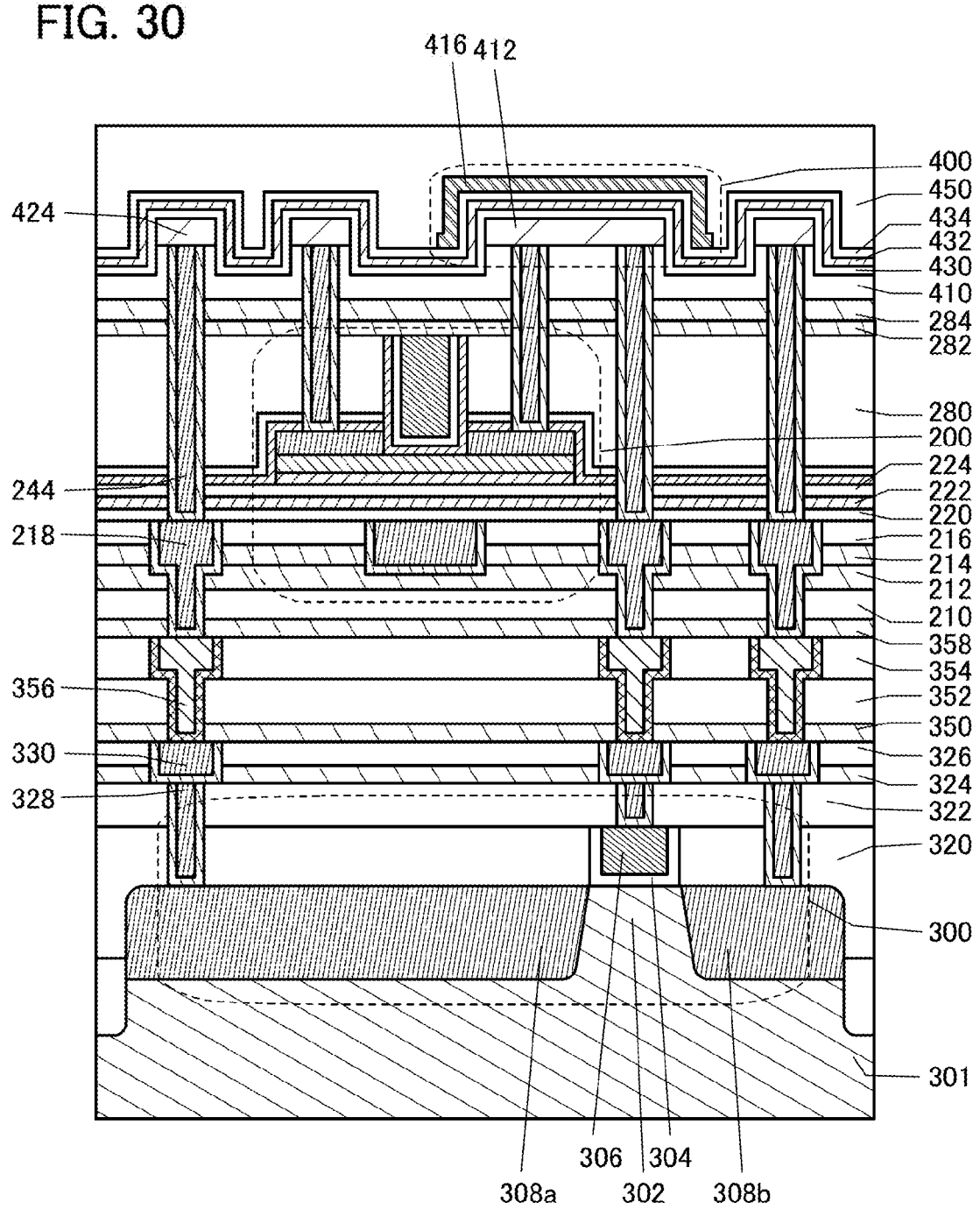
FIG. 30 is a cross-sectional view illustrating a structural example of a semiconductor device.

FIG. 30 shows a modification example of this embodiment. The structures of the transistor 300 and the transistor 200 in FIG. 30 are different from those in FIG. 29.

In the transistor 300 shown in FIG. 30, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

The structure of the transistor 200 in FIG. 30 is the same as that described in FIGS. 27A to 27C. The oxide semiconductor 230c, the insulator 250, and the conductor 260 illustrated in FIG. 27A to 27C are formed in an opening formed in the insulator 280. Since the transistor 200 illustrated in FIG. 30 has a structure in which the conductors 240a and 240b hardly overlap with the conductor 260, the parasitic capacitance added to the conductor 260 can be reduced. Thus, the transistor 200 with a high operation frequency can be provided.

Modification Example 2

Figure 31:
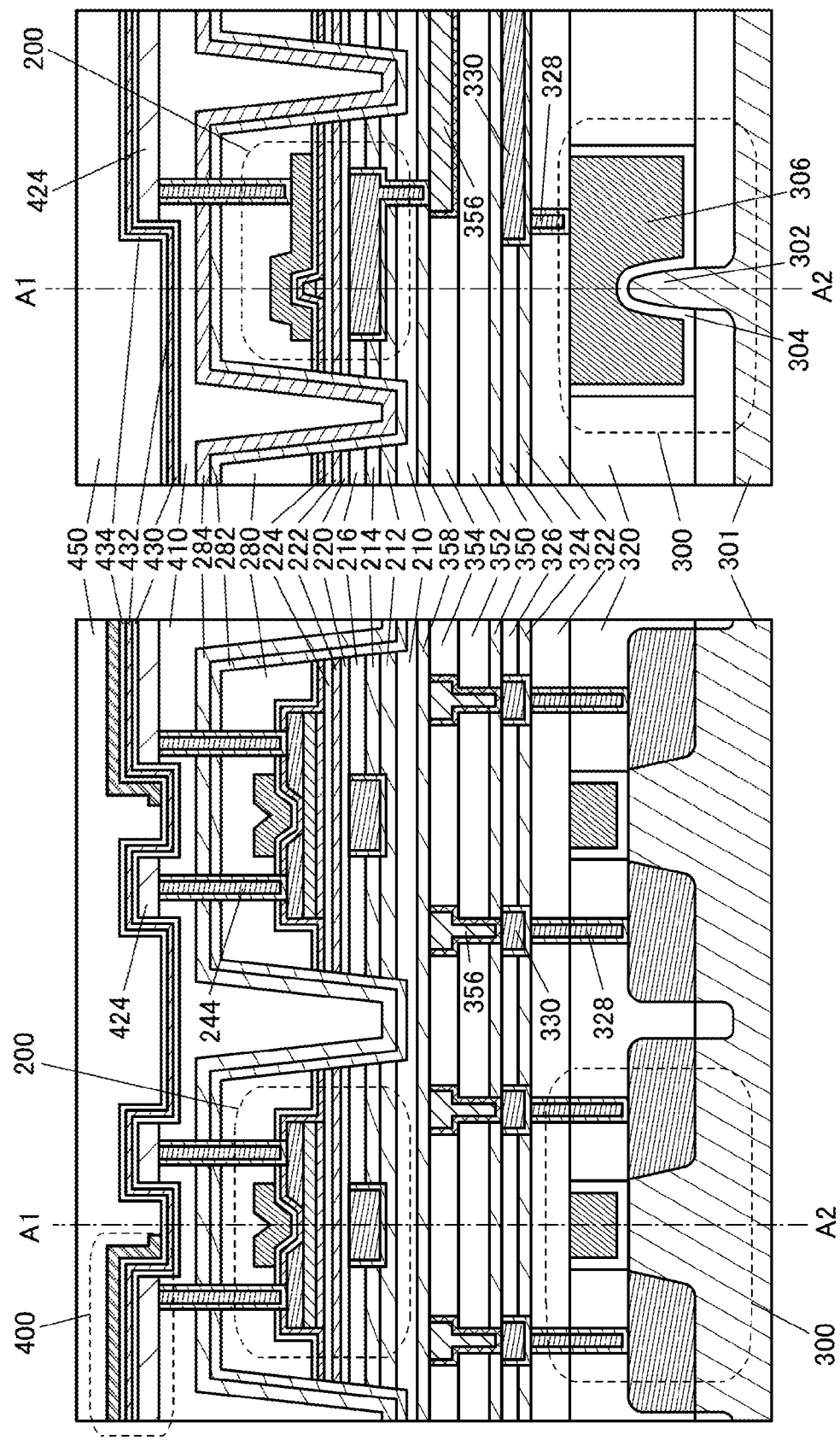
FIGS. 31A and 31B are cross-sectional views illustrating a structure example of a semiconductor device.

FIGS. 31A and 31B are cross-sectional views of a semiconductor device of one embodiment of the present invention. FIG. 31A is a cross-sectional view of the transistor 200 and the transistor 300 in the channel length direction and FIG. 31B is a cross-sectional view of the transistor 200 and the transistor 300 in the channel width direction.

In the semiconductor device in FIGS. 31A and 31B, a groove is provided in the insulator 280 so as to surround the transistor 200. With this groove, the transistor 200 is surrounded by the insulator 284 and the insulator 282. The transistor 200 is surrounded by the insulator including the insulator 212, the insulator 214, the insulator 282, and the insulator 284 in the up/down, forward/backward, and left/right directions. In such a manner, hydrogen and oxygen can be prevented from diffusing from every direction into the transistor 200. Consequently, the semiconductor device in FIGS. 31A and 31B can have high reliability.

Embodiment 5

In this embodiment, a structure of an oxide semiconductor of one embodiment of the present invention is described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.
<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.
<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R−3m is analyzed by an out-of-plane method, a peak appears at a diffraction angle (2θ) of around 31°. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd−3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed. In contrast, in the case where single crystal InGaZnO$_4$ is subjected to φ scan with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern including a spot derived from the (009) plane of the InGaZnO$_4$ crystal is obtained. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. It is found that the a-axes and b-axes of the pellets included in the CAAC-OS do not have regular orientation.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

From the high-resolution TEM image, pellets in which metal atoms are arranged in a layered manner can be observed. The size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

The pellet having a hexagonal shape is observed. Note that the shape of the pellet is not always a regular hexagon but is a non-regular hexagon in many cases.

A clear crystal grain boundary cannot be observed in the CAAC-OS. In the CAAC-OS, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) is observed. When an electron beam with a probe diameter of 1 nm is incident on the same sample, a plurality of spots are observed in the ring-shaped region. In other words, ordering in an nc-OS is not observed with an electron beam with a probe diameter of 50 nm but is observed with an electron beam with a probe diameter of 1 nm.

Furthermore, an electron diffraction pattern in which spots are arranged in an approximately regular hexagonal shape is observed in some cases when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

The a-like OS contains a void and thus has an unstable structure.

Growth of the crystal part in the a-like OS might be induced by electron irradiation, for example. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Embodiment 6

Described in this embodiment is a CPU in which the semiconductor device or the memory device described in the above embodiments can be used.

Figure 32:
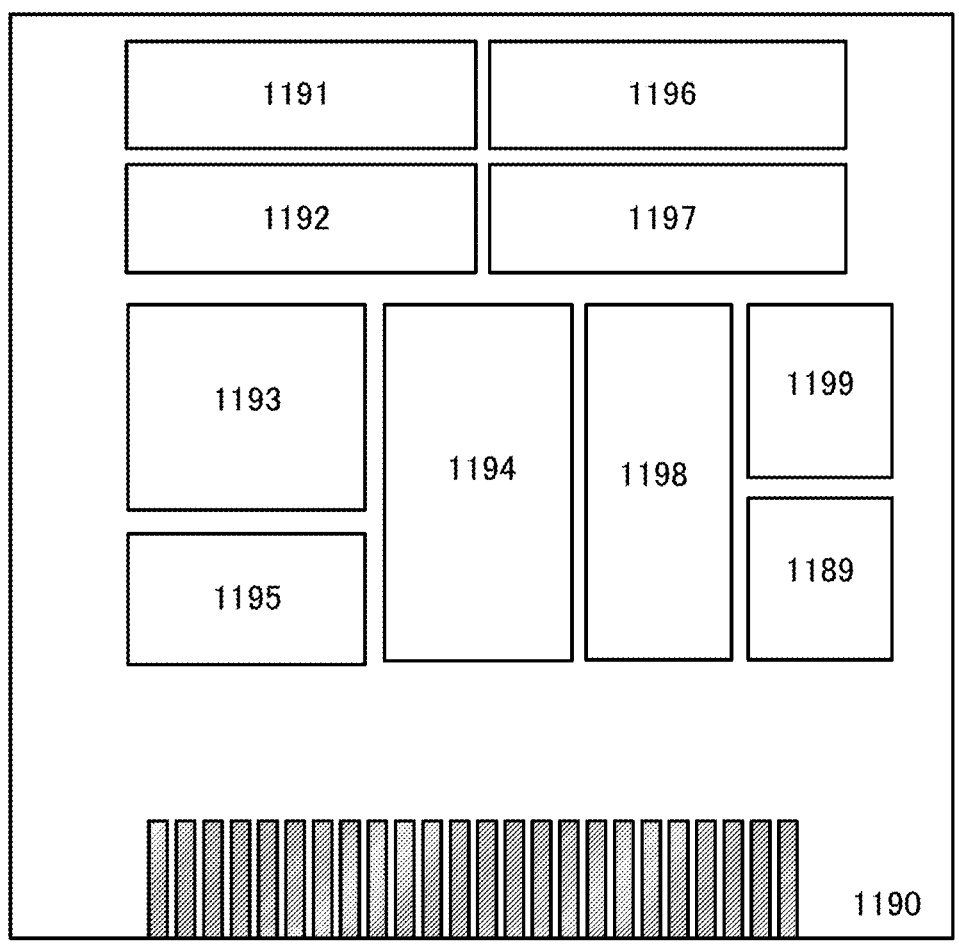
FIG. 32 is a block diagram showing a structure example of a CPU.

FIG. 32 is a block diagram illustrating a structure example of a CPU. The CPU illustrated in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example in which the structure is simplified, and an actual CPU may have a variety of structures depending on the application. For example, the CPU may have the following structure: a structure including the CPU illustrated in FIG. 32 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 32, a memory cell is provided in the register 1196. For the memory cell of the register 1196, any of the semiconductor devices or the memory devices described in the above embodiments can be used.

In the CPU illustrated in FIG. 32, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped. As a result, the power consumption of the CPU can be reduced.

Embodiment 7

In this embodiment, a programmable logic device (PLD) that can be formed using any of the semiconductor devices and the memory devices described in the above embodiments will be described.

A PLD has a structure in which adequate-scale logic circuits (logic blocks, or programmable logic elements) are electrically connected to each other by a routing resource, and the functions of the logic blocks and the connection between the logic blocks can be changed after manufacture. The functions of the logic blocks and the connection between the logic blocks formed using a routing resource are determined by structure data, and the structure data is stored in a register included in each logic block or a register included in the routing resource. A register for storing structure data is hereinafter referred to as a structure memory.

Figure 33A:
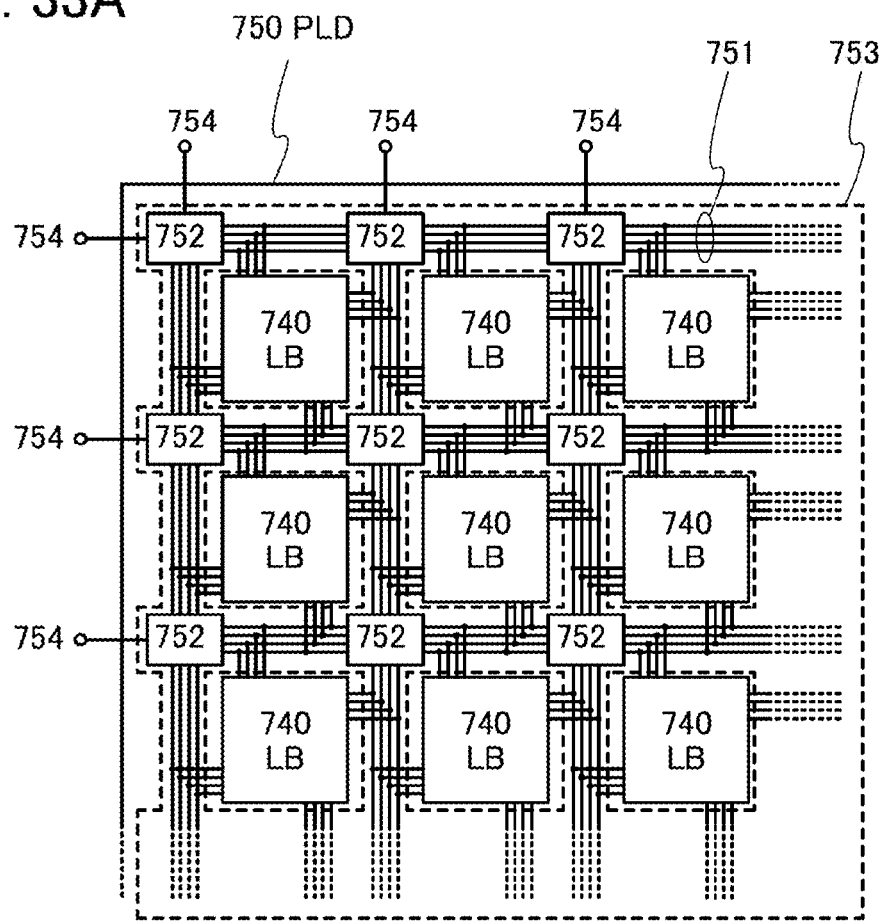
FIGS. 33A and 33B are a block diagram and a circuit diagram illustrating a structure example of a PLD.

FIG. 33A schematically illustrates part of the structure of a PLD 750. The PLD 750 in FIG. 33A includes a plurality of logic blocks (LB) 740, a wiring group 751 connected to any of the plurality of logic blocks 740, switch circuits 752 for controlling the connection between the wirings of the wiring group 751, and terminals 754. The wiring group 751 and the switch circuits 752 constitute a routing resource 753.

Figure 33B:
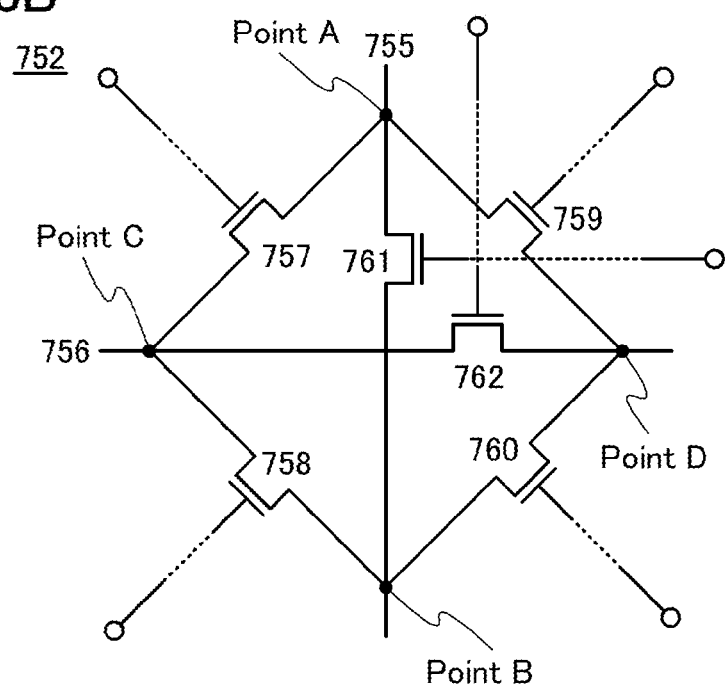

FIG. 33B illustrates a structure example of the switch circuit 752. The switch circuit 752 in FIG. 33B has a function of controlling connection between a wiring 755 and a wiring 756 included in the wiring group 751. Specifically, the switch circuit 752 includes transistors 757 to 762.

The transistor 757 has a function of controlling electrical connection between a point A of the wiring 755 and a point C of the wiring 756. The transistor 758 has a function of controlling electrical connection between a point B of the wiring 755 and the point C of the wiring 756. The transistor 759 has a function of controlling electrical connection between the point A of the wiring 755 and a point D of the wiring 756. The transistor 760 has a function of controlling electrical connection between the point B of the wiring 755 and the point D of the wiring 756. The transistor 761 has a function of controlling electrical connection between the point A and the point B of the wiring 755. The transistor 762 has a function of controlling electrical connection between the point C and the point D of the wiring 756.

The switch circuits 752 also have a function of controlling electrical connection between the wiring group 751 and the terminals 754 of the PLD 750.

Figure 34A:
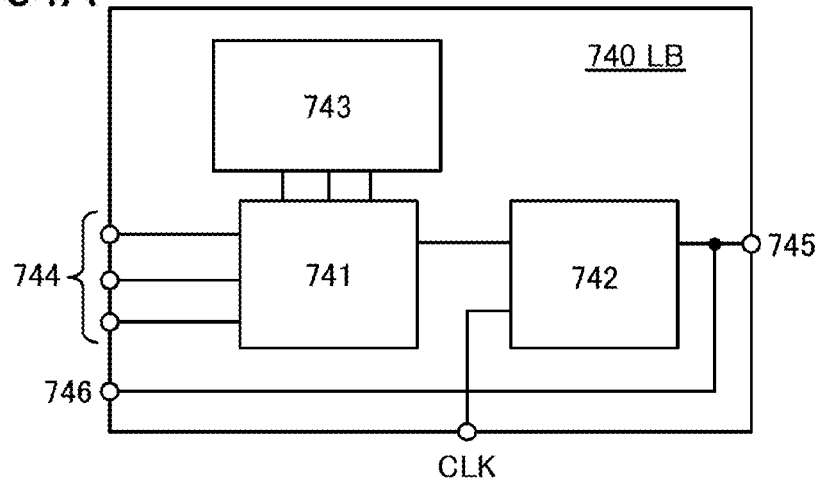
FIGS. 34A to 34C are block diagrams each illustrating a structure example of a logic block.

FIG. 34A illustrates one mode of the logic block 740. The logic block 740 illustrated in FIG. 34A includes a look-up table (LUT) 741, a flip-flop 742, and a memory circuit 743. Logical operation of the LUT 741 is determined in accordance with structure data in the memory circuit 743. Specifically, one output value of the LUT 741 with respect to input values of a plurality of input signals supplied to input terminals 744 is determined. Then, the LUT 741 outputs a signal including the output value. The flip-flop 742 holds the signal output from the LUT 741 and outputs an output signal corresponding to the signal from a first output terminal 745 and a second output terminal 746 in synchronization with a signal CLK.

Note that the logic block 740 may further include a multiplexer circuit. The multiplexer circuit can select whether the output signal from the LUT 741 goes through the flip-flop 742.

The type of the flip-flop 742 may be determined by structure data. Specifically, the flip-flop 742 may have a function of any of a D flip-flop, a T flip-flop, a JK flip-flop, and an RS flip-flop, depending on the structure data.

Figure 34B:
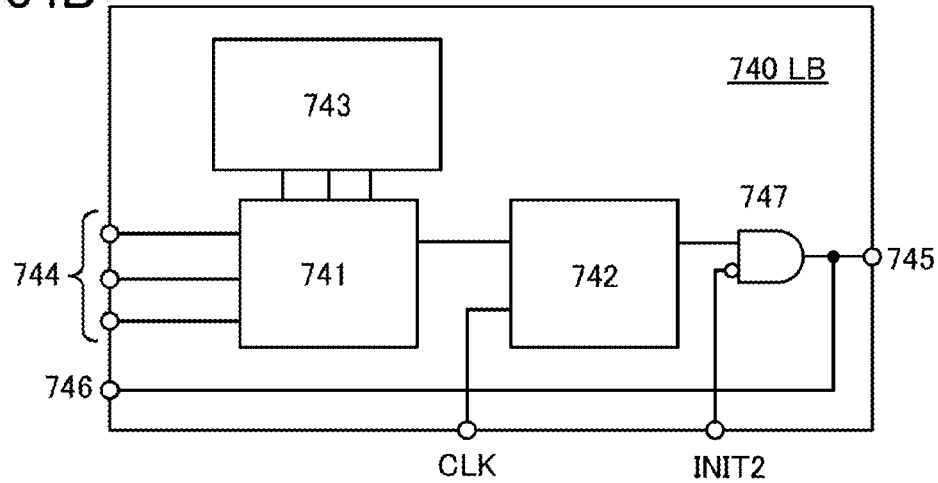

FIG. 34B illustrates another mode of the logic block 740. The logic block 740 in FIG. 34B has a structure in which an AND circuit 747 is added to the logic block 740 in FIG. 34A. To the AND circuit 747, a signal from the flip-flop 742 is supplied as a positive logic input, and a signal INIT2 is supplied as a negative logic input. With such a structure, the potential of a wiring to which a signal output from the logic block 740 is supplied can be initialized. Consequently, flow of a large amount of current between the logic blocks 740 can be prevented, so that breakage of the PLD can be prevented.

Figure 34C:
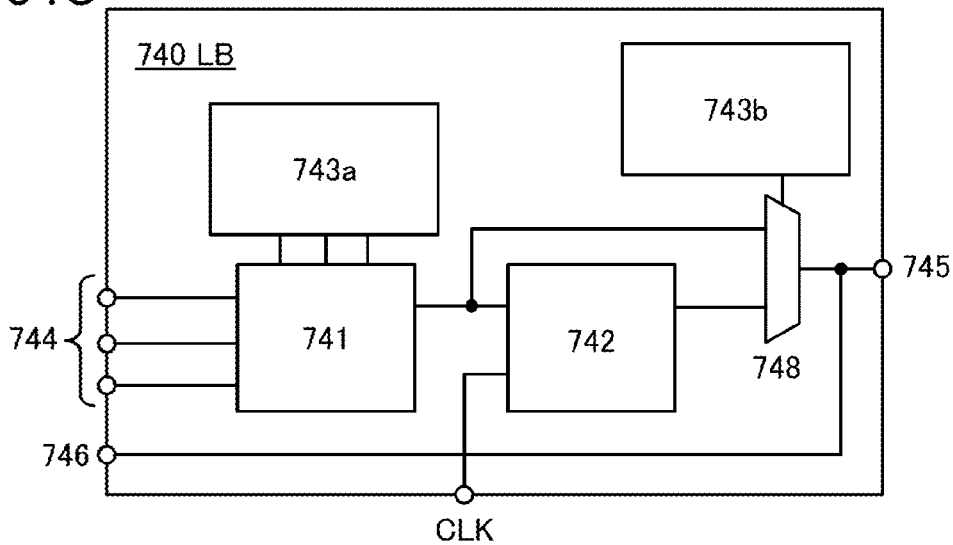

FIG. 34C illustrates another mode of the logic block 740. The logic block 740 in FIG. 34C has a structure in which a multiplexer 748 is added to the logic block 740 in FIG. 34A. The logic block 740 in FIG. 34C includes two memory circuits 743 (memory circuits 743a and 743b). Logical operation of the LUT 741 is determined in accordance with structure data in the memory circuit 743a. A signal output from the LUT 741 and a signal output from the flip-flop 742 are input to the multiplexer 748. The multiplexer 748 has functions of selecting and outputting one of the two output signals in accordance with structure data stored in the memory circuit 743b. The signal output from the multiplexer 748 is output from the first output terminal 745 and the second output terminal 746.

Figure 35:
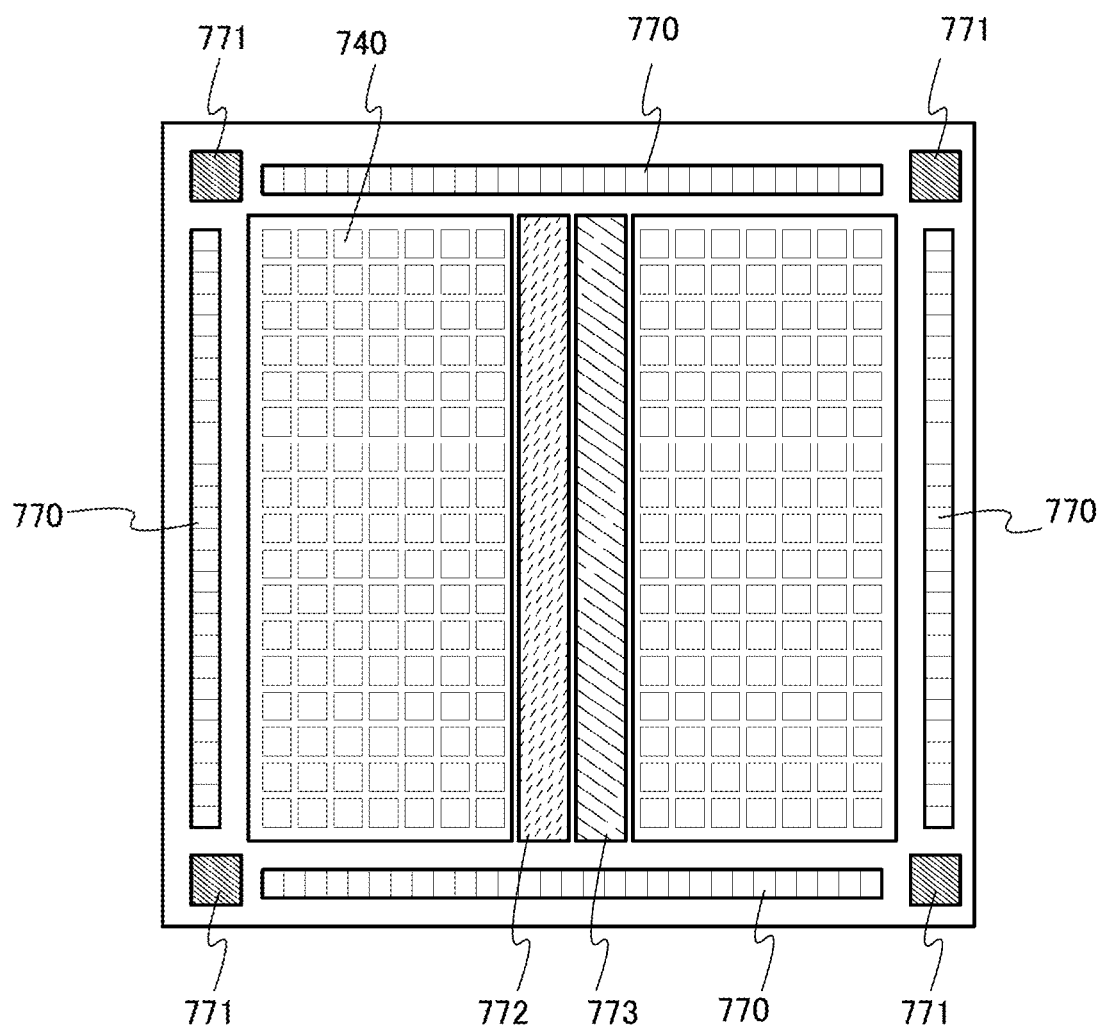
FIG. 35 is a block diagram illustrating a structure example of a PLD.

FIG. 35 illustrates an example of the entire structure of the PLD 750. In FIG. 35, I/O elements 770, phase lock loops (PLL) 771, a RAM 772, and a multiplier 773 are provided in the PLD 750. The I/O elements 770 function as interfaces that control input and output of signals from and to an external circuit of the PLD 750. The PLL 771 has a function of generating a signal CLK. The RAM 772 has a function of storing data used for logic operation. The multiplier 773 is a logic circuit dedicated to multiplication. When the PLD 750 has a function of executing multiplication, the multiplier 773 is not necessarily provided.

The memory circuits or the flip-flop in the logic block 740 can be formed using any of the semiconductor devices and the memory devices described in the above embodiments. With the use of any of the semiconductor devices and the memory devices described in the above embodiments, data can be held even when the logic block 740 is powered off; thus, the power consumption can be reduced.

Embodiment 8

In this embodiment, application examples of the semiconductor device described in the foregoing embodiment to an electronic component and to an electronic device including the electronic component will be described with reference to FIGS. 39A and 39B.

Figure 39A:
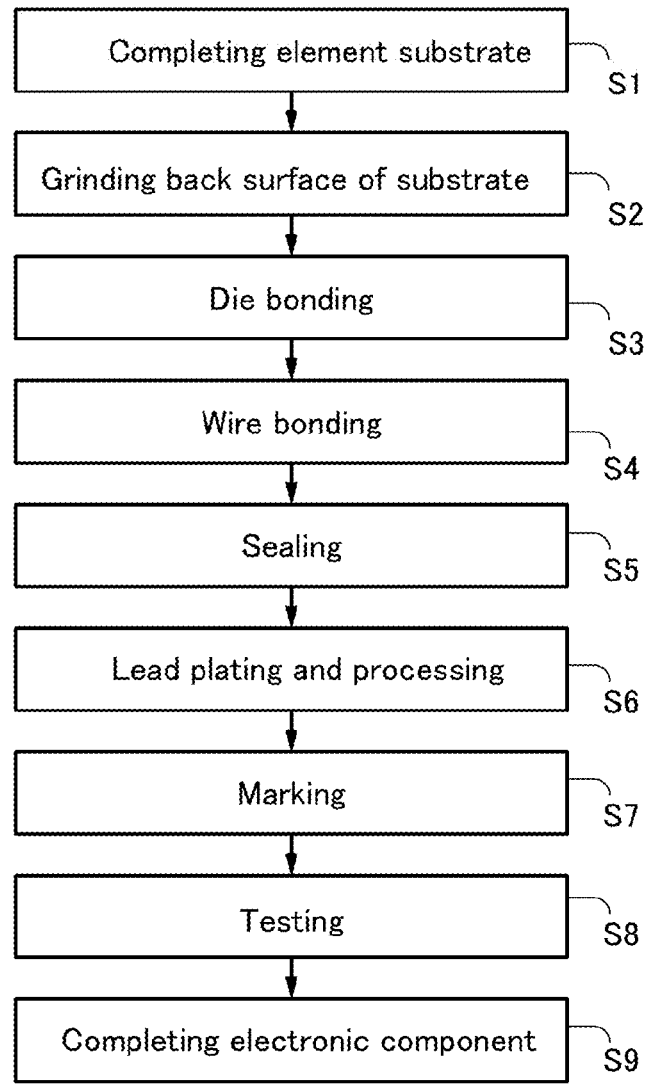
FIG. 39A is a flowchart showing manufacturing steps of a semiconductor device.

FIG. 39A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device such as that shown in the foregoing embodiment is completed by integrating detachable components on a printed circuit board through an assembly process (post-process).

The post-process can be completed through steps shown in FIG. 39A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

Next, a dicing step for separating the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiment, it is possible to achieve an electronic component including a memory cell from which multilevel data can be read without switching a signal for reading data in accordance with the number of levels of the multilevel data. The electronic component includes the semiconductor device provided with the memory cell from which multilevel data can be read without switching a signal for reading data in accordance with the number of levels of the multilevel data, and accordingly, the read operation is performed at high speed in the electronic component.

Figure 39B:
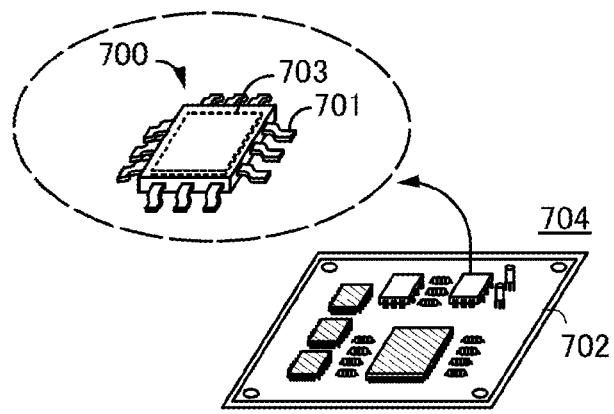
FIG. 39B is a perspective schematic view of the semiconductor device.

FIG. 39B is a schematic perspective diagram of a completed electronic component. FIG. 39B shows a schematic perspective diagram of a quad flat package (QFP) as an example of the electronic component. An electronic component 700 illustrated in FIG. 39B includes a lead 701 and a semiconductor device 703. The electronic component 700 in FIG. 39B is, for example, mounted on a printed circuit board 702. A plurality of electronic components 700 are used in combination and electrically connected to each other over the printed wiring board 702; thus, a board 704 on which the electronic components are mounted is completed. The completed board 704 is provided in an electronic device or the like.

Embodiment 9

The semiconductor device of one embodiment of the present invention can be used for vehicles such as an automobile, a motorcycle, and a bicycle, aircrafts, ships, and the like. The semiconductor device of one embodiment of the present invention can also be used for electronic devices such as a cellular phone, a wristwatch, a portable game machine, a portable data terminal, an e-book reader, a video camera, a digital still camera, and a goggle-type display (head-mounted display). Specific examples of them are illustrated in FIGS. 36A to 36F.

Figure 36A:
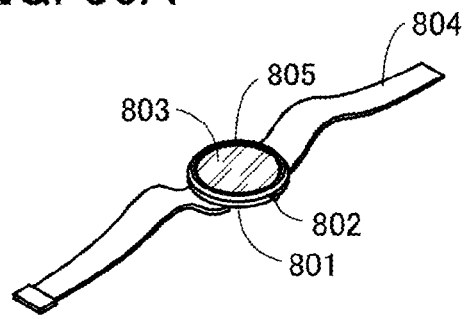
FIGS. 36A to 36F are perspective views each illustrating an example of an electronic device.

FIG. 36A illustrates a wristwatch-type terminal, which includes a housing 801, a winder 802, a display portion 803, a belt 804, a sensor portion 805, and the like. The display portion 803 may include a touch panel. A user can input data by using finger touching the touch panel as a pointer.

The sensor portion 805 is configured to acquire data by determining the surrounding state. For example, a camera, an acceleration sensor, a direction sensor, a pressure sensor, a temperature sensor, a humidity sensor, an illuminance sensor, or a global positioning system (GPS) signal receiving circuit can be used as the sensor portion 805.

For example, when an arithmetic device in the housing 801 determines that the ambient light level measured by an illuminance sensor of the sensor portion 805 is sufficiently higher than the predetermined illuminance, a reflective liquid crystal element is used as a display element of the display portion 803. In the case where the arithmetic device determines that the ambient light level is not sufficiently high, an organic EL element is used as a display element of the display portion 803. Thus, image data can be displayed in such a manner that, for example, a reflective display element is used in an environment with strong external light and a self-luminous display element is used in a dim environment. As a result, the power consumption of the electronic device can be reduced.

Figure 36B:
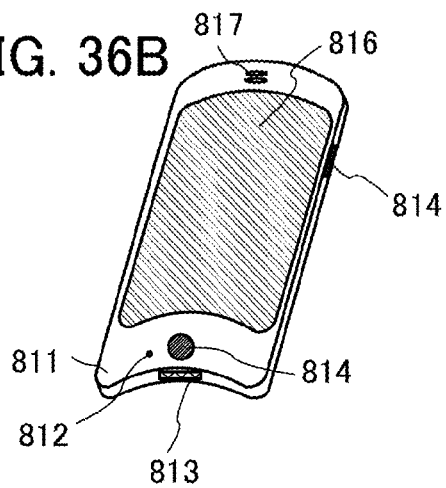

FIG. 36B illustrates a cellular phone, which includes a housing 811, a display portion 816, operation buttons 814, an external connection port 813, a speaker 817, a microphone 812, and the like. When the display portion 816 of the cellular phone illustrated in FIG. 36B is touched with a finger or the like, data can be input. Further, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 36C:
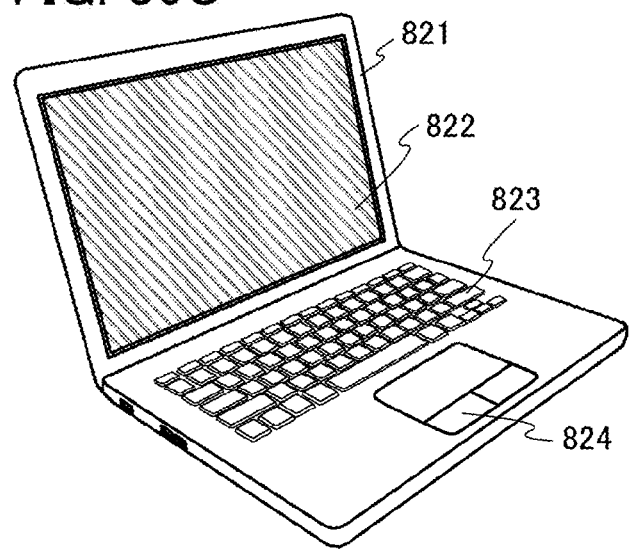

FIG. 36C illustrates a laptop personal computer, which includes a housing 821, a display portion 822, a keyboard 823, a pointing device 824, and the like.

Figure 36D:
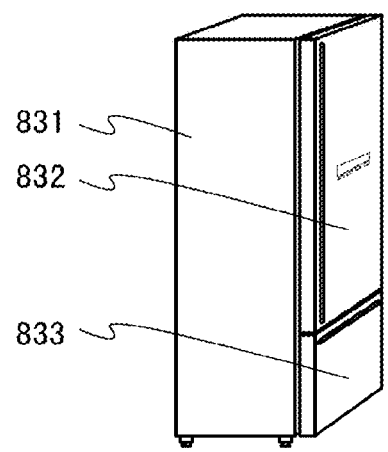

FIG. 36D illustrates an electric refrigerator-freezer, which includes a housing 831, a refrigerator door 832, a freezer door 833, and the like.

Figure 36E:
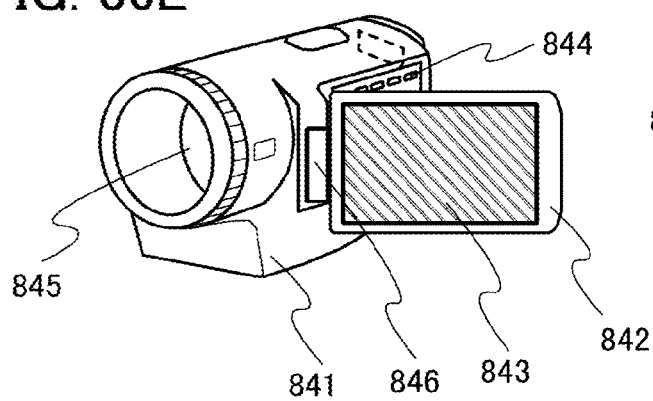

FIG. 36E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 36F:
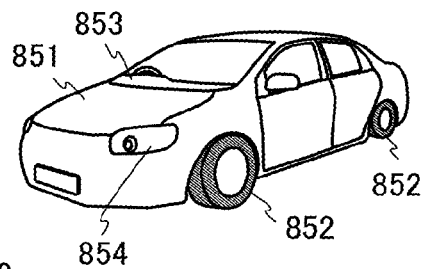
Figure 37A:
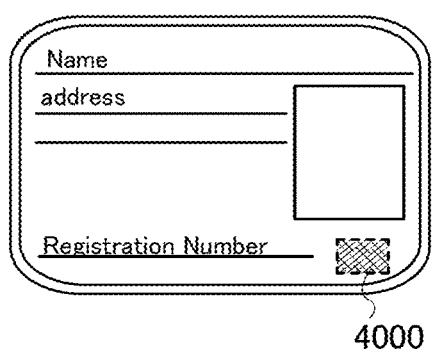
FIGS. 37A to 37F are perspective views each illustrating a usage example of an RFID tag.
Figure 37B:
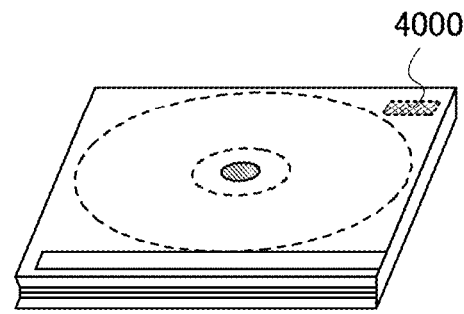
Figure 37C:
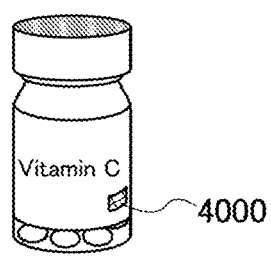
Figure 37D:
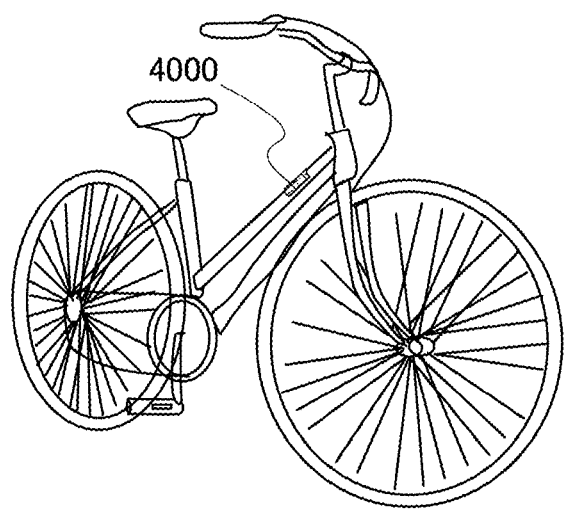
Figure 37E:
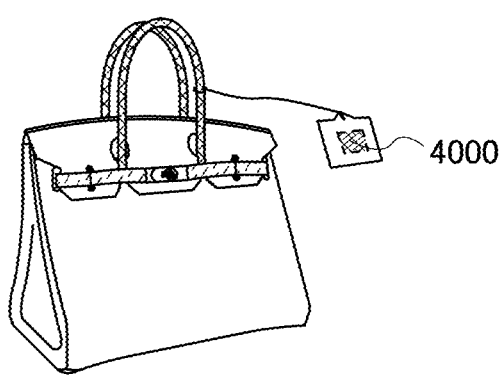
Figure 37F:
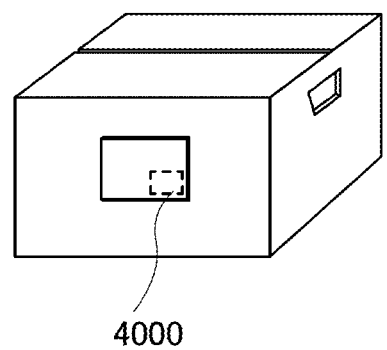

FIG. 36F illustrates a car, which includes a car body 851, wheels 852, a dashboard 853, lights 854, and the like.

Embodiment 10

In this embodiment, application examples of an RF tag that can be formed using the semiconductor device of one embodiment of the present invention will be described with reference to FIGS. 37A to 37F. The RF tag is widely used and can be provided for, for example, products such as bills, coins, securities, bearer bonds, documents (e.g., driver's licenses or resident's cards, see FIG. 37A), recording media (e.g., DVDs or video tapes, see FIG. 37B), packaging containers (e.g., wrapping paper or bottles, see FIG. 37C), vehicles (e.g., bicycles, see FIG. 37D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 37E and 37F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

In this specification and the like, ordinal numbers such as "first", "second", and "third" are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in this specification and the like, for example, a "first" component in one embodiment can be omitted in other embodiments or claims.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path. Examples of the switch are an electrical switch, a mechanical switch, and the like. That is, any element can be used as a switch as long as it can control a current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-256670 filed with Japan Patent Office on Dec. 28, 2015, and Japanese Patent Application serial no. 2015-257567 filed with Japan Patent Office on Dec. 29, 2015, the entire contents of which are hereby incorporated by reference.

What is claimed is:
1. A semiconductor device comprising:
a first transistor;
a second transistor;
a third transistor;
a capacitor; and
a circuit,
wherein the third transistor includes a first gate and a second gate,
wherein a gate of the first transistor is electrically connected to a first terminal of the capacitor,
wherein a first terminal of the first transistor is electrically connected to the second gate,
wherein a second terminal of the first transistor is electrically connected to the circuit,
wherein a gate of the second transistor is electrically connected to a first terminal of the second transistor,
wherein the first terminal of the second transistor is electrically connected to the second gate,
wherein a second terminal of the second transistor is electrically connected to the first terminal of the capacitor,
wherein the circuit is configured to generate a negative potential, and
wherein a channel formation region of the first transistor includes an oxide semiconductor.
2. The semiconductor device according to claim 1, wherein a channel length of the first transistor is longer than a channel length of the third transistor.
3. A memory device comprising the semiconductor device according to claim 1.
4. An IC chip comprising:
a CPU;
the memory device according to claim 3; and
a power supply circuit,
wherein the power supply circuit is configured to supply power to the CPU and the memory device.
5. An electronic device comprising;
the semiconductor device according to claim 1, and
a display device, a microphone, a speaker, an operation key, or a housing.

6. A semiconductor device comprising:
a first transistor;
a second transistor;
a third transistor;
a capacitor; and
a circuit,
wherein the first transistor includes a first gate and a second gate,
wherein the second transistor includes a third gate and a fourth gate,
wherein the third transistor includes a fifth gate and a sixth gate,
wherein the first gate is electrically connected to a first terminal of the capacitor,
wherein the second gate is electrically connected to the first gate,
wherein a first terminal of the first transistor is electrically connected to the sixth gate,
wherein a second terminal of the first transistor is electrically connected to the circuit,
wherein the third gate is electrically connected to a first terminal of the second transistor,
wherein the fourth gate is electrically connected to the first terminal of the second transistor,
wherein the first terminal of the second transistor is electrically connected to the sixth gate,
wherein a second terminal of the second transistor is electrically connected to the first terminal of the capacitor,
wherein the circuit is configured to generate a negative potential, and
wherein a channel formation region of the first transistor includes an oxide semiconductor.

7. The semiconductor device according to claim 6, wherein a channel length of the first transistor is longer than a channel length of the third transistor.

8. A memory device comprising the semiconductor device according to claim 6.

9. An IC chip comprising:
a CPU;
the memory device according to claim 8; and
a power supply circuit,
wherein the power supply circuit is configured to supply power to the CPU and the memory device.

10. An electronic device comprising;
the semiconductor device according to claim 6, and
a display device, a microphone, a speaker, an operation key, or a housing.

11. A semiconductor device comprising:
a first transistor;
a second transistor;
a third transistor;
a first capacitor;
a second capacitor;
a resistor; and
a circuit,
wherein the third transistor includes a first gate and a second gate,
wherein a gate of the first transistor is electrically connected to a first terminal of the first capacitor,
wherein a first terminal of the first transistor is electrically connected to the second gate,
wherein a second terminal of the first transistor is electrically connected to the circuit,
wherein a first terminal of the second capacitor is electrically connected to a gate of the second transistor,
wherein the gate of the second transistor is electrically connected to a first terminal of the second transistor through the resistor,
wherein the first terminal of the second transistor is electrically connected to the second gate,
wherein a second terminal of the second transistor is electrically connected to the first terminal of the first capacitor,
wherein the circuit is configured to generate a negative potential, and
wherein a channel formation region of the first transistor includes an oxide semiconductor.

12. The semiconductor device according to claim 11, wherein a channel length of the first transistor is longer than a channel length of the third transistor.

13. A memory device comprising the semiconductor device according to claim 11.

14. An IC chip comprising:
a CPU;
the memory device according to claim 13; and
a power supply circuit,
wherein the power supply circuit is configured to supply power to the CPU and the memory device.

15. An electronic device comprising;
the semiconductor device according to claim 11, and
a display device, a microphone, a speaker, an operation key, or a housing.

16. A semiconductor device comprising:
a first transistor;
a second transistor;
a third transistor;
a first capacitor;
a second capacitor;
a resistor; and
a circuit,
wherein the first transistor includes a first gate and a second gate,
wherein the second transistor includes a third gate and a fourth gate,
wherein the third transistor includes a fifth gate and a sixth gate,
wherein the first gate is electrically connected to a first terminal of the first capacitor,
wherein the second gate is electrically connected to the first gate,
wherein a first terminal of the first transistor is electrically connected to the sixth gate,
wherein a second terminal of the first transistor is electrically connected to the circuit,
wherein a first terminal of the second capacitor is electrically connected to the third gate,
wherein the third gate is electrically connected to a first terminal of the second transistor,
wherein the fourth gate is electrically connected to the first terminal of the second transistor,
wherein the first terminal of the second transistor is electrically connected to the sixth gate,
wherein a second terminal of the second transistor is electrically connected to the first terminal of the first capacitor,
wherein the circuit is configured to generate a negative potential, and
wherein a channel formation region of the first transistor includes an oxide semiconductor.

17. The semiconductor device according to claim 16, wherein a channel length of the first transistor is longer than a channel length of the third transistor.

18. A memory device comprising the semiconductor device according to claim 16.

19. An IC chip comprising:
a CPU;
the memory device according to claim 18; and
a power supply circuit,
wherein the power supply circuit is configured to supply power to the CPU and the memory device.

20. An electronic device comprising;
the semiconductor device according to claim 16, and
a display device, a microphone, a speaker, an operation key, or a housing.

* * * * *